(12) United States Patent
Rhodes et al.

(10) Patent No.: US 6,415,409 B1
(45) Date of Patent: Jul. 2, 2002

(54) SYSTEM FOR TESTING IC CHIPS SELECTIVELY WITH STORED OR INTERNALLY GENERATED BIT STREAMS

(75) Inventors: James Vernon Rhodes; Robert David Conklin; Timothy Allen Barr, all of Chandler, AZ (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/432,966

(22) Filed: Nov. 3, 1999

(51) Int. Cl.$^7$ .............................. G06F 11/00; G06F 7/38
(52) U.S. Cl. ....................................... 714/738; 712/227
(58) Field of Search ................................ 714/738, 739, 714/742, 744, 33, 798; 712/227, 225

(56) References Cited

U.S. PATENT DOCUMENTS

| | | | | |
|---|---|---|---|---|
| 4,905,183 A | * | 2/1990 | Kawaguchi et al. | 712/19 |
| 5,745,501 A | * | 4/1998 | Garner et al. | 714/741 |
| 6,092,225 A | * | 7/2000 | Groudis et al. | 714/724 |
| 6,223,318 B1 | * | 4/2001 | Yamashita et al. | 714/744 |

* cited by examiner

Primary Examiner—Christine T. Tu
(74) Attorney, Agent, or Firm—Charles J. Fassbender; Mark T. Starr; Lise A. Rode

(57) ABSTRACT

A system for testing IC chips selectively with stored or internally generated bit streams is comprised of a memory which stores instructions of a first class that expressly recite a first bit stream, and stores instructions of a second class that specify operations which generate a second bit stream. A first pattern generator is coupled to the memory, which sequentially reads the instructions of the first and second classes. The first pattern generator includes a time-shared control circuit which sends the first bit stream to a test port on the chips that are tested in response to the first class instructions that are read. In addition, a second pattern generator is coupled to the first pattern generator. This second pattern generator receives the second class instructions that are read; and in response, it sequentially generates portions of the second bit stream by performing the operations which the second class instructions specify. One portion of the second bit stream is sent to the test port on the chips that are tested, while the second pattern generator generates another portion of the second bit stream.

10 Claims, 29 Drawing Sheets

FIG. 3
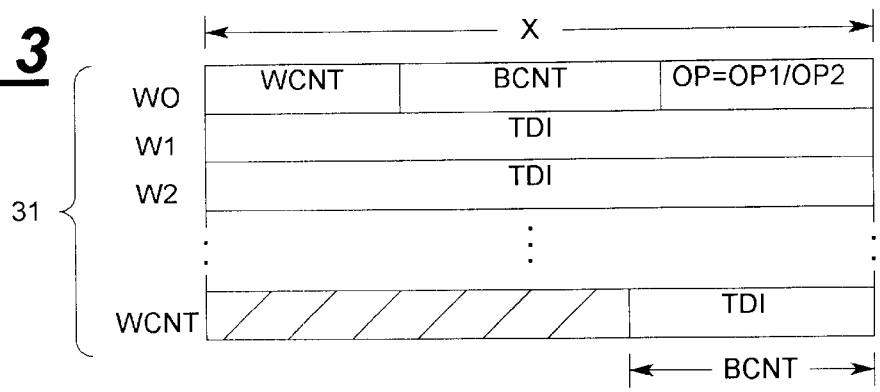
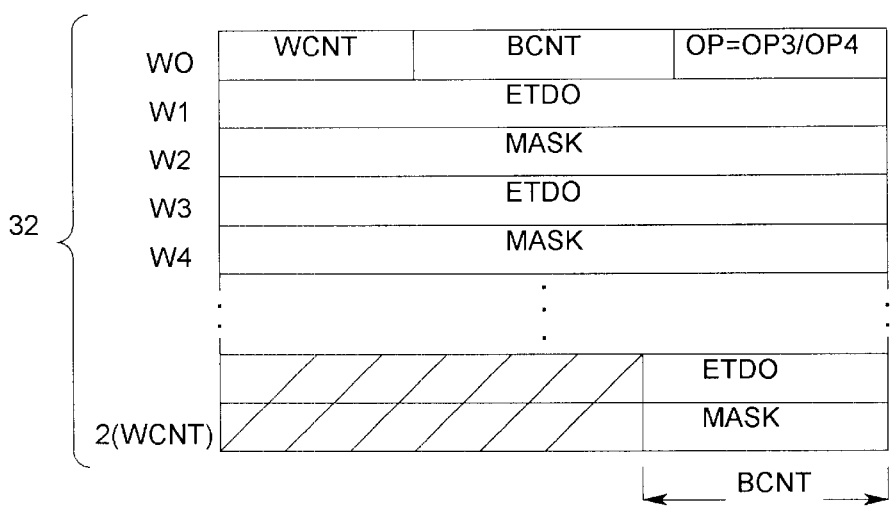
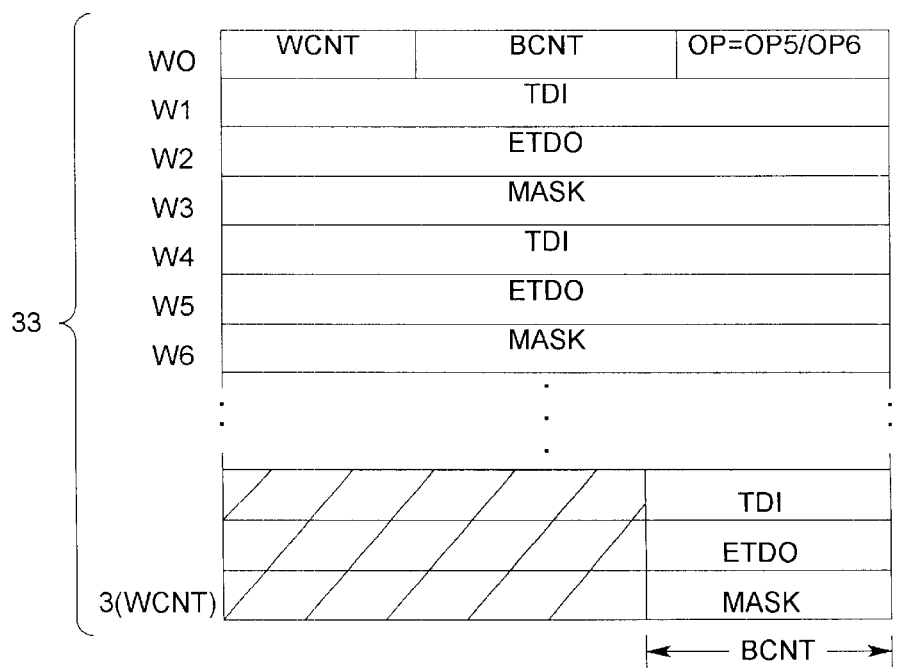

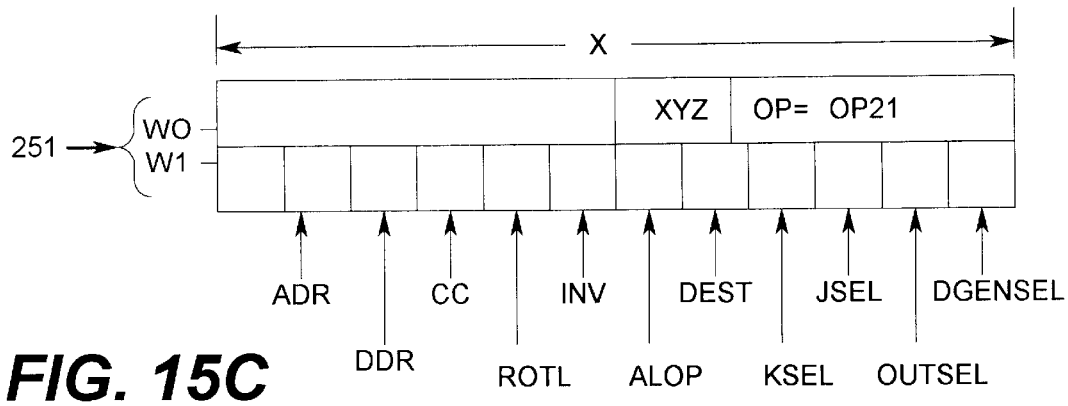

FIG. 15C

| FIELD | FUNCTION |
|---|---|
| ALOP | 0 = No Operation (J+0)<br>1 = Addition with carry (J+K+C)<br>2 = Addition without carry (J+K)<br>3 = Subtract with borrow (J-K-C)<br>4 = Subtract without borrow (J-K)<br>5 = J increment (J+1)<br>6 = J decrement (J-1)<br>7 = Exclusive OR<br>8 = Excusive NOR<br>9 = AND<br>10 = OR<br>11 = NOT, not J<br>12->15 No Operation (J+0) |
| INV | 0 = True data<br>1= Inverted data |
| ROTL | 0 = No rotation<br>1 = Rotate left 1 bit |
| CC | 0 = Carry status remains the same<br>1 = Clear carry flag |
| DDR | 0 = None<br>1 = X1D<br>2 = Y1D<br>3 = X2D<br>4 = Y2D |
| ADR | 0 = None<br>1 = X1A<br>2 = Y1A<br>3 = Z1A<br>4 = X2A<br>5 = Y2A<br>6 = Z2A |

| FIELD | FUNCTION |
|---|---|
| XYZ | 0 =Rd Set X<br>1 =Rd Set Y<br>2 =Rd Set Z |
| DGENSEL | 0 = A - bus<br>1 = B - bus<br>2 = C - bus<br>3 = D - bus<br>5 = '1'<br>6 = '0'<br>7 = R - bus |
| OUTSEL | 0 = A - bus<br>1 = B - bus<br>2 = C - bus<br>3 = D - bus<br>5 = '0'<br>6 = '1'<br>7 = R - bus |
| JSEL AND KSEL | 0 = A - bus<br>1 = B - bus<br>2 = C - bus<br>3 = D - bus<br>5 = '0'<br>6 = '1' |
| DEST (PART 1) | 0 = WR A Reg<br>1 = WR B Reg<br>2 = WR C Reg<br>3 = WR D Reg |
| DEST (PART 2) | 1 = Set X<br>2 = Set Y<br>3 = Set Z |

FIG. 16D

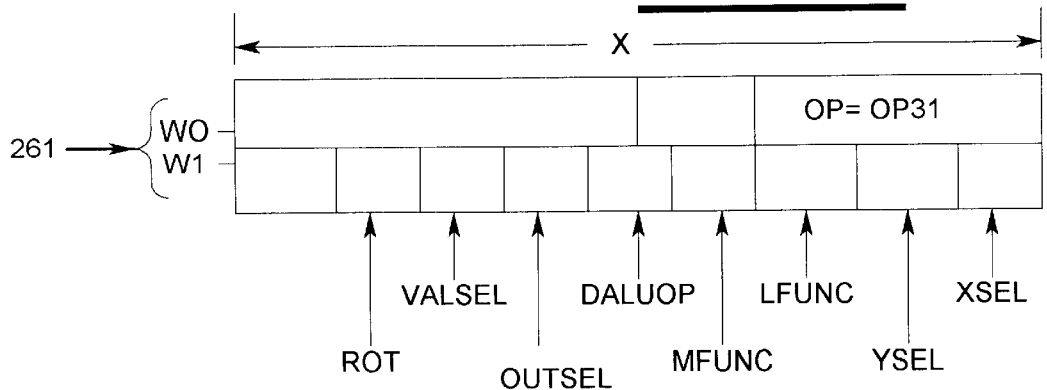

| FIELD | FUNCTION |
|---|---|
| XSEL | 0 -15 = bit on XD-bus passed by Mux 220o |
| YSEL | 0 -15 = bit on YD-bus passed by Mux 220p |
| LFUNC | 0 = XDBIT<br>1 = XDBIT inverted<br>2 = '1'<br>3 = '0' |
| MFUNC | 0 = YDBIT<br>1 = YDBIT inverted<br>2 = '1'<br>3 = '0' |
| DALUOP | 0 = No Operation (L)<br>1 = No Operation (M)<br>2 = OR<br>3 = AND<br>4 = Exclusive OR<br>5 = Exclusive NOR |
| OUTSEL | 0 = DALU-bus<br>1 = DALU-bus inverted<br>2 = XD=YD<br>3 = XD =YD inverted<br>4 = '1'<br>5 = '0' |
| VALSEL | 1 = VAL<br>0 = ALUD |
| ROT | 0 = No rotate<br>1 = Rotate left |

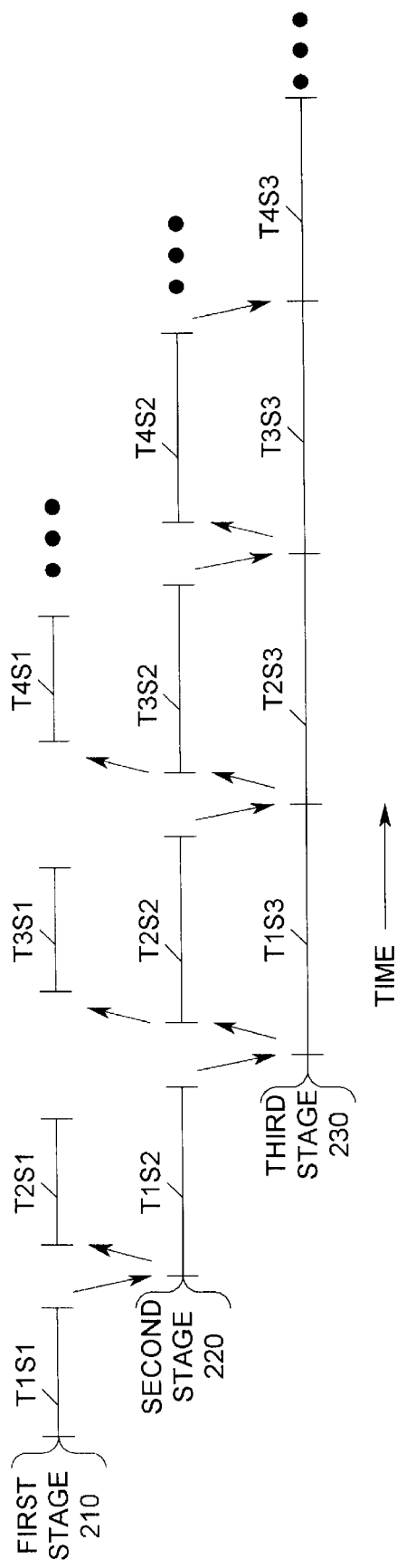
FIG. 18 — TIMING DIAGRAM OF APG STAGES

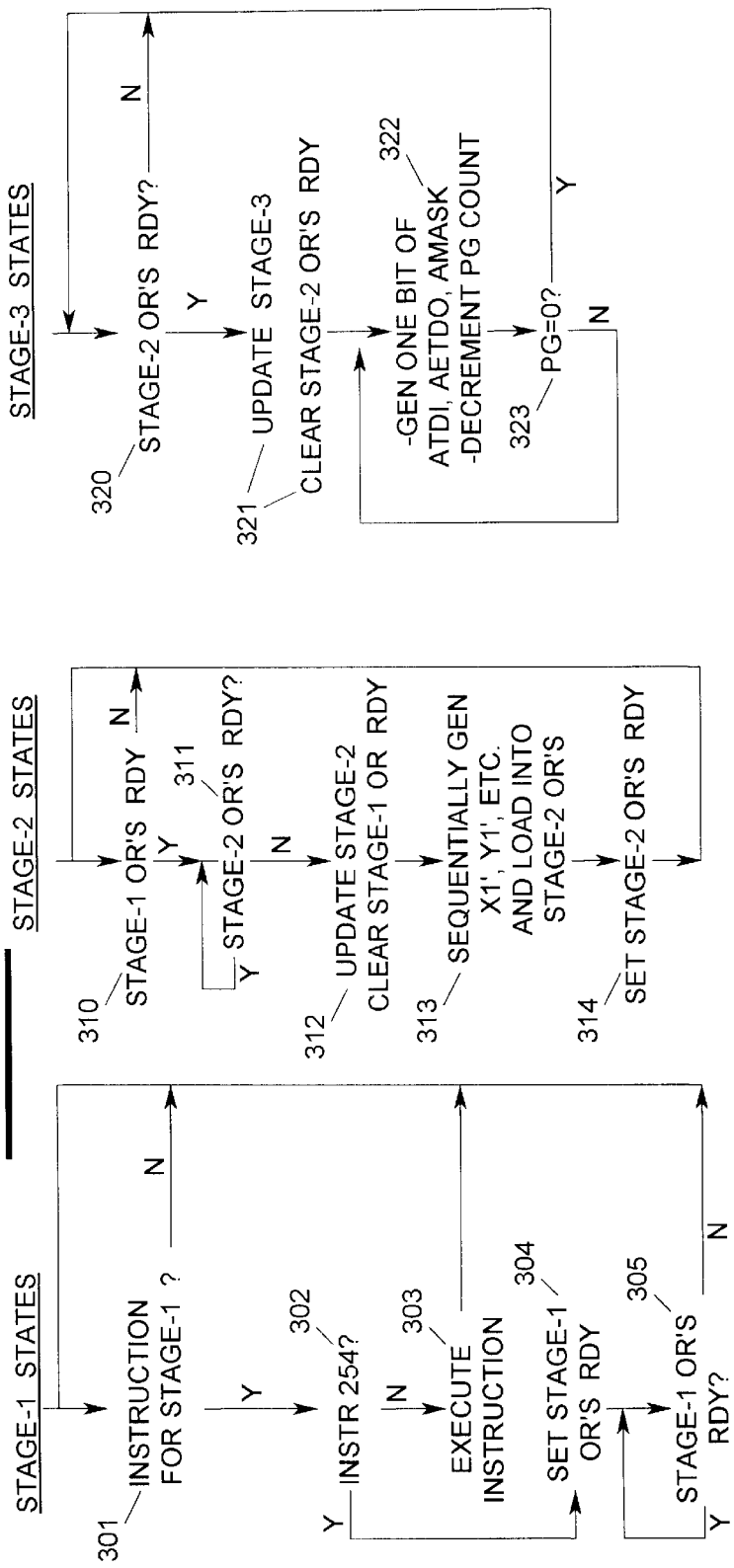
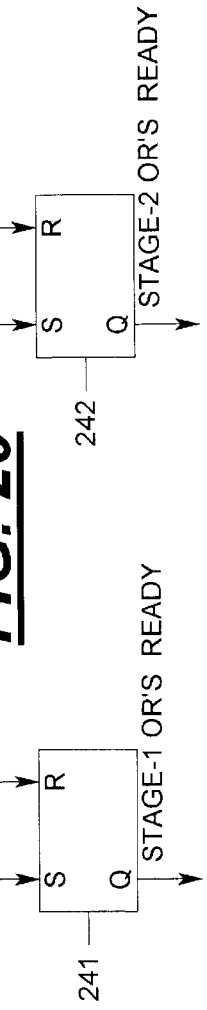
FIG. 19
FIG. 20

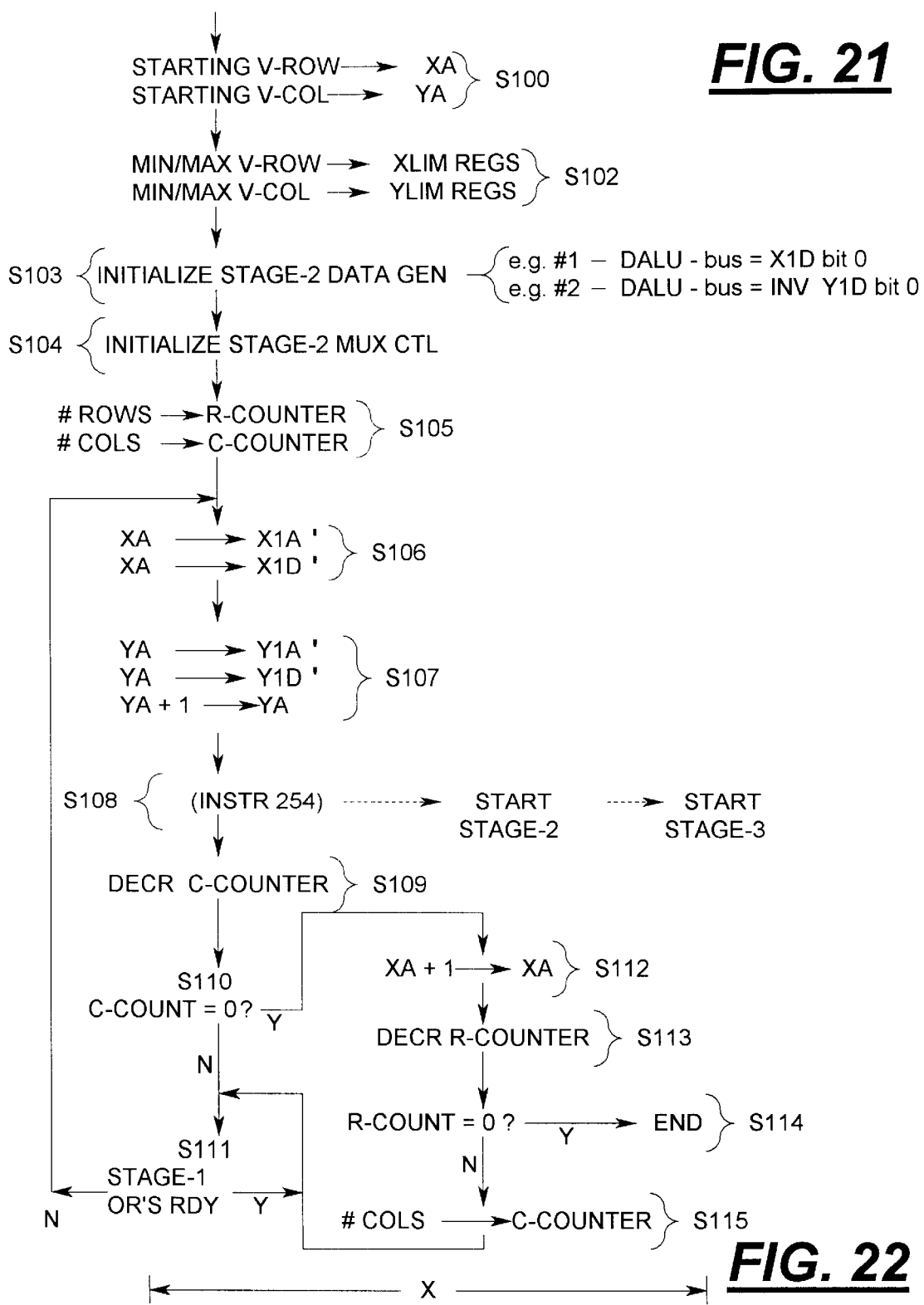

SYSTEM FOR TESTING IC CHIPS SELECTIVELY WITH STORED OR INTERNALLY GENERATED BIT STREAMS

RELATED CASES

The present invention, as identified by the above docket number and title, is related to four other inventions. Patent applications on all of these inventions were filed concurrently on Nov. 11, 1999; and they have one common Detailed Description. These four related inventions are identified as follows:

1. Entitled "MULTI-STAGE ALGORITHMIC PATTERN GENERATOR FOR TESTING IC CHIPS" having U.S. Ser. No. 09/432,965;
2. Entitled "INITIAL STAGE OF A MULTI-STAGE ALGORITHMIC PATTERN GENERATOR FOR TESTING IC CHIPS" having U.S. Ser. No. 09/432,969;
3. Entitled "INTERMEDIATE STAGE OF A MULTI-STAGE ALGORITHMIC PATTERN GENERATOR FOR TESTING IC CHIPS" having U.S. Ser. No. 09/432,968; and,
4. Entitled "OUTPUT STAGE OF A MULTI-STAGE ALGORITHMIC PATTERN GENERATOR FOR TESTING IC CHIPS" having U.S. Ser. No. 09/432,967.

BACKGROUND OF THE INVENTION

In the prior art, an electronic system for testing chips is disclosed in U.S. Pat. No. 5,390,129. This prior art system is assigned to Unisys Corporation, who also is the assignee of the present invention.

A simplified block diagram of the prior art chip testing system is shown in FIG. 2 of patent '129. That system includes a computer 50 which is coupled via a time-shared bus 52 to a plurality of driver boards 100; and each driver board 100 is coupled to a respective burn-in board 500 which holds several integrated circuit chips that are to be tested.

In operation, the computer 50 sequentially sends each driver board 100 a separate set of test data patterns that are used to test the chips. These test data patterns are stored on each driver board in a large SRAM which is shown in FIG. 3 by reference numeral 107 and is shown in greater detail in FIG. 9 by reference numeral 145. Which particular driver board receives and stores the test data patterns at any one time is determined by an address circuit 100A that is on the driver board, and is shown in the FIG. 2 block diagram.

After the test data patterns are stored in the SRAM 145 on all of the driver boards 100, then the chips on all of the burn-in boards 500 can be tested in parallel. To do that, the test patterns are concurrently read from all of the SRAMs and sent through respective output driver modules 164, as shown in FIG. 14, to the chips on all of the burn-in boards 500.

One particular feature of the chip testing system in patent '129 is that each burn-in board includes an ID code which identifies the types of chips that are to be tested on the board. That ID code is sensed by the driver board 100 and sent to the computer 50; and in response, the test data patterns which the computer 50 sends to the driver board are tailored to the ID code that is sensed.

However, the chip testing system in patent '129 also has some major limitations which are imposed by the FIG. 2 architecture. For example, the computer 50 is the sole source of the test data patterns for all of the driver boards 100. Consequently, the speed of operation of the chip testing system is limited because the computer 50 can only send the test data patterns to a single driver board at a time over the bus 52.

Another limitation of the chip testing system in patent 129 is that each driver board 100 always tests all of the chips on a burn-in board 500 concurrently. However, each burn-in board inherently has a limit on the total amount of power which the chips on the board can dissipate. Thus, in order to keep the total power dissipation on each burn-in board 500 below a certain limit, the total number of chips on each burn-in board must be decreased as the maximum power dissipation per chip increases.

Still another limitation of the chip testing system in patent '129 is that the stored test data patterns in a large SRAM 145 on each driver board can make very inefficient use of the SRAM memory cells. FIG. 9 of patent '129 shows that each SRAM 145 receives nineteen address bits and has eight data output bits; and thus the SRAM 145 on each driver circuit has eight million memory cells. But, certain types of chips are tested by sending them sequences of serial bit streams that vary in number with time. Thus, if an SRAM 145 sends four bit streams during one time interval and sends only two bit streams during other time intervals, then half of the SRAM is wasted when the two bit streams are being sent.

To address the above problems with the chip testing system of patent '129, the present inventors filed three U.S. patent applications on Aug. 31, 1999 which are identified as follows:

1. U.S. Ser. No. 09/386,946 entitled "An Electronic System for Testing Chips Having A Selectable Number Of Pattern Generators That Concurrently Broadcast Different Bit Streams To Selectable Sets Of Chip Driver Circuits";
2. U.S. Ser. No. 09/387,197 entitled "A Program Storage Device Containing Instructions That Are Spaced Apart By Unused Bits That End On Word Boundaries And Which Generate Chip Testing Bit Streams Of Any Length"; and,
3. U.S. Ser. No. 09/386,945 entitled "An Electronic System For Testing A Set Of Multiple Chips Concurrently Or Sequentially In Selectable Subsets Under Program Control To Limit Chip Power Dissipation".

Each of the above patent applications include the same set of FIGS. 1–12, and they each have the same Detailed Description. Also, each of the above patent applications has a separate set of claims which cover different aspects of the chip testing system that is disclosed.

The invention as claimed in U.S. Ser. No. 09/386,946 addresses the limitation in patent '129 regarding speed of operation. In particular, those claims cover a system for testing integrated circuit chips which is comprised of a selectable number of pattern generators, each of which is coupled via a separate bus to a selectable number of chip driver circuits. Each pattern generator also is coupled to a respective memory, which stores different bit streams, word by word, from its respective memory; and it sends the words that are read to all of the chip driver circuits which are coupled to its separate bus, simultaneously. While that is occurring, each chip driver converts the words which it is sent into bit serial test signals which test multiple integrated circuit chips in parallel.

Since all the chip driver circuits which are coupled to one separate bus receive the words of the bit streams simultaneously from one pattern generator, the speed of operation is increased over the prior art. Also, since all of the pattern generators send different bit streams at the same time on separate busses, the speed of operation is further increased over the prior art.

In U.S. Ser. No. 09/387,197, the invention as claimed addresses the limitations of patent '129 regarding inefficient use of memory to store the test data patterns. In particular, these claims cover a system for testing integrated circuit chips which is comprised of a pattern generator that is coupled to a memory which stores variable length instructions that specify sets of bit streams for testing the chips. Each variable length instruction includes a code which indicates the number of bit streams in the set. Each bit stream in the set consists of a selectable number of bits which start on a word boundary and vary in increments of one bit. A respective series of unused bits starts immediately after each bit stream and ends on a word boundary.

If the code indicates that the number of bit streams in a set is only one, then the one bit stream is stored in consecutive words of the memory. If the code indicates the number bit streams in a set is more that one, then those multiple bit streams are stored in an interleaved fashion in consecutive words in the memory. Consequently, the only memory cells that are wasted are those which store the unused bits after each bit stream. But, those unused bits are insignificant in number when each of the bit streams is long.

In U.S. Ser. No. 09/386,945, the invention as claimed addresses the limitations of patent '129 regarding total power dissipation by the chips which being tested on the burn-in board. In particular, those claims cover a system for testing integrated circuit chips which is comprised of a signal generator that generates a clock signal; and a control circuit having a first input which receives the clock signal, a second input for receiving commands, and multiple outputs. A command source sends programmable sequences of the commands to the second input of the control circuit; and a means in the control circuit selects particular outputs in response to the commands and passing the clock signal from the first input to only the selected outputs All of the outputs of the control circuit are coupled through respective clock transmitters to different chips which are to be tested. Thus, in response to the programmable commands, the clock signal can be sent sequentially to the chips that are to be tested, in selectable subsets. By such sequencing, the total power dissipation of the chips that are tested can be regulated when the chips are of a type that dissipate a large amount of power when they receive the clock signal, but dissipate substantially less power when they do not receive the clock signal. Such chips include, for example, CMOS microprocessor chips and CMOS memory chips.

Despite all of the features of the chip testing system that is disclosed in the above three patent applications (hereinafter the "base system"), the present inventors have further discovered a major improvement to that system. By this improved system, the amount of memory which is required to define the test signals for the chips is reduced by several orders of magnitude.

A preferred embodiment of the improved system is described herein and in each of the four related cases that are identified on page 1. In each case, the improved system is described with the same set of Figures and the same Detailed Description. Also, each case has a separate set of claims that cover a different aspect of the improved system.

In order to fully understand the structure and operation of the improved system, it first is necessary o have an understanding of the base system that is described in the three referenced patent applications Ser. Nos. 09/386,946 and 09/387,197 and 09/386,945. Accordingly, FIGS. 1–12 of those applications, as well as their Detailed Description, are herein repeated. Then, the improved system is described herein in conjunction with FIGS. 13–22, as a modification to the base system of FIGS. 1–12.

BRIEF SUMMARY OF THE INVENTION

The present invention, as claimed, covers a system for testing IC chips selectively with stored or internally generated bit streams. In accordance with the present invention, such a system is comprised of a memory which stores instructions of a first class that expressly recite a first bit stream, and stores instructions of a second class that specify operations which generate a second bit stream. Also, a first pattern generator is coupled to the memory, which sequentially reads the instructions of the first and second classes from the memory. Further, the first pattern generator includes a time-shared control circuit which sends the first bit stream to a test port on the chips in response to the first class instructions that are read. In addition, a second pattern generator is coupled to the first pattern generator. This second pattern generator receives the second class instructions that are read; and in response, it sequentially generates portions of the second bit stream by performing the operations which the second class instructions specify. Also, the time-shared control circuit includes a means for sending one portion of the second bit stream to the test port on the chips while the second pattern generator generates another portion of the second bit stream.

One particular benefit which is achieved by generating the second bit stream internally within the second pattern generator is that the amount of storage which is required in the memory is greatly reduced. For example, the second bit stream might contain a total of one billion bits; but all of the second class instructions which specify the operations for generating the one billion bits might require less than one thousand bits of storage in the memory. Further, as the number of bits in the second bit stream increases, the amount of memory storage that is saved by the second pattern generator tends to increase.

BRIEF DESCRIPTION OF THE DRAWINGS

FIG. 3 shows three different types of variable length instructions which are executed by the FIG. 1 system to test integrated circuit chips.

FIG. 15C shows one instruction that is executed by the first stage logic circuits of FIGS. 15A and 15B.

FIG. 16D shows an instruction that is executed by the second stage logic circuits of FIGS. 16A–16C.

FIG. 17B is a detailed logic diagram of another portion of the third stage in the APG of FIG. 14a.

FIG. 18 is a timing diagram which illustrates the sequence of operation for the first stage, second stage, and third stage in the APG of FIG. 14A.

FIG. 19 shows respective state diagrams for the first stage, second stage, and third stage in the APG of FIG. 14.

FIG. 20 shows two state-control flip-flops that are referenced in the state diagrams of FIG. 19.

FIG. 21 shows a program for the APG which is stored in the memory of the FIG. 13 system.

FIG. 22 shows another instruction, that is used in conjunction with the instructions of FIGS. 15C, 15D, 15E, 15G, 16D, 16E, 16F, and 16G in the program of FIG. 21.

DETAILED DESCRIPTION

Figure 1:
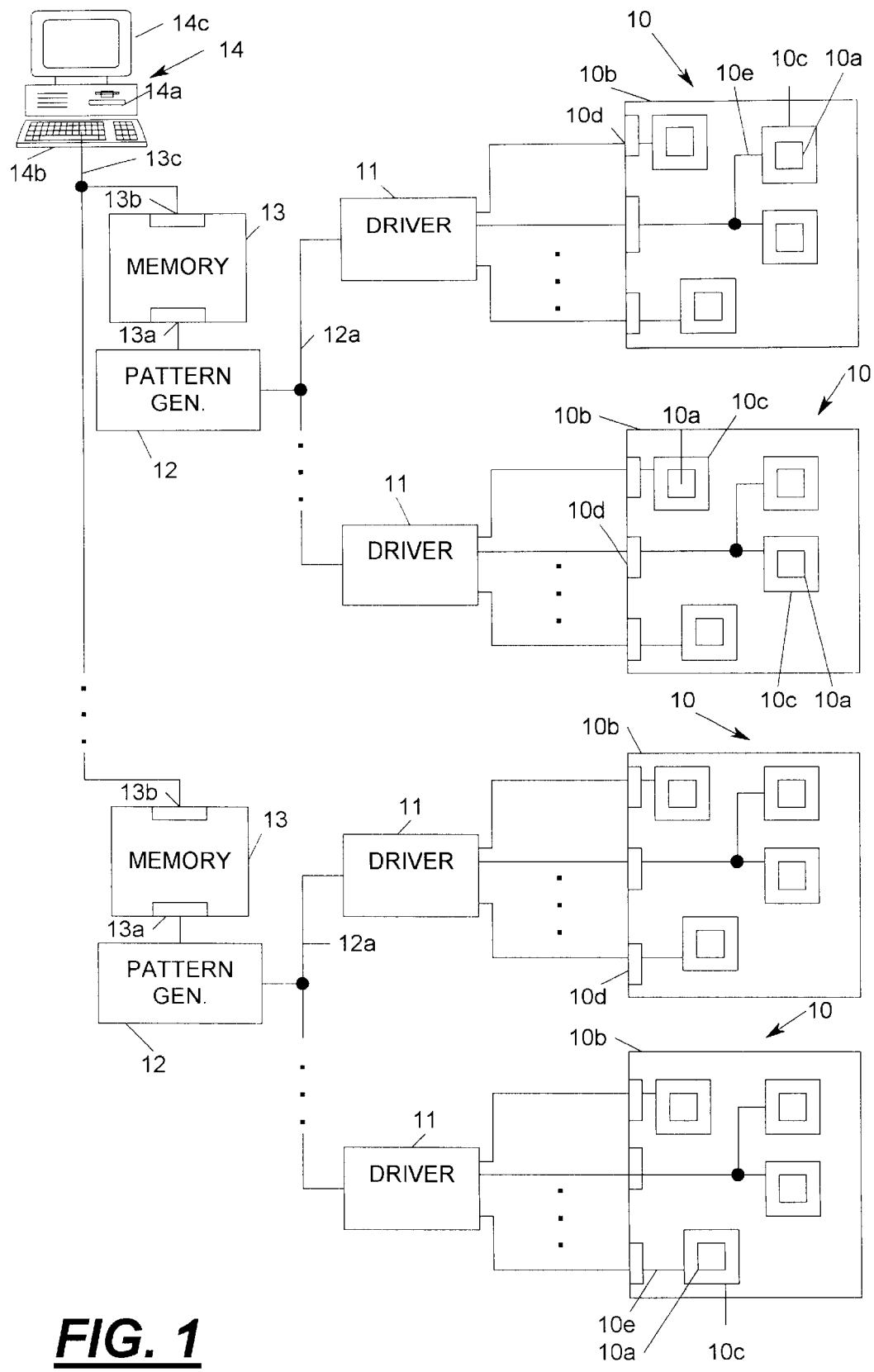
FIG. 1 shows a block diagram of a base system for testing integrated circuit chips; and that base system is modified as shown herein in FIGS. 13–22, in accordance with the present invention.

With reference first to FIGS. 1–12, one embodiment of the base system for testing integrated circuit chips will be described; and thereafter the modifications to the base system, which constitute the present invention, will be described with reference to FIGS. 13–22. As FIG. 1 shows, the base system is comprised of five different types of modules 10–14; and a description of each module is given below in TABLE 1.

TABLE 1

Figure 5:
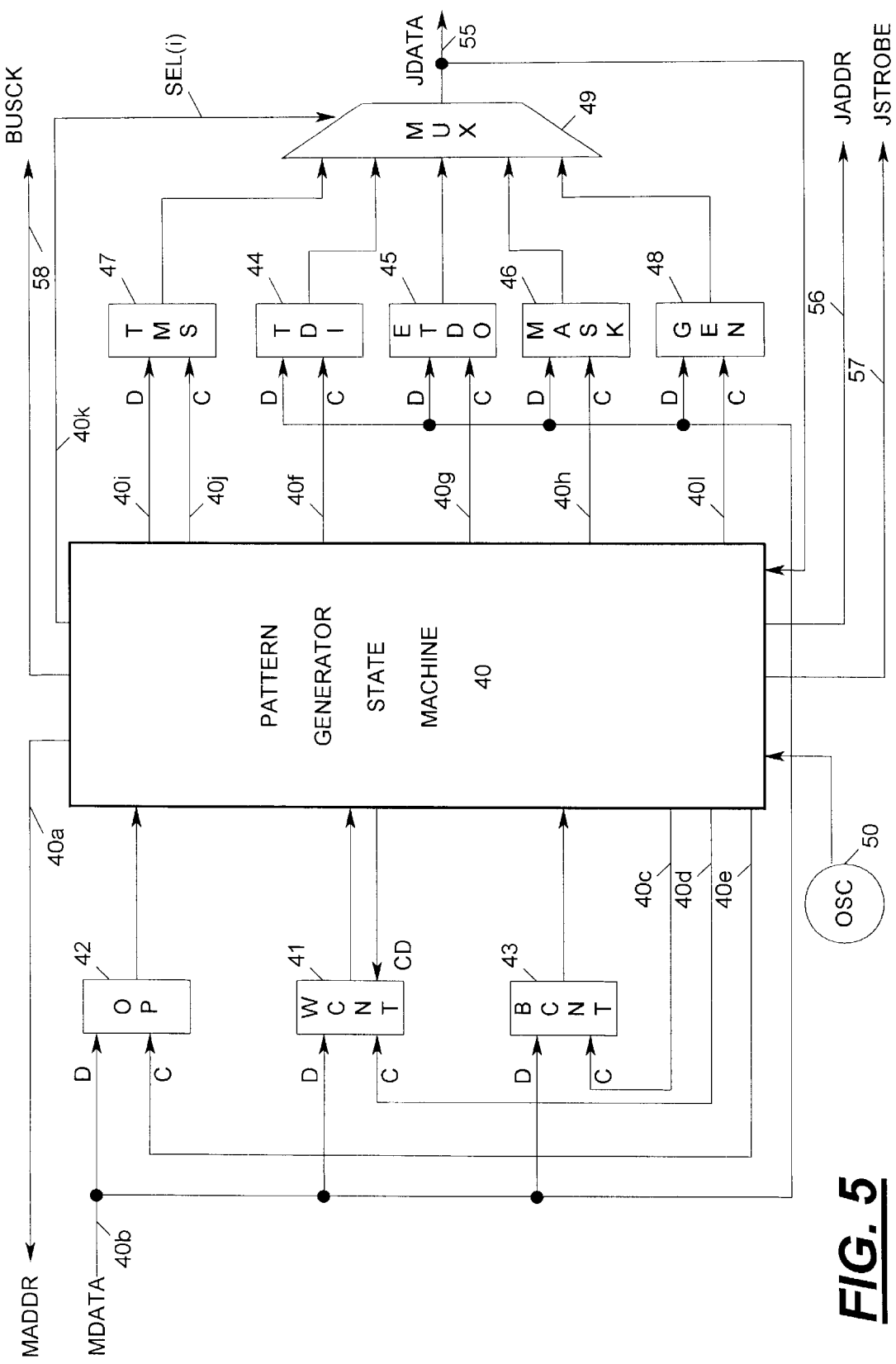
FIG. 5 shows the internal details of a pattern generator which occurs in selectable quantities in the FIG. 1 system.
Figure 6:
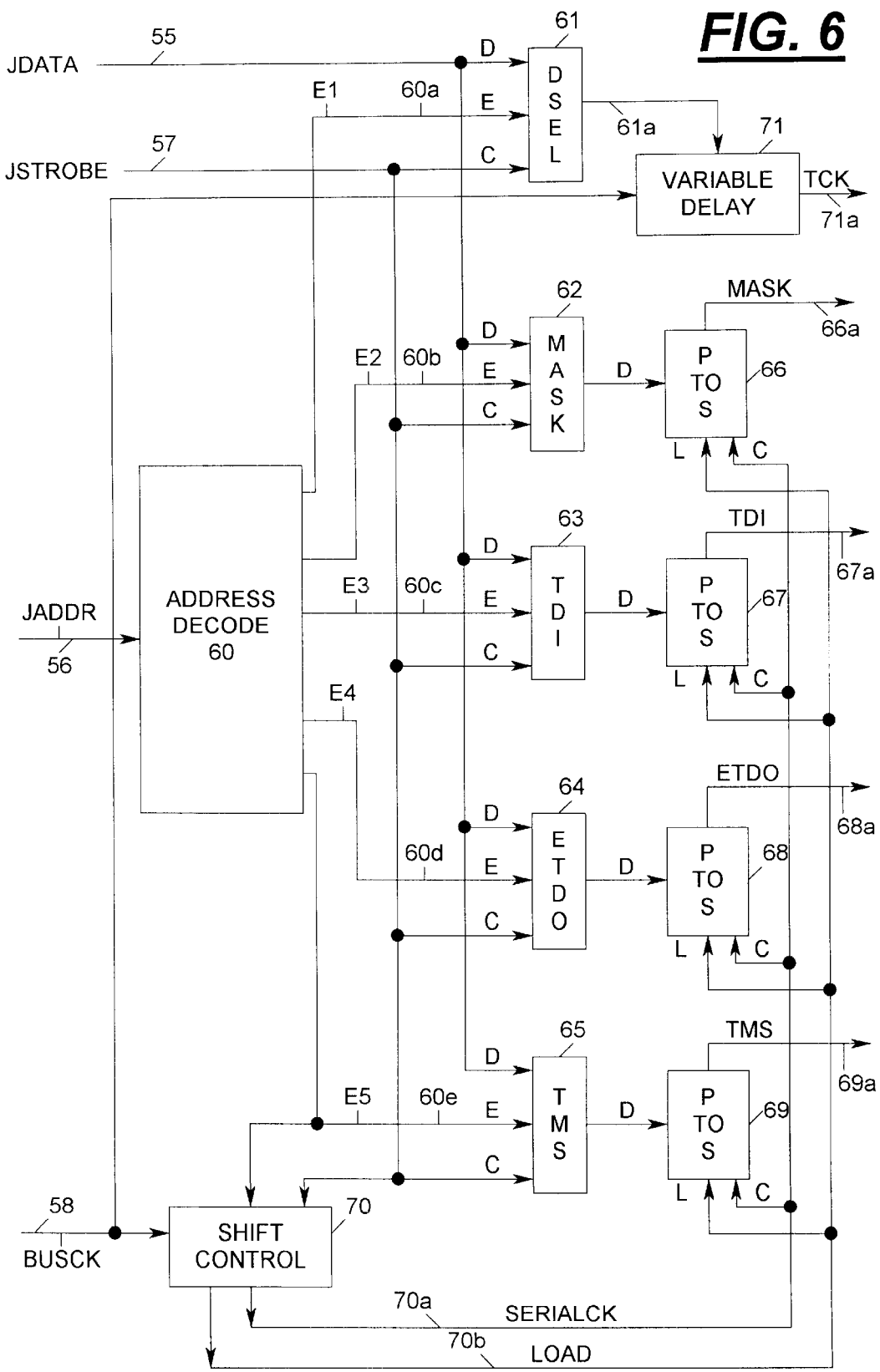
FIG. 6 shows the internal details of a chip driver circuit which occurs in selectable quantities in the FIG. 1 system.

| Module | Description |
| --- | --- |
| 10 | Each module 10 is a chip assembly which holds several integrated circuit chips 10a while they are tested. In the FIG. 1 system, the total number of chip assemblies 10 is selectable. Each chip assembly 10 includes one printed circuit board 10b on which several sockets 10c are soldered, and each socket holds one of the chips 10a. Connectors 10d are mounted on an edge of the printed circuit board 10b, and electrical conductors 10e in the printed circuit board carry test signals between the connectors 10d and the chips 10a. |
| 11 | Each module 11 is a chip driver circuit. In the FIG. 1 system, a separate chip driver circuit 11 is provided for each chip assembly 10. Each chip driver circuit 11 includes all of the circuitry which is shown in FIGS. 6, 8, 9, and 10. By that circuitry, test signals are sent to and received from the chips 10a as various bit-serial sequences which are programable. |
| 12 | Each item 12 is a pattern generator. In the FIG. 1 system, each pattern generator 12 is coupled via a bus 12a to a selectable number of chip driver circuits. FIG. 1 shows an example where all of the chip driver circuits 11 are partitioned into subgroups, and a separate pattern generator 12 is coupled via a separate bus 12a to each subgroup. Alternatively, all of the chip driver circuits 11 can be coupled by a single bus 12a to a single pattern generator; or, each chip driver circuit 11 can be coupled by a separate bus 12a to a separate pattern generator. Each pattern generator 12 includes all of the circuitry which is shown in FIGS. 5 and 6. By that circuitry, each pattern generator 12 executes a separate sequence of programmable instructions that specify particular bit-serial sequences for testing the chips 10c. In executing the instructions, each pattern generator 12 partitions the bit-serial sequences into words and broadcasts the words to all of the chip driver circuits 11 which are coupled to its bus 12a. |
| 13 | Each item 13 is a random access read-write memory. A separate memory 13 is provided for each pattern generator 12. Each memory 13 stores separate sequences of programmable instructions which are executed by the corresponding pattern generator. These instructions are read from the memory 13 by the pattern generator 12 via an access port 13a, and they are written into the memory via another access port 13b. Both access ports operate concurrently; so some instructions can be read from port 13a while at the same time other instructions can be written into port 13b. |
| 14 | Module 14 is a single host computer which directs the operation of the entire FIG. 1 system. The host computer 14 is coupled via a bus 13c to port 13b on all of the memories 13. Included within the host computer 14 is a disk 14a, a keyboard 14b, and a monitor 14c. Stored on the disk 14a are several programs for the pattern generators 12; and each such program includes a different set of the programmable instructions that specify particular bit-serial sequences of signals for testing the chips 10c. To select one of the programs and send it to the memory 13 of a particular pattern generator, an |

TABLE 1-continued

| Module | Description |
|---|---|
| | operator (not shown) enters various commands to the host computer 14 via the keyboard 14b. Thereafter, the results that are obtained from testing the chips with the selected program are stored by the pattern generator in the memory 13; and they are displayed by the host computer 14 on the monitor 14c. |

Figure 2:
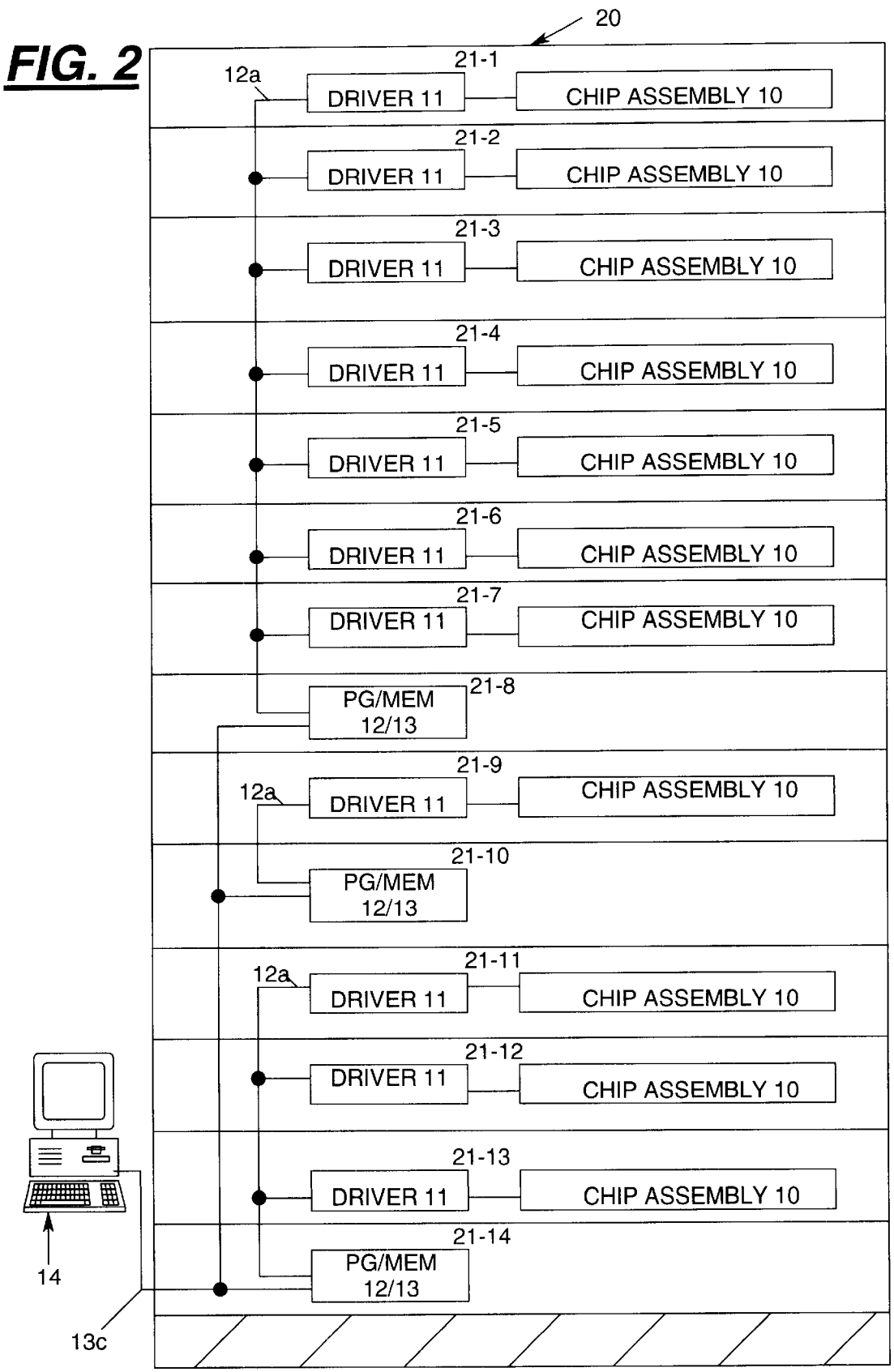
FIG. 2 shows how the chip testing system of FIG. 1 is physically packaged.

Referring next to FIG. 2, it shows how all of the modules 10–14 are physically packaged together as one system. Item 20 in FIG. 2 is a mechanical rack which has multiple horizontal slots 21-1, 21-2, etc. that are arranged on top of each other in a stack. Each slot selectively holds either one driver circuit 11 plus one chip assembly 10, or it holds one pattern generator 12 plus one memory 13.

FIG. 2 shows an example where the total number of slots in the rack 20 is fourteen. The top slot is 21-1; the next slot is 21-2, etc. In FIG. 2, the slots 21-1 thru 21-14 are occupied as follows.

Each of the slots 21-1 thru 21-7 holds a driver circuit 11 plus a chip assembly 10; and, the next slot 21-8 holds one pattern generator 12 plus its memory 13. The pattern generator 12 in slot 21-8 is coupled to the seven driver circuits in slots 21-1 thru 21-7 by a bus 12a. On that bus, the pattern generator in slot 21-8 broadcasts bit-serial test signals to all seven of the chip driver circuits that are in slots 21-1 thru 21-7.

Slot 21-9 holds a driver circuit 11 plus a chip assembly 10; and slot 21-10 holds one pattern generator 12 plus its memory 13. The pattern generator in slot 21-10 is coupled to the driver circuit in slot 21-9 by a bus 12a; and on that bus, the pattern generator in slot 21-10 sends bit-serial test signals to just the one chip driver circuit in slot 21-9.

Each of the slots 21-11 thru 21-13 holds a driver circuit 11 plus a chip assembly 10; and, the next slot 21-14 holds one pattern generator 12 plus its memory 13. The pattern generator in slot 21-14 is coupled to three driver circuits in slots 21-11 thru 21-14 by a bus 12a; and on that bus, the pattern generator in slot 21-14 broadcasts bit-serial test signals to all three of the chip driver circuits that are in slots 21-11 thru 21-13.

Each of the memories 13 in the slots 21-8, 21-10, and 21-14 store different sequences of several types of instructions which define the bit-serial test signals that are broadcast by the pattern generators 12. Three different types of the instructions are shown in FIG. 3. Instruction 31 is of a first type; instruction 32 is of a second type; and instruction 33 is of a third type.

Each first type instruction 31 includes a word W0 which contains an operation code OP, a word count WCNT, and a bit count BCNT. When the operation code has a particular value of OP1, instruction 31 causes a bit stream TDI to be written into a DATA REGISTER that is in the chip 10a that is tested. When the operation code has another particular value of OP2, instruction 31 cause the TDI bit-stream to be written into an INSTRUCTION REGISTER that is in the chip 10a.

For both of the operation codes OP1 and OP2, the TDI bit stream which is to be written is specified within instruction 31 as shown in FIG. 3. This TDI bit stream starts immediately after word W0 and it has a length that varies in increments of one bit. The total number of bits in the TDI bit stream is (WCNT-1)(X)+BCNT, where X is the number of bits per word. All bits in the last word which do not specify the TDI bit stream are unused.

Each second type instruction 32 includes a word W0 which contains an operation code, a word count WCNT, and a bit count BCNT. When the operation code has a particular value of OP3, instruction 32 causes the content of the DATA REGISTER in the chip 10a to be read and selectively compared with a data stream in the instruction. When the operation code has another particular value of OP4, instruction 32 causes the content of the INSTRUCTION REGISTER in the chip 10a to be read and selectively compared with a data steam in the instruction.

For both of the operation codes OP3 and OP4, two bit streams ETD0 and MASK are specified within the instruction 32 for use in the compare operation. Those two bit streams begin immediately after word W0, and they are interleaved word-by-word as shown in FIG. 3. If the i-th bit in the MASK bit stream is a "1", then the i-th bit which is read from the chip takes part in the compare operation; and that particular bit from the chip is compared to the i-th bit in the ETDO bit stream. Each of the bit streams ETDO and MASK are variable in length, and the total number of bits in each of those bit streams is (WCNT-1)(X)+BCNT. All of the bits in the last two words which do not specify the ETDO and MASK bit streams are unused.

Each third type instruction 33 includes a word W0 which contains an operation code OP, a word count WCNT, and a bit count BCNT. When the operation code has a particular value of OP5, instruction 33 causes a bit stream TDI to be written into a DATA REGISTER in the chip 10a, and concurrently, instruction 33 causes the content of the DATA REGISTER in the chip 10a to be read and selectively compared with a data stream in the instruction. When the operation code has another particular value of OP6, instruction 33 causes the TDI bit stream to be written into the INSTRUCTION REGISTER in the chip 10a, and concurrently, instruction 33 causes the content of the INSTRUCTION REGISTER in the chip 10a to be read and selectively compared with a data stream in the instruction.

For both of the operation codes OP5 and OP6, the TDI bit stream is specified within the instruction 33; and, two other bit streams ETDO and MASK are also specified within the instruction for use in the compare operation. These three bit streams begin immediately after word W0, and they are interleaved word-by-word as shown in FIG. 3. If the i-th bit in the MASK bit stream is a "1", then the i-th bit which is read from the chip takes part in the compare operation; and that particular bit from the chip is compared to the i-th bit in the ETDO bit stream. Each of the three bit streams TDI, ETDO, and MASK are variable in the length; and the total number of bits in each of those bit streams is (WCNT-1)(X)+(BCNT). All of the bits in the last three words which do not specify the TDI, ETDO and MASK bit streams are unused.

When the pattern generator 12 executes each of the instructions 31, 32, and 33, it also generates an additional bit stream which is not stated within the FIG. 3 instruction. That additional bit stream is used as a control signal, called TMS, which places the chip 10a in particular states that selectively read the DATA REGISTER, write the DATA REGISTER, read the INSTRUCTION REGISTER, or write the INSTRUCTION REGISTER. Each TMS bit stream is generated in response to the operation codes OP1–OP6 which specify that either the instruction register or the data register should be used, and the WCNT and BCNT counts which determine the number of bits in the TMS signal.

Figure 4:
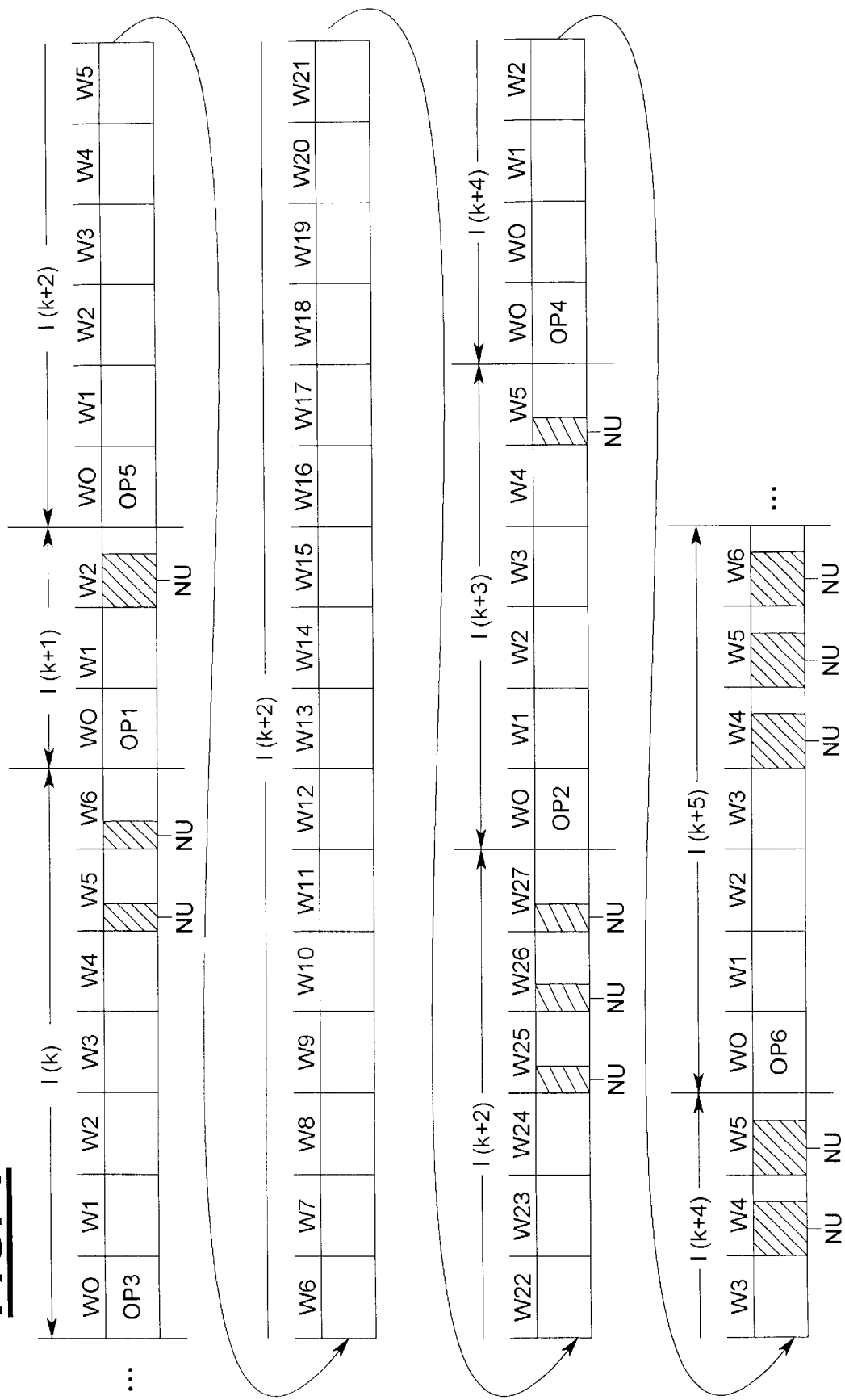
FIG. 4 shows an example of how the instructions of FIG. 3 are arranged in a sequence to form a test program.

FIG. 4 shows an example of how the three types of instructions 31, 32 and 33 are stored in different sequences within each memory 13 for a pattern generator 12. In the FIG. 4 example, the sequence of instructions is I(k), I(k+1), . . . etc. Instructions I(k+1) and I(k+3) are of the first type 31; instructions I(k) and I(k+4) are of the second type 32; and instructions I(k+2) and I(k+5) are of the third type 33.

Each first type instruction 31 is identified by an operation code of OP1 or OP2, and it specifies a single variable length bit stream TDI. Each second type instruction 32 is identified by an operation code of OP3 or OP4, and it specifies two variable length bit streams ETDO and MASK. Each third type instruction 33 is identified by an operation code of OP5 or OP6, and it specifies three variable length bits streams TDI, ETDO and MASK. A respective series of bits which are not used (NU) start immediately after each serial bit stream and end on a word boundary; and that enables the next instruction in the sequence to always start on a word boundary.

Turning now to FIG. 5, the details of the circuitry that is within each pattern generator 12 will be described. That circuitry includes a sequential state machine 40, a counter 41, a set of seven registers 42–48, a multiplexer 49, and an oscillator 50. All of those components 40–50 are interconnected to each other as shown.

Counter 41, as well as each of the registers 42–48, has a set of data inputs D and a clock input C. To store the data on the inputs D into the counter or a particular register, the state machine 40 sends a clock pulse to the clock input C. Counter 42 also has a countdown input CD; and, the counter decrements its stored count by one when a pulse is received on the CD input.

In operation, each of the components 41–48 is used by the state machine 40 to store the following information. Register 42 stores the operation code OP which occurs in the first word W0 of the FIG. 3 instructions 31, 32 and 33. Counter 41 stores the word count WCNT, and register 43 stores the bit count BCNT, which occurs in the first word W0 of each of the FIG. 3 instructions.

Register 44 stores one word of the bit stream TDI that occurs in the instructions 31 and 33 of FIG. 3. Register 45 stores one word of the bit stream ETDO which occurs in the instructions 32 and 33 of FIG. 3. And, register 46 stores one word of the bit stream MASK which occurs in the instructions 32 and 33 of FIG. 3.

Register 47 stores one word of the additional bit stream TMS that is internally generated by the pattern generator 12 during the execution of the FIG. 3 instructions. Register 48 is a general purpose register which stores various control bits that are used internally by both the pattern generator 12 and the chip driver circuits 11 in a manner which will be described shortly.

At the start of the execution of one of the FIG. 3 instructions, the pattern generator 12 reads the first word W0 of the instruction from the memory 13. To perform that-read operation, the state machine 40 sends a memory address MADDR on a set of address lines 40a that go to port 13a of the memory 13 that is shown in FIG. 1. In response, port 13a of the memory 13 sends the addressed word as memory data MDATA on a set of data lines 40b back to the state machine 40. Then, the state machine 40 sends a clock pulse on three clock lines 40c–40e to store the OP code in register 42, store the word count WCNT in counter 41, and store the bit count BCNT in register 43.

Thereafter, the state machine 40 examines the OP code which is in register 42. If the OP code in register 42 indicates that the instruction is of a type which includes a TDI data stream, then the first word of that data stream is read from the memory 13 and stored in register 44. If the OP code in register 42 indicates that the instruction is of a type which includes an ETDO data stream, then the first word of that data stream is read from the memory 13 and stored in register 45. If the OP code in register 42 indicates that the instruction is of a type which includes a MASK data stream, then the first word of the MASK data stream is read from the memory 13 and stored in register 46.

The above data stream words are obtained one at a time via the pattern generator state machine 40 by sequentially sending a memory address on the address lines 40a, and receiving the addressed word back from the memory 13 on the data lines 40b. Each received word from the memory 13 is stored in the appropriate register 44, 45, or 46 by sending a clock pulse on one of the clock lines 40f, 40g or 40h.

Following the above operation, the state machine 40 internally generates one word of the additional bit stream TMS that was previously described. That internally generated word of the TMS bit stream is sent on a set of signal lines 40i, and it is loaded into the TMS register 47 by a clock pulse on a clock line 40j.

Thereafter the state machine 40 uses the multiplexer 49 to sequentially pass the output of the registers 44–47, that were previously loaded, onto a set of data lines 55, which carry data signals called JDATA. To pass the output of a particular register through the multiplexer 49, the state machine 40 generates controls signals, called SEL(i), on a set of control lines 40k that go to the multiplexer 49.

While the output of a register is sent on the JDATA lines 55, the state machine 40 also generates address signals, called JADDR, on a set of address lines 56; and those address signals determine the destination for the JDATA signals. To indicate when the JDATA signals and JADDR signals are being sent, the state machine 40 sends a pulse called JSTROBE on a clock line 57. Also, the state machine 40 sends a free running clock called BUSCK on a clock line 58. All of the lines 55–58 together constitute the bus 12a which is shown in FIGS. 1 and 2 that connect the pattern generator 12 to a selectable number of chip driver circuits 11.

Next, with reference to FIG. 6, the details of the circuitry that is within each of the chip driver circuits 11 will be described. That circuitry include an address decoder 60, a set of five registers 61–65, a set of four parallel-to-serial shift registers 66–69, a shift control circuit 70, and a variable delay line 71. All of the components 60–71 are interconnected to each other as shown in FIG. 6.

Each of the registers 61–65 has a set of data inputs D, and enable input E, and a clock input C. The data inputs D receive the data signals JDATA from the FIG. 5 pattern generator, and the clock input C receives the JSTROBE clock pulse from the pattern generator. To store the JDATA signals into a particular register 61–65, a separate enable signal E1–E6 is sent to the enable input E of that register.

All of the enable signals E1–E5 for the registers 61–65 are generated by the address decode circuit 60 on a set of signal lines 60a–60e. Enable signal E1 is sent to register 61; enable signal E2 is sent to register 62; etc. These enable signals E1–E5 are generated in the address decoder 60 by decoding particular addresses on the JADDR address lines 56.

In operation, the pattern generator state machine 40 of FIG. 5 sends the JADDR, JDATA, and JSTROBE signals such that the registers 62–65 store the following information. One word of the MASK bit stream is stored in register 62; and that word is sent from the FIG. 5 register 47 through the multiplexer 50. One word of the TDI bit stream is stored in register 63; and that word is sent from the FIG. 5 register 44 through the multiplexer 50. One word of the ETDO bit stream is stored in register 64; and that word is sent from the FIG. 5 register 45 through multiplexer 50. One word of the TMS bit stream is stored in register 65; and that word is sent from the FIG. 5 register 47 through the multiplexer 50.

Each of the registers 62–65 is respectively coupled to a data input D on one of the parallel-to-serial shift registers 66–69. Those parallel-to-serial shift registers also have a LOAD input L and a CLOCK input C. If the LOAD signal on the input L is in a "1" state when the clock input C receives the rising edge of the SERIALCK clock signal, then all of the data input signals are stored in the parallel-to-serial shift registers 66–69. Otherwise, if the LOAD signal is in a "0" state when the rising edge of the SERIALCK clock signal occurs, then all of the registers 66–69 shift out one bit of the data which they store.

Both the LOAD signal and the SERIALCK clock signal are generated by the shift control circuit 70; and it operates in response to the enable signal E5 which enables a word of the TMS bit stream to be loaded into register 65. After the enable signal E5 causes the TMS register to be loaded, the shift control circuit 70 starts to generate the SERIALCK clock signal on line 70a. This is done by gating the bus clock signal BUSCK from clock line 58 to clock line 70a.

For the first cycle of the SERIALCK clock signal, the shift control circuit 70 sends the LOAD signal as a "1" to all of the serial-parallel registers 66–69; and that causes the registers 66–69 to store one word of the bit streams that are held in the registers 62–65. Then, the shift control circuit 70 generates the LOAD signal as a "0" which causes each of the parallel-to-serial registers 66–69 to shift out the word of the bit streams that they have stored.

Each bit from the registers 66–69 is shifted in synchronization with the SERIALCK clock. The MASK bit stream is shifted onto signal line 66a; the TDI bit stream is shifted onto signal line 67a; the ETDO bit stream is shifted onto signal line 68a; and the TMS bit stream is shifted onto signal line 69a. This shifting continues, in response to the "0" state of the LOAD signal, until each of the shift registers 66–69 is emptied.

If any one of the bit streams MASK, TDI, ETDO and TMS extend into a second word, those words will be read from the memory 13 and loaded into the registers 62–65 by the pattern generator state machine 40, while the above shifting occurs. In that case, the shift control circuit 70 will remember that the enable signal E5 was again sent for a second time to the TMS register 65.

Later, when the shift register 66–69 become empty, the shift control circuit 70 will check to see if the second enable signal E5 was sent. If it was, the shift control circuit 70 will again send the LOAD signal as a "1" to all of the serial-parallel registers 66–69; and that will cause registers 66–69 to store the second word of the bit streams that are held in the registers 62–65. Then, the shift control circuit 70 will generate the LOAD signal as a "0" until each of the parallel-to-serial registers 66–69 shift out the second word of the bit stream that they have stored.

The above loading and shifting continues until the end of the serial bit streams is reached for an instruction in the memory 13. Then, when the last bit of the bit streams is shifted from the registers 66–69, the shift control circuit 70 stops generating the clock signal SERIALCK on the clock line 70a.

In addition to all of the above-described operations, the chip driver circuit of FIG. 6 also generates a clock signal TCK on a clock line 71a. This TCK clock signal is a delayed replica of the BUSCK signal on line 53; and it is generated by the variable delay circuit 71. The amount of delay through the variable delay circuit is selected by control signals on signal lines 61a that are stored in register 61.

Figure 7:
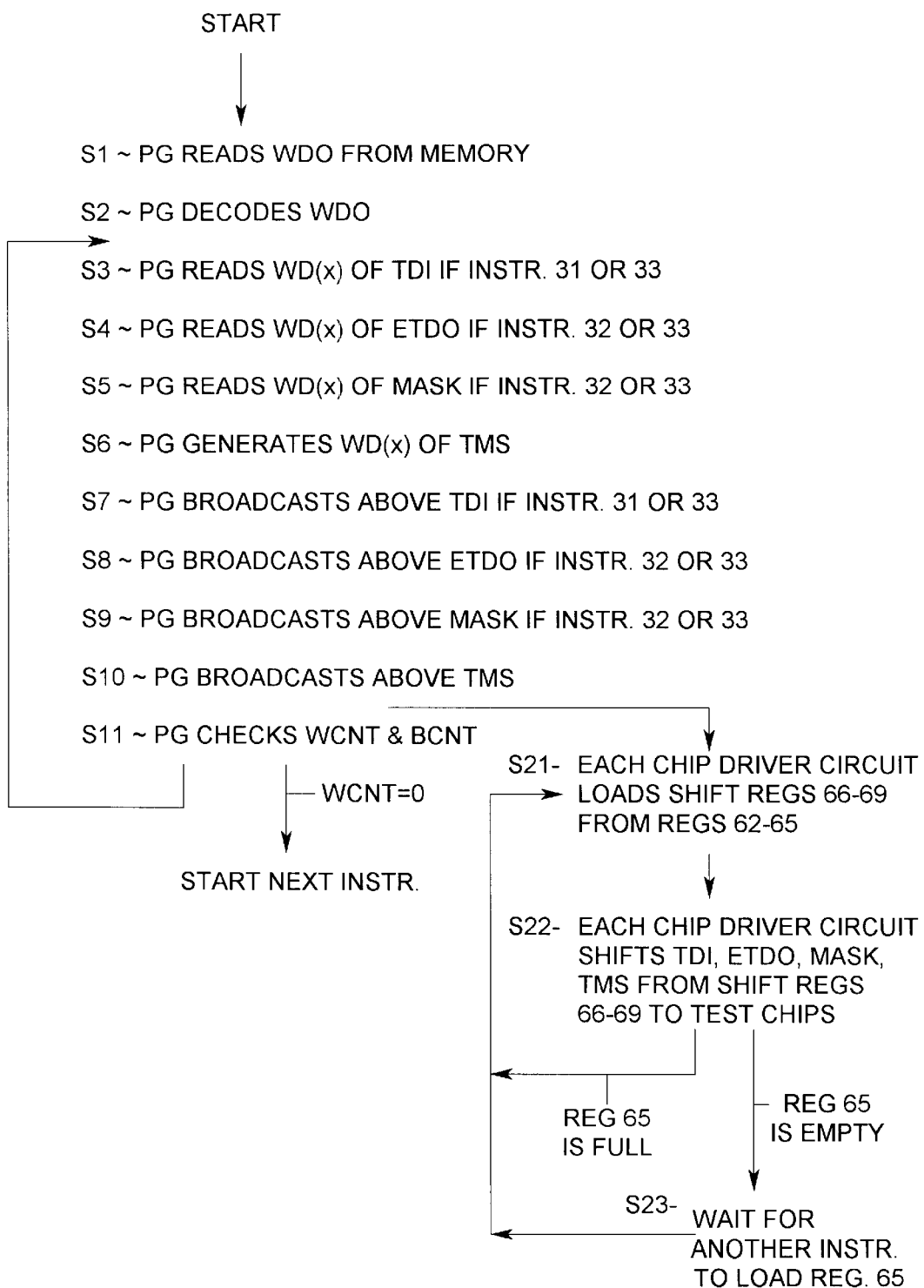
FIG. 7 shows how the pattern generators of FIG. 5 and chip driver circuits of FIG. 6 interact in the FIG. 1 system.

Referring next to FIG. 7, it illustrates the overall sequence in which each instruction in FIG. 3 is executed by the pattern generator of FIG. 5 and the chip driver circuit of FIG. 6. Initially, the pattern generator state machine 40 is in state S1 where it reads the first word W0 of an instruction from its memory 13. Thereafter, in state S2, the state machine 40 examines the operation code in register 42 to determine the type of the instruction that it is executing.

If the instruction is of a first type 31 or a third type 33, then the state machine 40 reads one word of the TDI bit stream; and this occurs in state S3. That word is stored is register 44 by the state machine 40.

If the instruction is of a second type 32 or a third type 33, then the state machine 40 reads one word of the ETDO bit stream; and this occurs in state S4. That word of the ETDO bit stream is stored in register 45 by the state machine 40.

Also if the instruction is of a second type 32 or a third type 33, then the state machine 40 reads one word of the MASK bit stream; and this occurs in state S5. That word of the MASK bit stream is stored in register 46 by the state machine 40.

Thereafter, the state machine 40 internally generates one word of the TMS bit stream; and this occurs in state S6. That word of the TMS bit stream is stored in register 47 by the state machine 40.

Next in state S7, the state machine 40 broadcasts one word of the TDI bit stream if it is executing a first or third type instruction 31 or 33. This word of the TDI bit stream is sent from register 44 through the multiplexer 49 and into register 63 of each chip driver circuit that is connected to the pattern generator.

Next in state S8, the state machine 40 broadcasts one word of the ETDO bit stream if it is executing a second or third type instruction 32 or 33. This word of the ETDO bit stream is sent from register 45 through the multiplexer 49 and into register 64 of each chip driver circuit that is connected to the pattern generator.

Next in state S9, the state machine 40 broadcasts one word of the MASK bit stream if it is executing a second or third type instruction 32 or 33. This word of the MASK bit stream is sent from register 46 through the multiplexer 49 and into register 62 of each chip driver circuit that is connected to the pattern generator.

Next in state S10, the state machine 40 broadcasts one word of the TMS bit stream. This word of the TMS bit stream is sent from register 47 through the multiplexer 49 and into register 65 of each chip driver circuit that is connected to the pattern generator.

Then in state S11, the state machine 40 decrements the word count WCNT in counter 41 by one and checks to see if the result is zero. If the result is not zero, all of the operations in states S3–S10 are repeated. Otherwise, if the result is zero, the state machine 40 starts to execute the next instruction by entering state S1.

Each time the state machine 40 broadcasts a word of the TMS bit stream in state S10, that event is remembered by the shift control circuit 70 in each chip driver circuit that is connected to the pattern generator. Then, if the parallel-toserial shift registers 66–69 are empty, they are loaded with the content of the holding register 62–65. That occurs when the chip driver circuits are in a state S21.

Thereafter, the content of the parallel-to-serial shift registers 66–69 are shifted onto the signal line 66a–69a. That occurs when the chip driver circuits is in a state S22. Then, when the last bit in the shift registers 66–69 is being shifted out, the shift control circuit 70 checks to see if register 65 has been loaded with another word of the TMS bit stream. If it has, the load and shift operations of states S21 and S22 are repeated.

When the bit streams of TDI, ETDO, MASK, and TMS are several words long, then the states S21 and S22 in chip driver circuits 11 occur concurrently with the states S3–S11 in the pattern generator 12. Due to that concurrent operation, the chip driver circuits 11 and the pattern generator 12 act as a multi-stage pipeline in which the chip driver circuits shift the bits from one word of the bit streams while the pattern generator reads and broadcasts the next word of the bit streams.

Also, when the pattern generator state machine 40 starts to execute the next instruction, the chip driver circuits 11 continue in state S22 to shift any bits that remain in the parallel-to-serial shift registers 66–69. Due to that concurrent operation, the chip driver circuits 11 and the pattern generator 12 again act as a multi-stage pipeline in which the chip driver circuits shift the bits in the bit streams of one instruction while the pattern generator is reading and decoding word W0 of the next instruction.

Figure 8:
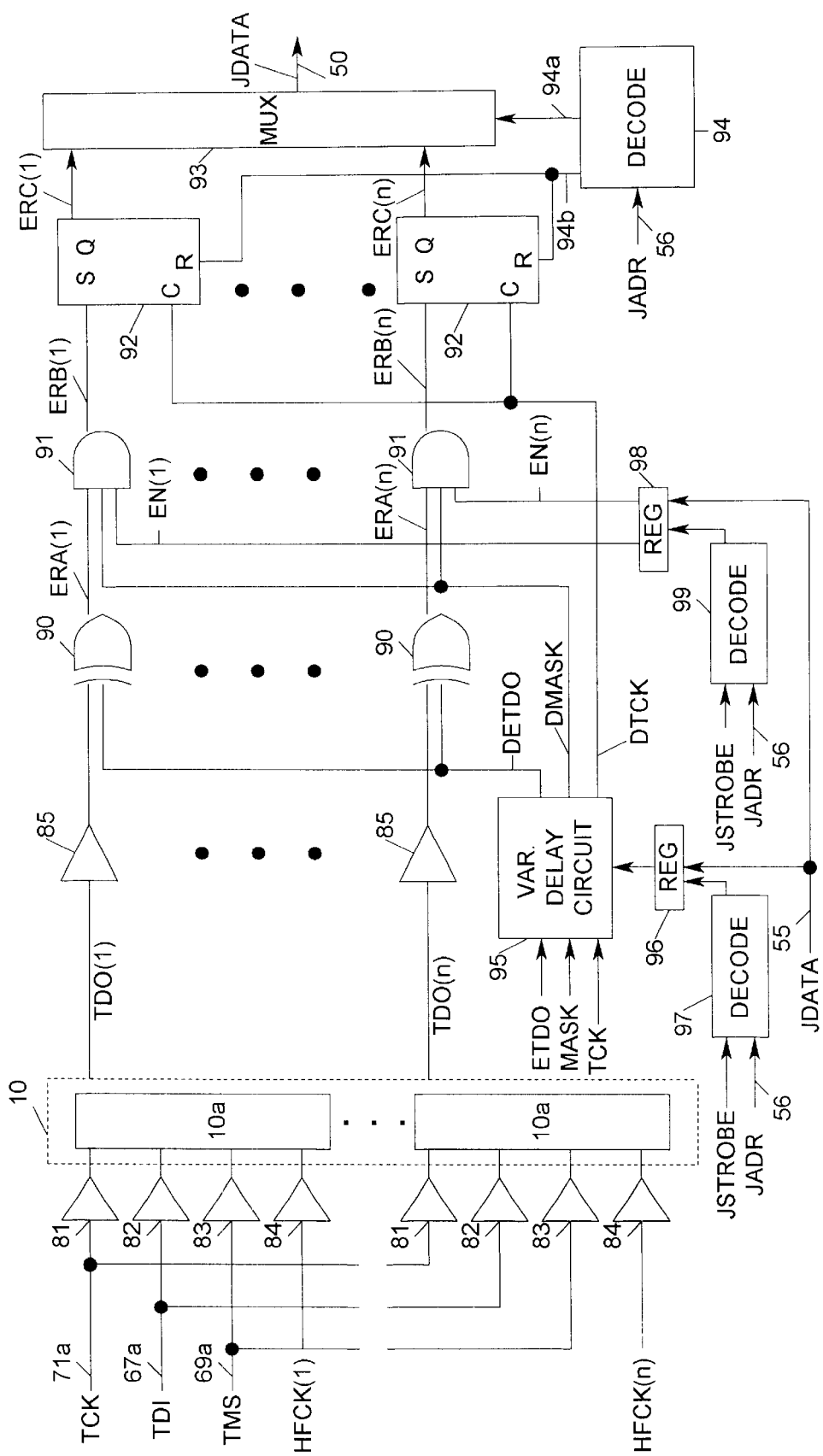
FIG. 8 shows additional circuitry on each chip driver circuit in FIG. 1 by which errors in the tested chips are detected.

Turning now to FIG. 8, it shows additional details on how each chip driver circuit is intercoupled with the integrated circuit chips that are tested. In FIG. 8, reference numeral 10 identifies the same chip assembly that is shown in FIGS. 1 and 2; and reference numeral 10a identifies the chips in the assembly 10 that are to be tested.

For each chip 10a that is to be tested in the assembly 10, a separate set of four transmitters 81-84 plus one receiver 85 is provided in the chip driver circuit 11. Each transmitter 81 sends the clock signal TCK from line 71a to a separate chip 10a. Each transmitter 82 sends the bit stream TDI from line 67a to a separate chip 10a. Each transmitter 83 sends the bit stream TMS from line 69a to a separate chip 10a. And, each transmitter 84 sends a respective high frequency clock HFCK(i), which will be described later in conjunction with FIGS. 9 and 10, to a separate chip 10a.

In response to the signals that are received from the transmitters 81–84, each chip 10a in the assembly 10 generates a separate output bit stream which is called TDO. That TDO bit stream, from each chip 10a, is sent to a separate receiver 85 on the chip driver circuit. From the receivers 85, all of the TDO bit streams are processed in parallel by the remaining components 90–98 of the chip driver circuit which are shown in FIG. 8.

Component 90 in FIG. 8 is an EXCLUSIVE-OR gate; component 91 is an AND gate; and component 92 is a flip-flop. A separate set of the components 90–92 is provided for each of the receivers 85. Component 93 in FIG. 8 is a multiplexer; component 94 is a decoder circuit; component 95 is a variable delay circuit; component 96 is a register; component 97 is a decoder circuit; component 98 is a register; and component 99 is a decoder circuit.

In operation, the bit streams ETDO, MASK, and TCK are sent through the variable delay circuit 95 to thereby generate three corresponding delayed bit streams which are called DETDO, DMASK, and DTCK respectively. The amount of delay through the variable delay circuit 95 is selected by the output of register 96; and that delay compensates for a delay which occurs within each chip 10a that generates the TDO bit stream. To select a particular delay, register 96 is loaded with the JDATA signals when the decoder circuit 97 detects a predetermined JADR address.

From the delay circuit 95, the delayed bit stream DETDO is sent to all of the EXCLUSIVE-OR gates 90 where it is compared to the TDO bit streams that come from all of the receivers 85. If a miscompare occurs between any bit in the DETDO bit stream and the corresponding bit in the TDO(i) bit stream, then the EXCLUSIVE-OR gate 90 where the miscompare occurs will generate an output signal ERA(i) in a "1" state.

Each of the error signals ERA(i) from the EXCLUSIVE-OR gates 90 are sent to a separate one of the AND gates 91; and those AND gates also receive two other input signals. One such input signal is the delayed bit stream DMASK, and the other input signal is a separate enable signal EN(i) from register 98. If the error signal ERA(i) is a "1" for a particular bit in the TDO(i) bit stream and the corresponding bit in the DMASK signal is also a "1" and the enable signal EN(i) is also a "1", then the output signal ERB(i) from the i-th AND gate is a "1".

To ignore a miscompare in any one particular bit in the bit stream TDO(i), the corresponding bit in the DMASK bit stream to set to a "0". Also, an entire bit stream TDO(i) can be ignored by setting the corresponding enable signal EN(i) to a "0".

When the error signal ERB(i) from any one of the AND gates 91 becomes a "1", that will cause the corresponding flip-flop 92 to become set. Each flip-flop 92 which becomes set will thereafter remain set until it is read and reset by the pattern generator 12.

To read the error flip-flops 92, the pattern generator 12 sends a particular JADR address to the decoder circuit 94; and in response the decoder circuit 94 generates a signal on output 94a which passes the error signals from all of the flip-flops 92 through the multiplexer 93 onto the JDATA lines 50. Then the pattern generator 12 sends another JADR address which causes the decoder circuit 94 to generate a signal on output 94b that resets all of the flip-flops 92.

Next, with reference to FIG. 9, several additional circuit components 100–109 which are included within each of the chip driver circuits 11 will be described. All of these components 100–109 interact to generate a separate high frequency clock signal HFCK(i) for each chip 10a that is being tested.

Figure 9:
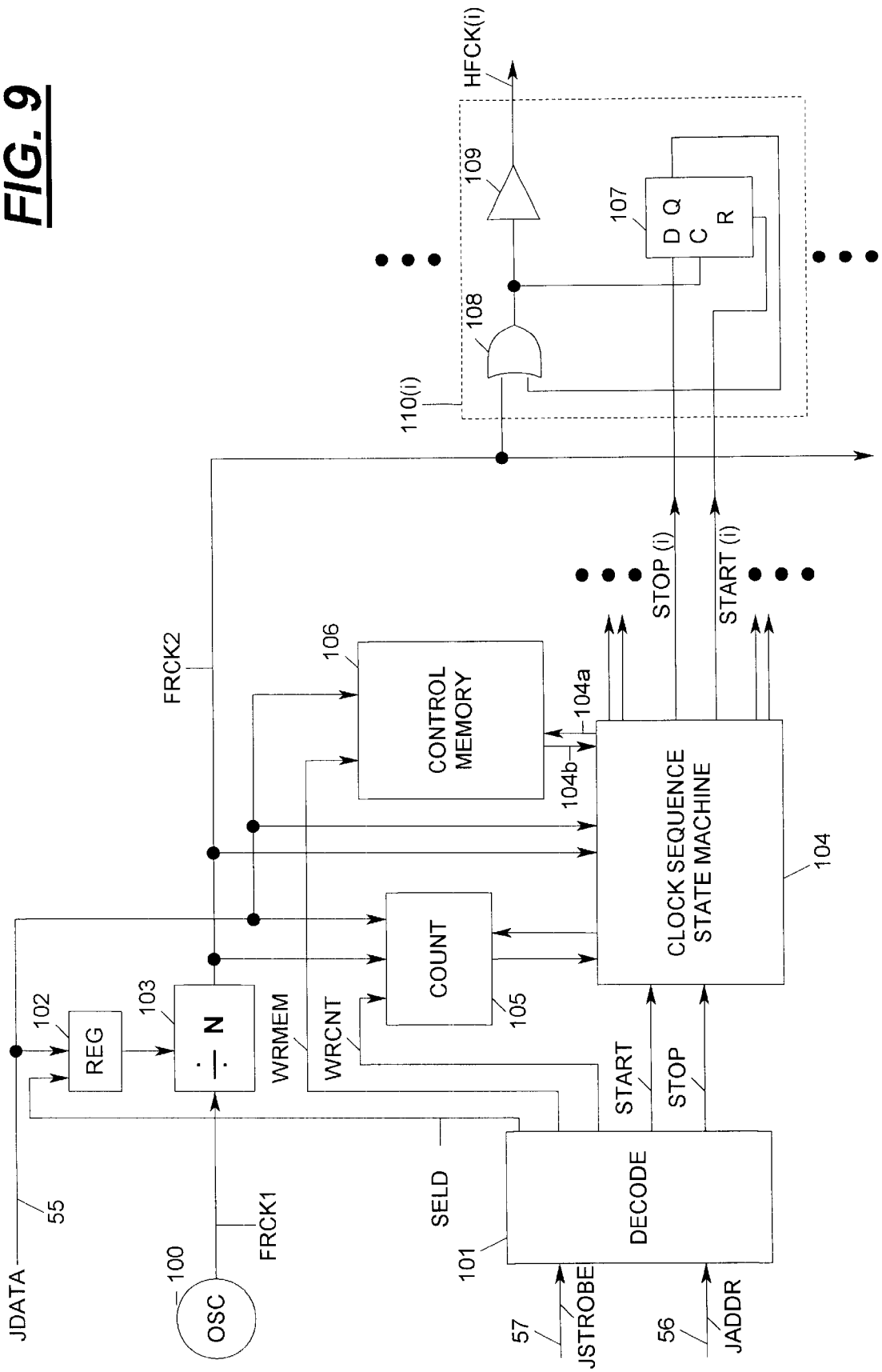
FIG. 9 shows additional circuitry on each driver circuit in FIG. 1 by which multiple chips are tested concurrently or sequentially in selectable subsets under program control.

In FIG. 9, component 100 is a free-running high frequency oscillator; component 101 is a decoder circuit; component 102 is a register; and component 103 is a divider circuit that divides by selectable integer N. Component 104 is a sequential state machine; component 105 is a counter circuit which holds a count for the state machine 104; and component 106 is a memory which holds control signals for the state machine 104. Component 107 is a flip-flop; component 108 is an OR gate; and component 109 is a transmitter. A separate set 110(i) of the components 107–109 is provided for each high frequency clock signal HFCK(i) that is generated.

In operation, the oscillator 100 generates a free running clock FRCK1 at a single high frequency. That clock signal FRCK1 is sent to the divider circuit 103 where it is reduced in frequency by a selectable integer N. Then, the output clock FRCK2 from the divider 103 is sent to each set 110(i) of the circuits 107–109.

Each set of circuits 110(i) generates the high frequency clock signal HFCK(i) by passing selectable cycles of the free running clock FRCK2. Those cycles that are passed are selected by two control signals START(i) and STOP(i); and they are generated by the sequential state machine 104.

When the signal STOP(i) is generated as a "1", the flip-flop 107 sets in synchronization with the free-running clock signal FRCK2. That set state of flip-flop 107 causes the output of OR gate 108 to constantly generate a "1"; and thus, the high frequency clock signal HFCK(i) will be stopped in a "1" state.

To reset flip-flop 107, the state machine 104 generates the STOP(i) signal as a "0" and it generates the START(i) signal as a "1". That reset state of flip-flop 107 causes the OR gate 108 to pass the clock signal FRCK2; and from the output of OR gate 108, the high frequency clock FRCK2 passes through the transmitter 109 where it becomes the clock signal HFCK(i).

In order to generate the control signals STOP(i) and START(i) for each set of the circuits 110(i), the state machine 104 reads various control bits that are stored in the control memory 106. An example of those control bits is shown by the "1"s and "0"s in FIG. 10. To read one set of the control bits, the state machine 104 sends an address on address lines 104a to the memory 106; and in response, the memory sends the addressed set of control bits back to the state machine 104 on signal lines 104b.

Figure 10:
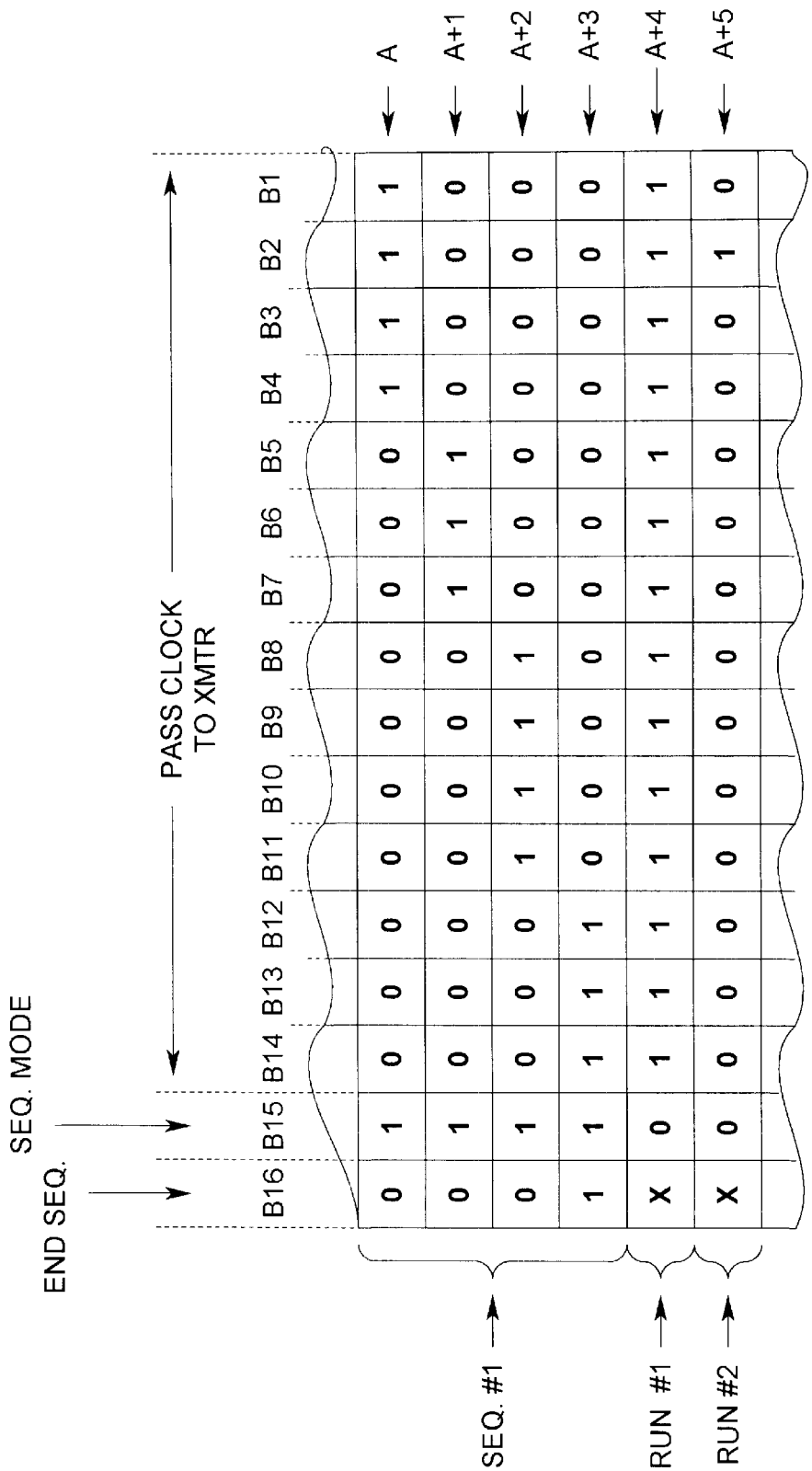
FIG. 10 shows the structure of a control memory which is a portion of the FIG. 9 circuitry.

FIG. 10 shows an example where each set of control bits consists of sixteen bits which are identified as bits B1–B16. Each of the first fourteen bits B1–B14 control the operation of a particular one of circuits 110(i). Bit B1 controls the circuit 110(1); bit B2 controls circuit 110(2); etc. The remaining bits B15 and B16 are mode control bits which cause the state machine 104 to operate in either a sequence mode or a free-running mode.

When the state machine 104 is sent a START command from the decoder 101 along with a particular memory address on the JDATA lines, it will read the set of control bits from the memory 106 at that address. If the state machine 104 reads a set of control bits in which bit B15 is a "1", then the state machine operates in the sequence mode. In that mode, the state machine 104 sequentially increments the address that it sends to the memory 106; and in response, the state machine receives the addressed set of control signals. This sequence mode of operation continues until a set of control bits is read in which bit B16 is a "1"; and then the sequence mode of operation stops.

For each set of control signals that is read in the sequence mode, the state machine 104 examines the control bits B1–B14. Each of the bits B1–B14 that is a "1" causes the state machine 104 to generate the STOP(i) and START(i) signals such that circuit 110(i) passes the clock FRCK2 for the number of cycles that is specified by the counter 105.

In FIG. 10, the set of control bits that is read by the address "A" has bits B1–B4 set to a "1". Thus, in response to that set of control bits, the state machine 104 will cause each of the circuits 110(1) through 110(4) to pass the clock signal FRCK2 for the number of cycles that is specified by the counter 105.

Next, the set of control bits that is read by the address "A+1" has bits B5–B7 set to a "1". Thus, in response to that set of control bits, the state machine 104 will cause-each of the circuits 110(5) through 110(7) to pass the clock signal FRCK2 for the number of cycles that is specified by the counter 105.

Next, the set of control bits that is read by the address "A+2" has bits B8–B11 set to a "1". Thus, in response to that set of control bits, the state machine 104 will cause each of the circuits 110(8) through 110(11) to pass the clock signal FRCK2 for the number of cycles that is specified by the counter 105.

Lastly, the set of control bits that is read by the address "A+3" has bits B12–B14 set to a "1". Thus, in response to that set of control bits, the state machine 104 will cause each of the circuits 110(12) through 110(14) to pass the clock signal FRCK2 for the number of cycles that is specified by the counter 105.

By comparison, if the state machine 104 reads a set of control bits in which bit B15 is a "0", then the state machine operates in the free-running mode. In that mode, the state machine 104 does not increment the address that it sends to the memory 106; but instead, the state machine operates continuously with just the one set of the control signals that it read.

Using that single set of control signals, the state machine 104 again examines the control bits B1–B14. Each of the bits B1–B14 that is a "1" causes the state machine 104 to generate the STOP(i) and START(i) signals such that circuit 110(i) passes clock FRCK2 continuously. To end this free-running mode of operation, the state machine 104 needs to be sent a STOP command from the decoder 101; and that command is sent when the decoder 101 receives a particular JADR address.

In FIG. 10, the set of control bits that is read by the address "A+4" has bit B15 set to a "0"; and that will place the state machine 104 in the free-running mode. Also in the set of control bits at address "A+4", all of the bits B1–B14 are set to a "1"; and so in response, the state machine 104 will cause each of the circuits 110(1) thru 110(14) to continuously pass the clock signal FRCK2 until a STOP command is received.

Similarly in FIG. 10, the set of control bits that is read by address "A+5" also has B15 set to a "0"; and that will place the state machine 104 in the free-running mode. However, in the set of control bits at address "A+5", only bit B2 is set to a "1"; and so in response, the state machine 104 will cause only circuit 110(2) to continuously pass the clock signal FRCK2.

One particular feature which is achieved with the circuitry of FIGS. 9 and 10 is that it enables the chips 10a in the chip assembly 10 to be tested concurrently as one set or sequentially in selectable subsets. This feature is desirable when the chips 10a which are being tested are of a type that dissipate a large amount of power when they receive the high frequency clock signal HFCK(i), but dissipate substantially less power when they do not receive the high frequency clock signal. Such chips include for example CMOS microprocessor chips and CMOS memory chips. By limiting the number of chips 10a that simultaneously receive the high frequency clock signal HFCK(i), the total amount of power that is dissipated in all of the chips 10a can be kept below any predetermined power limit which would otherwise be exceeded if all of the chips received the high frequency clock signal.

Another particular feature which is achieved with the circuitry of FIGS. 9 and 10 is that it enables a unique stream of bits to be written into each of the chips 10a separately. That is achieved by storing control bits in the memory 106 which cause the high-frequency clock signal HFCK(i) to be sent to each of the chips 10a one at a time. Then when one particular chip is receiving the high frequency clock signal HFCK(i), the data that is to be written into that chip is sent as a TDI bit stream to all of the chips 10a. This feature is desirable when certain unique information, such as a serial number, needs to be written into each chip 10a that is being tested.

Figure 11:
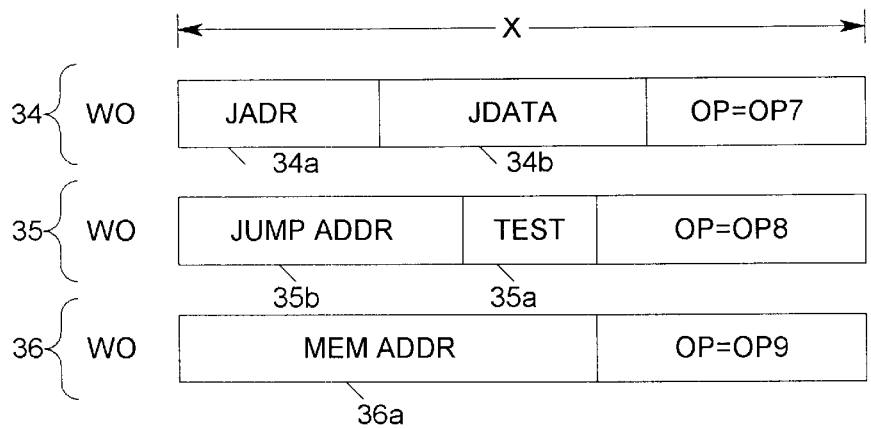
FIG. 11 shows three additional types of instructions which are executed by the chip testing system of FIG. 1.

Turning now to FIG. 11, it shows three additional instructions 34, 35 and 36 which can be included in a chip testing program in the memory 13, along with the previously described instruction 31, 32, 33 of FIG. 3. Instruction 34 is an internal control instruction which consists of only a single word W0 that includes an operation code OP7, a JADR field 34a, and a JDATA field 34b. When instruction 34 is executed by the pattern generator 12, the state machine 40 sends the JADR field 34a on to the JADR signal lines 56 and it sends the JDATA field 34b on to the JDATA signal lines 55.

Instruction 34 can be used to load register 61 in FIG. 6, to load registers 96 and 98 in FIG. 10, and to load register 102 in FIG. 9. Also instruction 34 can be used to send an address to the decoder 94 in FIG. 8, to send a count to the counter 105 in FIG. 9, to write each set of control bits in the control memory on 106. Also instruction 34 can be used to send START and STOP commands from the decoder 101 to the state machine 104.

Instruction 35 is a branch instruction which also consists of only a single word WO. Instruction 35 includes an operation code OP8, a test condition field 35a, and a jump address field 35b. When instruction 35 is executed by the pattern generator 12, the state machine 40 tests a condition which is specified by the test condition field 35a. If that tested condition is true, then the next instruction that is executed from the memory 13 occurs at the address of the branch instruction 35 minus the jump address in field 35b.

Instruction 36 is a write memory instruction that also consists of single word W0. Instruction 36 includes an operation code OP9 which identifies it as the write memory instruction, and it includes a memory address field 36a. When instruction 36 is executed by the pattern generator 12, the error signals are read from multiplexer 93 in FIG. 8 and written into memory 13 at the memory address field 36a.

One preferred embodiment of the base system which tests integrated circuit chips has now been described in detail. In addition, however, various changes and modifications can be made to the details of this embodiment.

For example, FIG. 2 illustrates just one example where the chip testing system is housed in a rack 20 which has a total of fourteen slots. But as a modification, the rack 20 can have any number of slots; and there can be multiple racks. Also, the slots in each rack can be filled with any combination of the chip assembly 10, the driver circuit 11, and the pattern generator 12 together with its respective memory 13.

Similarly, FIG. 1 shows just one example where each chip assembly 10 holds only four of the integrated circuit chips 10a that are to be tested. But as a modification, each chip assembly 10 can hold any desired number of the integrated circuit chips 10a.

Also, as another modification, each of the modules 11, 12, 13 and 14 that are shown in FIG. 1 can be constructed of any type of circuitry. For example, all of the circuitry in the chip driver circuit 11 and all of the circuitry in the pattern generator 12 (as is shown in detail in FIGS. 5, 6, 8, 9, and 10) can be constructed of TTL circuits, ECL circuits, MOS circuits, and CMOS circuits. Likewise, each memory module 13 of FIG. 1 can be constructed of memory cells of any type, such as those which store data bits in flip-flops or in a capacitor or on a magnetic storage media or on an optical storage media.

Likewise, each of the sequential control circuits that are in the illustrated chip testing system can have any type of internal construction. Those sequential control circuits include the pattern generator state machine 40 in FIG. 5, the shift control circuit 70 of FIG. 6, and the clock sequence state machine 104 of FIG. 9. Any internal structure for the pattern generator state machine 40 is suitable so long as it operates in accordance with states S1–S11 of FIG. 7. Any internal structure for the chip control circuitry 70 is suitable so long as it operates in accordance with states S21–S23 of FIG. 7. And, any internal structure for the clock sequence state machine 104 of FIG. 9 is suitable so long as it operates in a sequence mode and a free running mode as described in conjunction with FIG. 10.

Also, as another modification, the number of bits which are read as a word from each memory module 13 can be any predetermined number. FIG. 3 shows that each word in the memory module 13 consists of "X" bits. Suitably, X is an integer number of bytes, such as 16 bits, 32 bits, 48 bits, 64 bits, etc.

Further, as another modification, each TMS bit stream which is generated to put the chips 10a that are tested in a particular state, can be any predefined series of bits. What each bit stream needs to be is determined by the internal structure of the chips 10a. As one specific example, the TMS bit streams can be predefined and generated as is shown below in TABLE 1A.

TABLE 1A

| TMS Header | State of chip 10a in response to Header |
| --- | --- |
| 010000 | Read INSTRUCTION REGISTER |
| 011000 | Write INSTRUCTION REGISTER |
| 011100 | Read DATA REGISTER |
| 011110 | Write DATA REGISTER |

Each TMS header in TABLE 1A is followed by a series of "1" bits which equals the number of TDO bits that are read from the INSTRUCTION/DATA REGISTER, or the number of TDI bits that are written into those registers. That series of "1" bits is followed by a series of "0" bits which continues until the next TMS header starts.

As another example, each TMS bit stream can be predefined and generated in accordance with any desired standard. One such standard is the IEEE 1149.1 Boundry Scan Standard, which is herein incorporated by reference.

Figure 12:
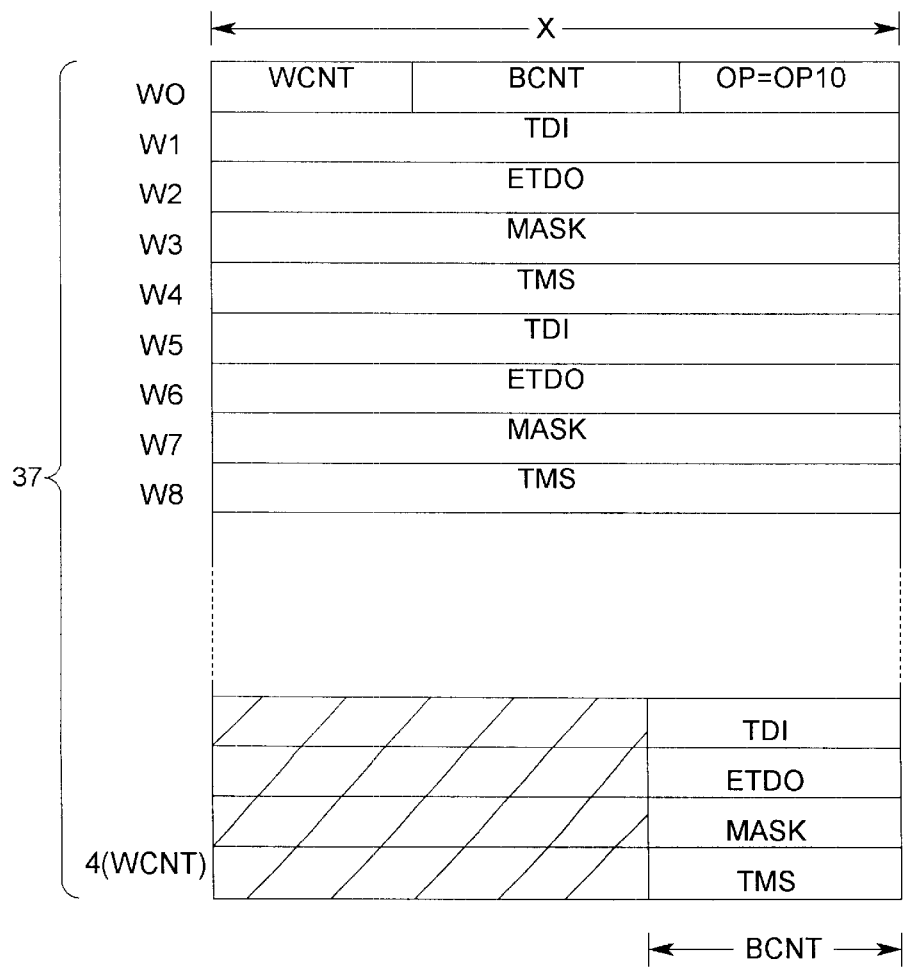
FIG. 12 shows a modification which can be made to the three instructions that are shown in FIG. 3.

In addition, FIG. 12 shows still another modification whereby all four of the bit streams TDI, ETDO, MASK and TMS that are sent by the pattern generator are expressly specified within an instruction 37. This instruction 37 is identified by an operation code of OP10 in the first word W0. Instruction 37 includes one new TMS field which specifies the TMS bit stream that is to be sent. All of the other fields BCNT, WCNT, TDI, ETDO and MASK are the same as the corresponding fields that were previously described for instruction 33 of FIG. 3.

By being able to expressly define the TMS bit streams within instruction 37, a single pattern generator 12 can sequentially test different types of chips which require different TMS bit streams to enter the same state. However, if the chips that are being tested all use the same TMS signal sequences, then instruction 33 is preferred over instruction 37 because instruction 33 occupies 25% less memory space.

As another modification, any one of the bit streams TDI, ETDO, and MASK in instruction 37 can be removed from that instruction. If the TDI bit stream is removed, then the result is similar to the previously described instruction 32 of FIG. 3, except that the TMS bit stream can be specified as desired. If the EDTO and MASK bit streams are removed from instruction 37, then the result is similar to the previously described instruction 31 of FIG. 3, except that the TMS bit stream can again be specified as desired.

Figure 13:
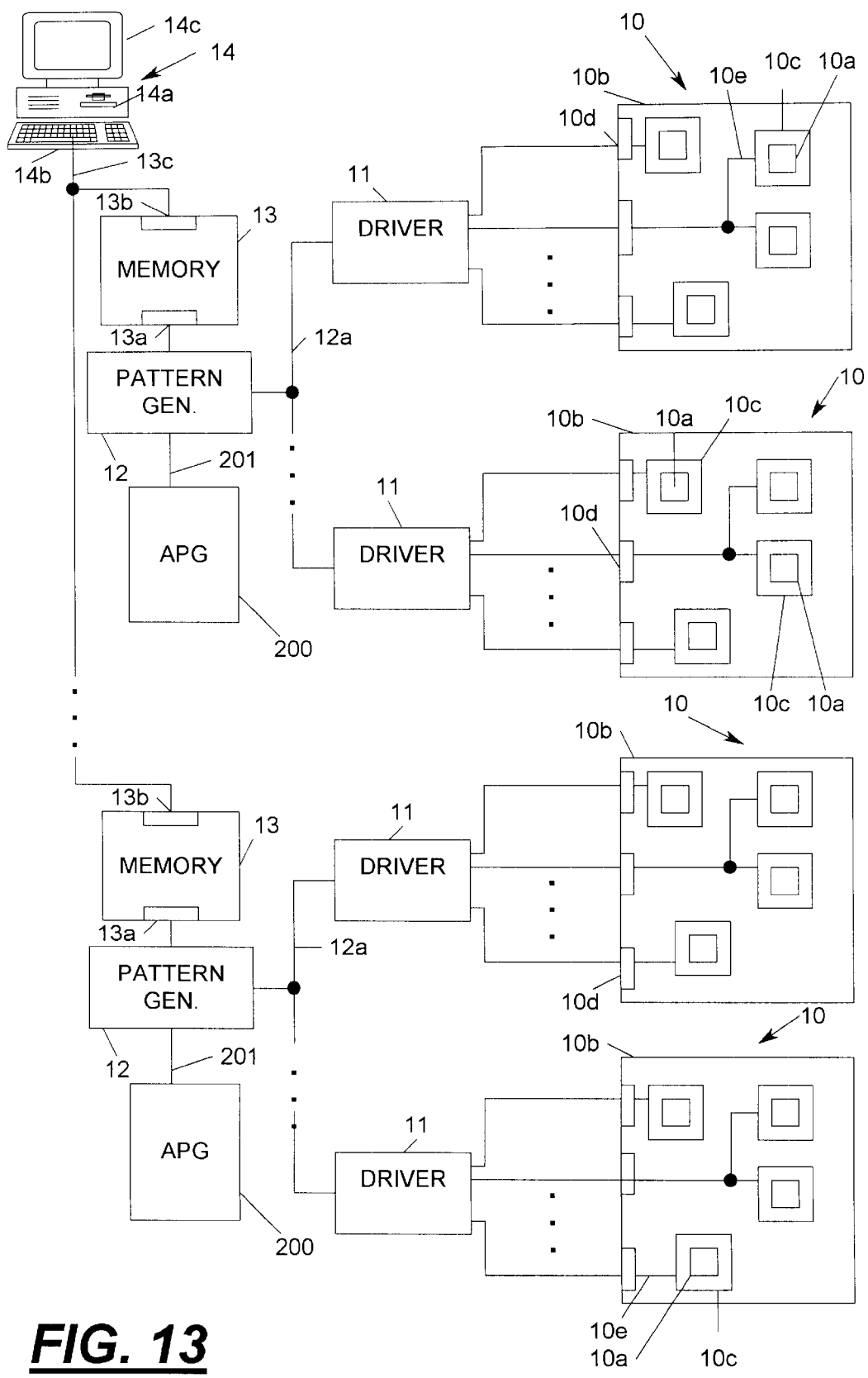
FIG. 13 shows a modified system which tests integrated circuit chips in accordance with the present invention; and this modified system is obtained by incorporating an algorithmic pattern generator (APG) into the base system of FIG. 1.

Now in accordance with the present invention, a modified system will be described in which one or more additional modules, which are herein called an algorithmic pattern generator (APG), are incorporated into the above-described chip testing system of FIG. 1. This modified system is illustrated in FIG. 13. There, modules 10, 11 and 14 of FIG. 1 are repeated; module 12 and 13 are modified to modules 12' and 13'; and the newly added APG modules are identified by reference numeral 200.

FIG. 13 shows one particular embodiment where a separate APG module 200 is coupled via a separate interface 201 to every one of the previously described modules 12'. Alternatively, however, a separate APG module 200 may be coupled via its separate interface 201 to any subset of the modules 12'. For example, only one of the modules 12' may be coupled to an APG module 200.

In operation, each APG module 200 internally generates the TDI, ETDO, and MASK test signals which test the chips 10a that are in the chip assemblies 10. To internally generate those test signals, the APG module 200 performs a complex sequence of operations, and those operations are specified by APG instructions in the memory 13'. These APG instructions, and the circuitry which executes them within the APG module 200, will be described herein in detail in conjunction with all of the FIGS. 13 thru 22.

One particular benefit which is achieved by generating the TDI, ETDO and MASK test signals internally within the APG module 200 is that the amount of storage which is required in the memory 13' is greatly reduced. This benefit tends to increase as the total number of bits which are in the test signals increases. For example, if the TDI, ETDO and MASK test signals contain a total of one billion bits, then the APG module 200 might require less than one thousand bits of storage in the memory 13' to store the APG instructions for generating all of the test bits. By comparison, if all of the test bits are stored in the memory 13', then one billion bits of storage would be required.

On the other hand, as the total number of bits in the TDI, ETDO, and MASK test signals decreases, then the previously described circuitry of FIGS. 1 thru 12 tends to provide a more economical means for presenting those test signals to the chips 10a. Accordingly, the modified system of FIG. 13 has two modes of operation. In the first mode, the module 12' reads the test signals TDI, EDTO, and MASK from the memory 13' and sends them to the chips 10a in serial bit streams, as was previously described in conjunction with FIGS. 1–12. In the second mode of operation, module 12' reads the APG instructions from the memory 13' and passes them to the APG module 200 for execution. During the execution of those APG instructions, the APG module 200 sequentially generates words of the TDI, ETDO and MASK bit streams and it sends them to the module 12'. Then within the module 12', the words of the test signals are converted to the serial bit streams that are sent to the chips 10a.

Figure 14A:
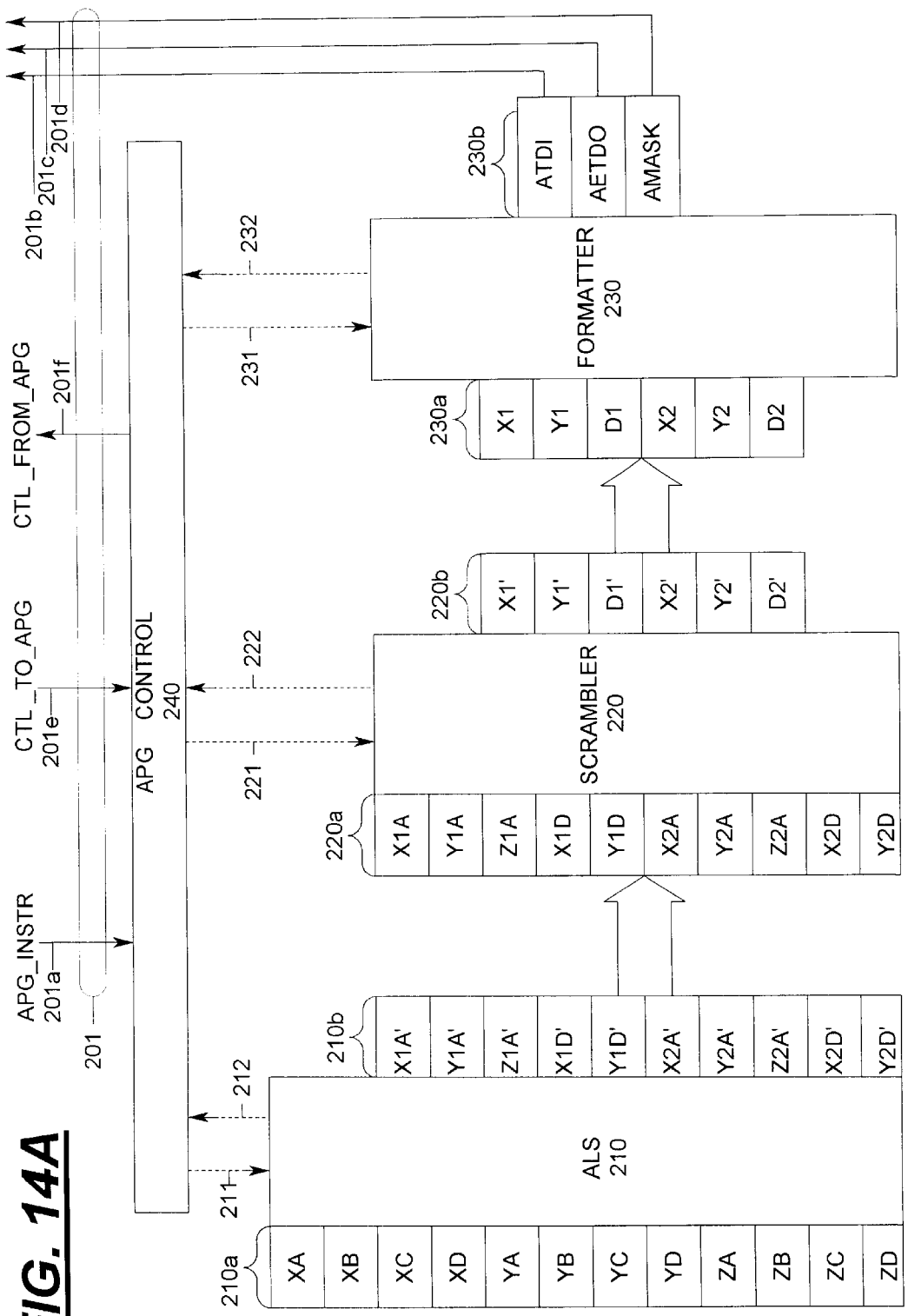
FIG. 14A shows a preferred internal structure for the APG of FIG. 13.

Turning now to FIG. 14a, one preferred internal structure for the APG module 200 will be described. With this particular structure, the APG module 200 is comprised of a three stage pipeline; and those stages are identified by reference numerals 210, 220 and 230. The first stage 210 is an arithmetic-logic stage (ALS); the second 220 is a scrambler stage; and the third stage 230 is a formatter stage. These three stage 210, 220, and 230 operate under the control of a control unit 240.

In operation, the ALS stage 210 and the scrambler stage 220 and the formatter stage 230 run concurrently; and during that concurrent operation, each stage of the pipeline performs different operations on different sets of data. To enable these concurrent operations to occur, each stage of the pipeline is provided with its own set of input registers and its own set of output registers.

All of the input registers for the ALU stage are identified by reference numeral 210a. These input registers 210a are partitioned into three sets, with four registers in each set. The "X" set consists of registers XA, XB, XC, and XD; the "Y" set consists of registers YA, YB, YC, and YD; and the "Z" set consists of registers ZA, ZB, ZC, and ZD.

Starting with the content of its input registers 210a, the ALU stage performs various arithmetic and logical operations; and it stores the results of those operations in its output registers 210b. Those output registers are partitioned into two sets of five registers each. The first set consists of registers X1A', Y1A', Z1A', X1D', and Y1D'; and the second set consists of registers X2A', Y2A', Z2A', X2D' and Y2D'.

Similarly, reference numeral 220a identifies all of the input registers of the scrambler stage 220. A separate input register is provided in the scrambler stage for each of the output registers 210b in the ALU stage. For example, input register X1A corresponds to output register X1A'; input register Y1A corresponds to output register Y1A'; etc.

At certain times during the operation of the APG pipeline, the contents of all of the output registers 210b from the ALU stage 210 are transferred to the corresponding input registers 220a of the scrambler stage 220. Then, the scrambler stage 220 performs various scrambling operations on the content of its input registers, and it stores the result in its output registers 220b. Those output registers are partitioned into two sets of three registers each. The first set consists of registers X1', Y1', and D1'; and the second set consists of registers X2', Y2, and D2'.

Likewise, all of the input registers of the formatter stage 230 are identified by reference numeral 230a; and, a corresponding input register is provided for each output register of the scrambler stage. For example, input register X1 corresponds to output register X1'; input register Y1 corresponds to output registers Y1'; etc.

At certain times, the content of the output registers 220b from the scrambler stage are transferred to the input registers 230a of the formatter stage. After that occurs, the formatter stage performs various operations on the content of its input registers; and that generates several words of each of the tests signals TDI, ETDO, and MASK. Those test signals are stored, one word at a time, in the formatter output registers 230b. These output registers 230b are labeled ATDI, AETDO, and AMASK in order to indicate that they hold the TDI, ETDO, and MASK signals which are internally generated in the APG.

All of the operations which are performed in each of the pipeline stages 210, 220, and 230 are controlled by respective sets of control signals that are sent from the control unit 240 to each of the stages. The control signals that are sent to the arithmetic logic stage 210 occur on a set of conductors 211; the control signals that are sent to the scrambler stage 220 occur on a set of conductors 221; and the control signals that are sent to the formatter stage 230 occur on a set of conductors 231.

Each of the pipeline stages 210, 220, and 230 also sends response signals back to the control unit 240. The response signals that are sent by the arithmetic logic stage 210 occur on a set of conductors 212; the response signals that are sent by the scrambler stage 220 occur on a set of conductors 222; and the response signals that are sent by the formatter stage 230 occur on a set of conductors 232.

Figure 14B:
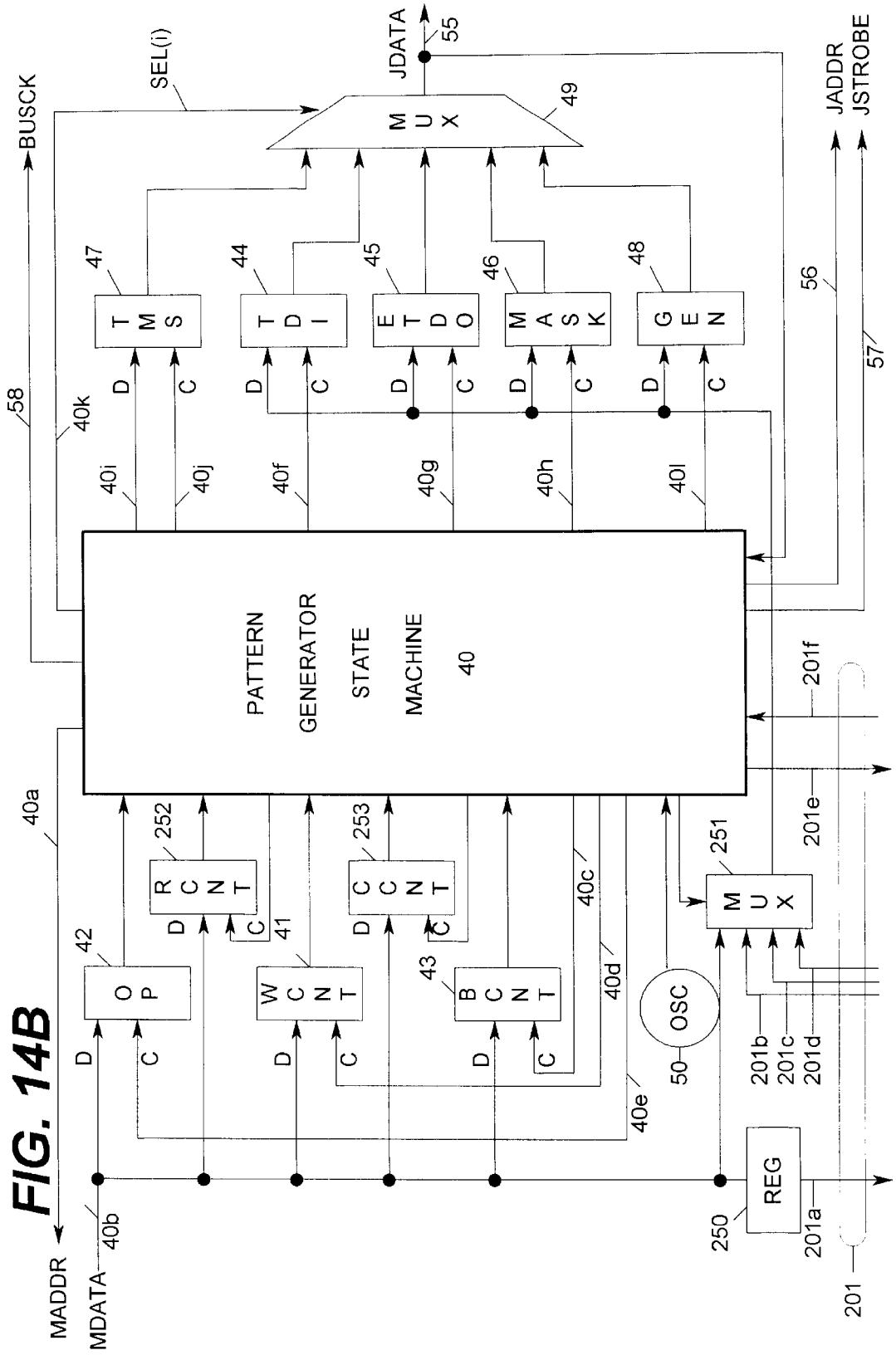
FIG. 14B shows the details of a module 12' in the FIG. 13 system which couples the algorithmic pattern generator of FIG. 14A to the remainder of the FIG. 13 system.

Also, the control unit 240 utilizes the APG interface 201 to interact with the module 12' of FIG. 13; and the details of the interface connections are shown at the top portion of FIG. 14A and the bottom left portion of FIG. 14B. FIG. 14B is similar to FIG. 5 which was previously described. But, FIG. 14B also includes four additional components 250–253 which operate with the APG interface 201, and it includes a modified state machine 40' which interacts with the added components.

Component 250 is a register which receives the APG instructions from the memory 13 in FIG. 13; and those instructions are sent on a set of conductors 201a from register 250 to the APG control circuit 240. Component 251 is a 4×1 multiplexer which receives four different inputs from four sets of conductors 201b, 201c, 201d, and 40b. The conductors 201b carry a word of the TDI test signals that come from the formatter output register ATDI; the conductors 201c carry a word of the ETDO test signals that come from the formatter output register AETDO; and the conductors 201d carry a word of the MASK signals that come from the formatter output register AMASK. Components 252 and 253 are respective counters which are described later in conjunction with FIGS. 21 and 22.

When the APG is generating the TDI, ETDO and MASK test signals, those signals are passed through the multiplexer 251 and loaded into the registers 44, 45, and 46. Conversely, when the TDI, ETDO, and MASK test signals are being read from the memory 13', those test signals are passed from the conductors 40b through the multiplexer 251 into the registers 44, 45, and 46 (as was previously described in conjunction with FIG. 5).

Two other sets of conductors 201e and 201f are also included in the APG interface 201. On the conductors 201e, various timing and control signals are sent from the state machine 40' in FIG. 14B to the APG control circuit 240 in FIG. 14A. For example, those control signals tell the control circuit 240 when the APG instructions are present on the conductors 201a.

On the conductors 201f, various timing and control signals are sent from the APG control circuit 240 of FIG. 14A to the state machine 40' of FIG. 14B. For example, those control signals tell the state machine 40' when the formatter stage 230 has generated a word of the TDI, ETDO, and MASK test signals on the conductors 201b, 201c, and 201d.

Figure 15A:
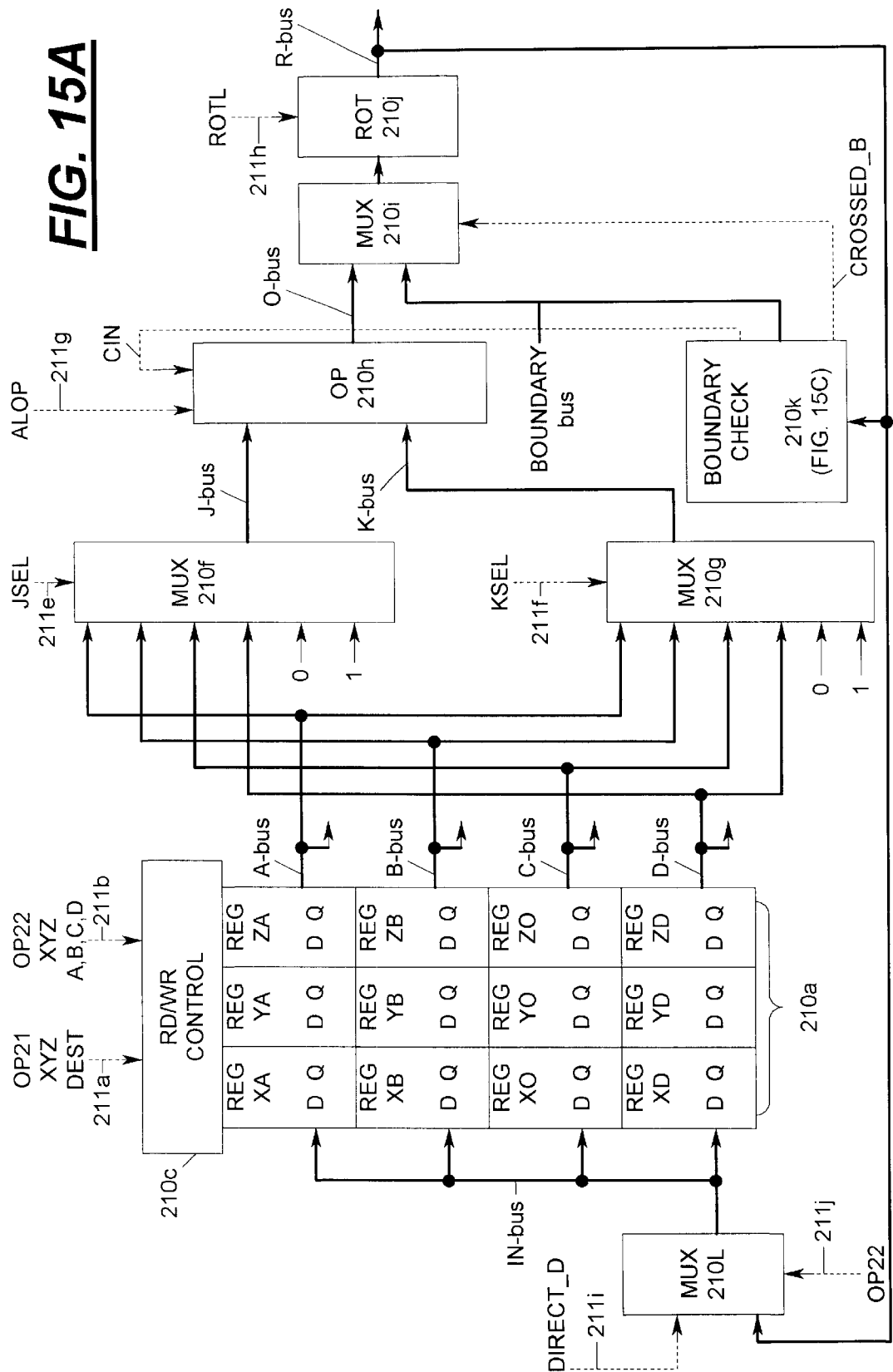
FIG. 15A is a detailed logic diagram of one portion of a first stage in the APG of FIG. 14A.
Figure 15B:
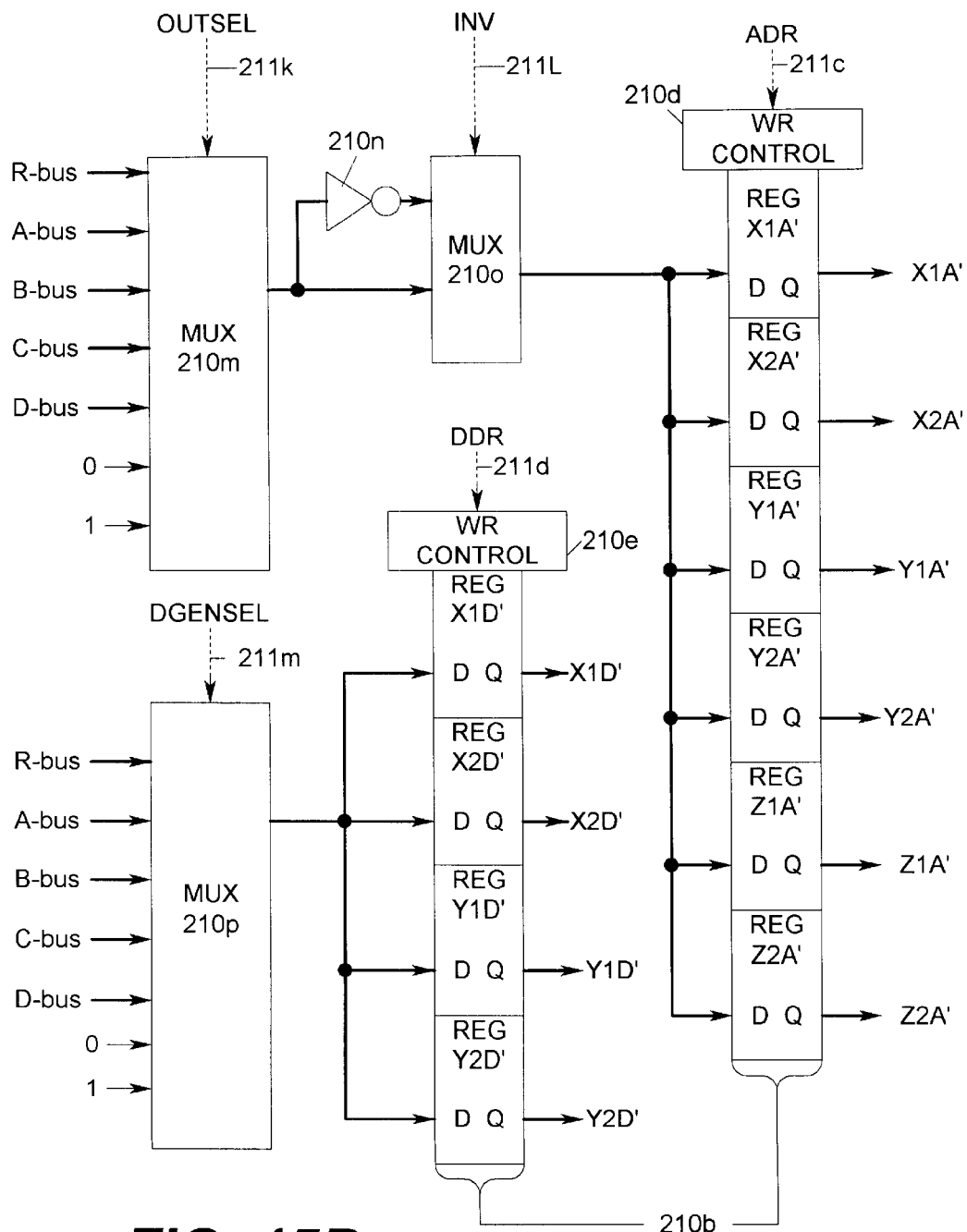
FIG. 15B is a detailed logic diagram of another portion of the first stage in the APG of FIG. 14A.

With reference now to FIGS. 15A–15B, the details of a preferred embodiment of the ALU stage 210 will be described. This particular embodiment is comprised of all of the components which are identified in FIGS. 15A–15B by reference numerals 210a thru 210p; and each of those components is described below in Table 2.

TABLE 2

| Component | Description |
|---|---|
| 210a | Component 210a, in FIG. 15A, consists of all of the input registers for the ALU stage 200. They are partitioned into the "X" set XA, XB, XC and XD; the "Y" set YA, YB, YC and YD; and the "Z" set ZA, ZB, ZC and ZD. These input registers are the same input registers that are shown in FIG. 14A. Each register has a data input D and an output Q. |
| 210b | Component 210b, in FIG. 15B, Consists of all of the output registers for the ALU stage 200. They are partitioned into a first set X1A', Y1A', Z1A', X1D', Y1D'; |

TABLE 2-continued

| Component | Description |
|---|---|
|  | and a second set X2A', Y2A', Z2A', X2D', Y2D'. These output registers are the same output registers that are shown in FIG. 14A. Each register has a data input D and an output Q. |
| 210c | Component 210c, in FIG. 15A, is a read/write control circuit for the input registers 210a. By this control circuit, the contents of the input registers 210a are selectively read onto four busses called the A-bus, B-bus, C-bus, and D-bus. Also by this control circuit, data on a bus called the IN-bus is selectively written into the input registers 210a. The particular registers which get read and written are determined by the control signals OP21, XYZ, and DEST that occur on conductors 211a in the set 211, and by control signals OP22, XYZ, and ABCD that occur on conductors 211b in the set 211. |
| 210d | Component 210d, in FIG. 15B, is a write control circuit for a subset of the output registers 210b that consists of registers X1A', X2A', Y1A', Y2A', Z1A', and Z2A'. One register is selected and written in response to control signals ADR which occur on a group of conductors 211c that are in the set 211. |
| 210e | Component 210e, in FIG. 15B, is a write control circuit a the subset of the output registers 210b that consists of registers X1D', X2D', Y1D', and Y2D'. One register is selected and written in response to control signals DDR which occur on a group of conductors 211d that are in the set 211. |
| 210f | Component 210f, in FIG. 15A, is a six-by-one multiplexer. The inputs to this multiplexer 210f are the contents of the particular set of input registers 210a which are read onto the A-bus, B-bus, C-bus and D-bus as well as a set of all 0's and a set of all 1's. This multiplexer 210f selectively passes one of its inputs to a bus, called J-bus, in response to control signals JSEL; and those signals occur on a group of conductors 211e that are in the set 211. |
| 210g | Component 210g, in FIG. 15A, is a six-by-one multiplexer. The inputs to this multiplexer 210g are the same as the inputs to multiplexer 210f. This multiplexer 21f selectively passes one of its inputs to a bus, called K-bus, in response to control signals KSEL; and those signals occur on a group of conductors 211f that are in the set 211. |
| 210h | Component 210h, in FIG. 15A, is an operational circuit which selectively performs the following operations: add with carry, add without carry, subtract with borrow, subtract without borrow, increment, decrement, exclusive or, exclusive nor, and, or, not, and no-op. Those operations are performed on the signals that are carried by the J-bus and K-bus. Each particular operation that is performed by component 210h is selected by control signals ALOP, which occur on a group of conductors 211g that are in the set 211. |
| 210i | Component 210i, in FIG. 15A, is a two-by-one multiplexer. One of the inputs to the multiplexer 210i comes from the operational circuit 210h, and the second input to the multiplexer 210i comes from a boundary check circuit 210k. Which particular input gets transferred to the multiplexer output is determined by a control signal, called CROSSED_B, that is internally generated in the boundary check circuit 210k. |

TABLE 2-continued

| Component | Description |
| --- | --- |
| 210j | Component 210j, in FIG. 15A, is a rotator circuit which selectively rotates the output from the multiplexer 210i. The result of that selective rotation is sent to a bus called the R-bus. The type of rotation that is performed by the rotator circuit 210j is selected by control signals ROTL which occur on a group of conductors 211h that are in the set 211. |
| 210k | Component 210k, in FIG. 15A, is a boundary check circuit. This circuit has an internal structure which is shown in detail in FIG. 15F; and the structure and operation of the boundary check circuit 210k is described herein in conjunction with that figure. |
| 210L | Component 210L, in FIG. 15A, is a two-by-one multiplexer. One input to the multiplexer 210L is the R-bus; and the second input to the multiplexer 210L is a group of conductors 211i that carry control signals DIRECT_D. Which particular input is passed through the multiplexer 210L to the IN-bus is determined by other control signals OP22 which occur on a group of conductors 211j. Both groups of conductors 211i and 211j are in the set 211. |
| 210m | Component 210m, in FIG. 15B, is a seven-by-one multiplexer. The inputs to this multiplexer 210m are the R-bus, A-bus, B-bus, C-bus, D-bus, a set of 0's, and a set of 1's. These inputs are selectively passed through the multiplexer 210m in response to control signals OUTSEL which occur on a group of conductors 211k that are in the set 211. |
| 210n | Component 210n, in FIG. 15B, is an inverter circuit. This component inverts all of the output signals that come from the multiplexer 210m. |
| 210o | Component 210o, in FIG. 15B, is a two-by-one multiplexer. One of the inputs to the multiplexer 210o is the output of multiplexer 210m, and the other input is the output of the inverter circuit 210n. These two inputs to the multiplexer 210o are selectively passed through the multiplexer in response to control signals INV which occur on a group of conductors 211L that are in the set 211. |
| 210p | Component 210p, in FIG. 15B, is a seven-by-one multiplexer. The inputs to this multiplexer are the same as the inputs to the multiplexer 210m. Which particular input gets passed through the multiplexer 210m is determined by control signals DGENSEL that occur on a group of conductors 211m that are in the set 211. |

In FIGS. 15A and 15B, many different control signals are shown as occurring on respective groups of conductors 211a–211m. All of those conductors are in the set 211 which come from the control unit 240. How those control signals are generated will now be described in conjunction with FIGS. 15C and 15D.

Considering first FIG. 15C, it shows one particular APG instruction 251 that is executed by all of the circuitry in FIGS. 15A and 15B. This instruction 251 is received in the APG control unit 240 of FIG. 14A via the conductors 201a; and in response, the APG control unit 240 sends various control signals on the conductors 211 to stage 210 of FIGS. 15A and 15B.

The APG instruction 251 consists of two words W0 and W1; and this particular instruction is identified by an operation code of OP21 which occurs in word W0. Word W0 of instruction 251 also includes an XYZ field which selects either the X set of registers, or the Y set of registers, or the Z set of registers from the input registers 210a in FIG. 15A. The contents of the particular set of registers that is selected are read concurrently onto the A-bus, B-bus, C-bus, and D-bus.

Word W1 of instruction 251 contains several fields which specify all of the following control signals: DGENSEL, OUTSEL, JSEL, KSEL, DEST, ALOP, INV, ROTL, CC, DDR, and ADR. Each of these control signals can have any one of several different values which are digitally encoded, and each value specifies a particular function as is shown in FIG. 15C.

For example, when the JSEL signal has a value of "2", the content of the register that is on the C-bus is passed through multiplexer 210f. Likewise, when the ALOP field has a value of "5", the operational circuit 210h increments the data that is on the J-bus by one and passes the result to the O-bus.

After, the content of the selected input registers are processed by all of the components 210f–210p, the results are selectively stored into the input registers 210a and the output registers 210b. Which particular input register stores the result from the multiplexer 210L is selected by the DEST field; which particular output register stores the result from multiplexer 210o is selected by the ADR field; and, which particular output register stores the result from the multiplexer 210p is selected by the DDR field.

Figure 15D:
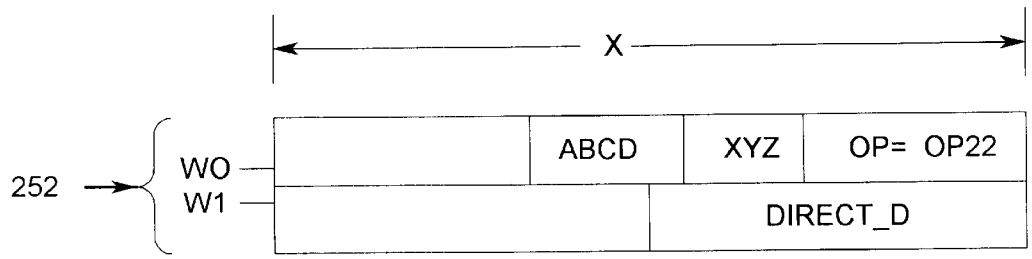
FIG. 15D shows another instruction that is executed by the first stage logic circuits of FIGS. 15A and 15B.

Turning now to FIG. 15D, it shows another APG instruction 252 which is executed by the circuitry of FIG. 15A. This particular instruction 252 consists of two words W0 and W1; and it is identified by an operation code OP22 in word W0.

By using the instruction 252, any one of the input registers 210a can be loaded with an initial value. One field XYZ in word W0 selects either the X set, or the Y set, or the Z set of input registers; and another field ABCD in word W0 selects one register in the selected set.

Word W1 includes a data field DIRECT_D that is directly written into the selected register. That data passes through the multiplexer 210L and into the selected register when instruction 252 is executed. At all other times, the multiplexer 210L passes the signals which are on the R-bus. Multiplexer 210b operates in response to the control signals OP22 on the conductors 211f which indicate when instruction 51 is being executed.

Figure 15E:
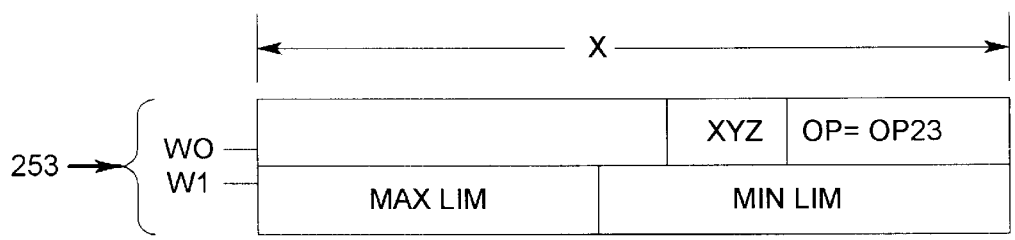
FIG. 15E shows a third instruction that is executed by the first stage logic circuits of FIGS. 15A and 15B.
Figure 15G:
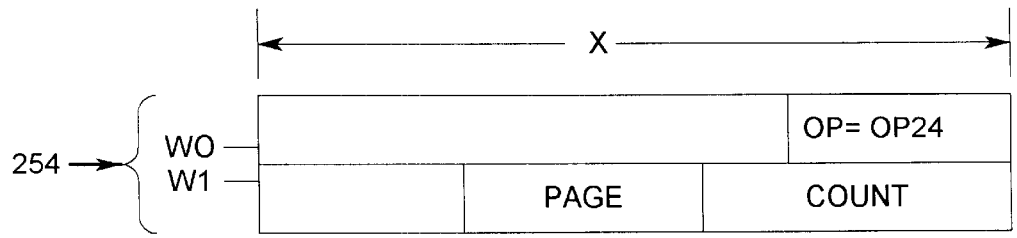
FIG. 15G shows an instruction that is executed in part by the first stage in the APG of FIG. 14A and also in part by a second stage and a third stage in the APG of FIG. 14A.
Figure 15F:
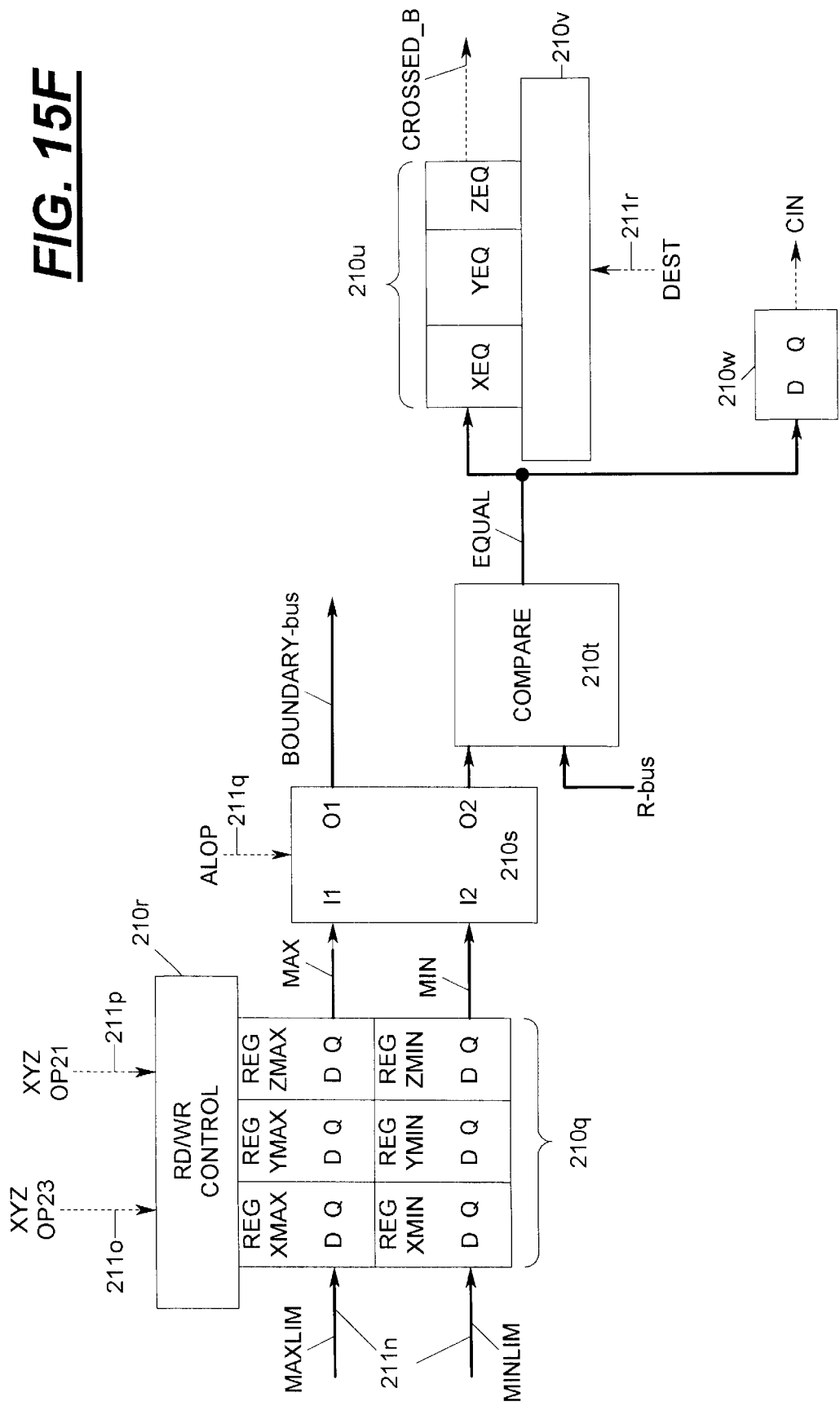
FIG. 15F shows additional details of a boundary check circuit that is included within the first stage logic circuits of FIG. 15A.

Referring next to FIGS. 15E and 15F, the details regarding the internal structure and operation of the boundary check circuit 210k will be described. Considering first FIG. 15E, it shows an APG instruction 253 that is executed in conjunction with the boundary check circuit 210k. Instruction 253 consists of two words, W0 and W1; and it is identified by an operation code OP23 in word W0.

With the instruction 253, a respective maximum limit and a respective minimum limit is established for each set of the input registers 210a. One field XYZ in word W0 selects either the X set of input registers, or the Y set of input registers, or the Z set of input registers. For that selected set, a field MAXLIM in word W1 specifies the maximum limit and a field MINLIM establishes the minimum limit. These limits are stored within the boundary check circuit 210k.

After three sets of limits have been stored in the boundary check circuit 210k, that circuit compares the limits to the signals that are generated on the R-bus during the execution of each instruction 251. If one particular instruction 251 selects the x set of registers via the DEST field and increases their content via an operation that is specified by the ALOP field, then the result on the R-bus is compared by the boundary check circuit 210k to the maximum limit that was established for the X set of registers. If that maximum limit equals the signals on the R bus, then the boundary check circuit will pass the minimum limit for the X set of registers through multiplexer 210i when the next instruction 251 again selects the X set of registers.

Conversely, when one particular instruction 251 selects the X set of registers via the DEST field and decreases their content via an operation that is specified in the ALOP field, then the result on the R-bus is compared to the minimum limit that was established for the X set of registers. If that minimum limit and the signals on the R-bus are equal, then the boundary check circuit 210k will pass the maximum limit for the X set of registers through the multiplexer 210i when the next instruction 251 again selects the X set of registers.

Similarly, when one particular instruction 251 selects the Y set (or the Z set) of registers via the DEST field and increases their content via the ALOP field, then the result on the R-bus is compared to the maximum limit that was established for the Y set (or the Z set) of registers. If that maximum limit equals the signals on the R-bus, then the boundary check circuit will pass the minimum limit for the Y set (or the Z set) of registers through multiplexer 210i when the next instruction 251 again selects the Y set (or the Z set) of registers.

Conversely, when one particular instruction 251 selects the Y set (or the Z set) of registers via the DEST field and decreases their content via the ALOP field, then the result on the R-bus is compared to the minimum limit that was established for the Y set (or the Z set) of registers. If that minimum limit and the signals on the R-bus are equal, then the boundary check circuit 210k will pass the maximum limit for the Y set (or the Z set) of registers through the multiplexer 210i when the next instruction 251 again selects the Y set (or the Z set) of registers.

In order to perform the above-described operations within the boundary check circuit 210k, that circuit includes all of the components that are shown in FIG. 15F. Those components are identified by reference numerals 210q thru 210w; and each of those components is described below in Table 3.

TABLE 3

| Component | Description |
|---|---|
| 210q | Component 210q, in FIG. 15F, consists of three pairs of registers which are the XMAX register and the XMIN register, the YMAX register and the YMIN register, and the ZMAX register and the ZMIN register. Each register has a data input D and an output Q. The MAXLIM field from instruction 253 is selectively stored in either the XMAX register or the YMAX register or the ZMAX register, and the MINLIM field from instruction 253 is selectively stored in either the XMIN register or the YMIN register or the ZMIN register. The MAXLIM field and the MINLIM field are sent to the registers 210q on a group of conductors 211n that are in the set 211. |
| 210r | Component 210r, in FIG. 15F, is a read/write control circuit for the registers 210q. To select one particular pair of registers to write, circuit 210r receives the XYZ field and OP23 field from instruction 253 on a group of conductors 211o that are in the set 211. To select one particular pair if registers to read, circuit 211r receives the XYZ field from instruction 251 on a group of conductors 211p that are in the set 211. |
| 210s | Component 210s, in FIG. 15F, is a circuit which has a pair of inputs I1 and I2, an a pair of outputs O1 and O2. The inputs I1 and I2 respectively receive the maximum and minimum limits that are read from the registers 210q. If the ALOP field of instruction 251 specifies an add or increment operation, then the limits on the inputs I1 and I2 are respectively passed to the O1 and O2 outputs. If the ALOP field specifies a subtract or decrement operation, then the limit on input I1 is passed to output O2, and the limit on input I2 is passed to output O1. The ALOP field is sent to circuit 210s on a group of conductors 211q that are in the set 211. |
| 210t | Component 210t, in FIG. 15F, is a compare circuit which compares the signals that are on the R-bus to the signals that are passed to the O2 output of component 210s. If those compared signals are the same, then circuit 210t generates the EQUAL signal as an output. |
| 210u | Component 210u, in FIG. 15F, is a set of three flip-flops that are called XEQ, YEQ, and ZEQ. Each flip-flop is read and written by another component 210v. |
| 210v | Component 210v, in FIG. 15F, is a read/write control circuit for the flip-flops 210u. The XEQ flip-flop is read when the field DEST in instruction 251 selects the X set of registers; the YEQ flip-flop is read when the DEST field selects the Y set of registers; and the ZEQ flip-flop is read when the DEST field selects the Z set of registers. The output of the flip-flop that is read becomes the control signal CROSSED_B. Also, each time one of the flip-flops 210u is read by instruction 251, that particular flip-flop is either set or reset at the end of the execution of the instruction. If the EQUAL signal is true, then the flip-flop is set; otherwise it is reset. The DEST field is received on the group of conductors 211R in the set 211. |
| 210w | Component 210w, in FIG. 15F, is a flip-flop which generates the carry-in signal (CIN) for the operational circuit 210h in FIG. 15A. This flip-flop is set or reset each time the instruction 251 is executed. Flip-flop 210w is set if the EQUAL signal from the comparator 210t is true at the end of the execution of the instruction 251; otherwise, flip-flop 210w is reset. |

Now, consider an example which illustrates how the circuitry and instructions in FIGS. 15A–15F can be used as the first of three stages which together generate the TDI, ETDO and MASK signals that test an integrated circuit chip. In this example, suppose that the chip to be tested is a memory chip which contains four rectangular arrays of memory cells; and, suppose further that the cells are arranged, within each array, in 1024 rows and 64 columns.

Each memory cell, in the above example, has a "virtual" address which is given by a "virtual" row number and a "virtual" column number. Why these rows and column numbers are "virtual" numbers will be explained shortly.

For the first array, the virtual row numbers are VR0 thru VR1023, and the virtual column numbers are VC0 thru VC63. For the second array, the virtual row numbers are VR0 thru VR1023, and the virtual column numbers are VC64 thru VC127. For the third array, the virtual row numbers are VR1024 thru VR2047, and the virtual column numbers are VC0 thru V63. For the fourth array, the virtual row numbers are VR1024 thru VR2047, and the virtual column numbers are VC64 thru VC127.

In each of the four arrays, the virtual row numbers increase consecutively from the top of the array to the bottom of the array, and the virtual column numbers increase consecutively from the left side of the array to the right side of the array. Thus for example, the memory cell which is in the top left corner of the first array is in the virtual row VR0 and the virtual column VC0; and the memory cell that is at the bottom left corner of first array is in the virtual row VR1023 and the virtual column VC63. Similarly, the memory cell that is at the top left corner of the fourth array is in the virtual row VR1024 and the virtual column VC64, and the memory cell that is in the bottom right corner of the fourth array is in the virtual row VR2047 and the virtual column VC127.

Suppose now that the TDI, ETDO, and MASK test signals are to be generated for each of the memory cells in the following order. First, test signals are to be sequentially generated for each one of the memory cells that are in row VR0, beginning with the memory cell in row VR0 at column VC0 and ending with the memory cell in row VR0 at column VC63. Then, this sequence is to be sequentially repeated for each of the remaining rows VR1 thru VR1023 in the first array. Thereafter, the above sequence is to be repeated for each cell in the second array; then the above sequence is to be repeated for each cell in the third array; and then the sequence is to be repeated for each cell in the fourth array.

By utilizing the circuitry and instructions of FIGS. 15A–15F, the virtual addresses of the memory cells can be sequentially generated in the order in which the cells are to be tested. For example, the X set of registers can be used to generate the number of the virtual row for the cell that is being tested, the Y set of registers can be used to generate the number of the virtual column for the cell that is being tested; and the Z set of registers can be used to generate the number of the array that is being tested.

To sequentially generate the above addresses in the proper order, a sequence of the instructions 251 can be performed in a program loop. Also, to initially set the starting values for the above addresses, the instruction 252 can be performed. Further, to change the address of a cell that is generated in the program loop, automatically, from the end of one row to the beginning of the next consecutive row, and from the end of one column to the beginning of the next consecutive column, the instruction 253 can be used.

Each time a virtual column address and a virtual row address is generated, those addresses are stored in the output registers 210b. For example, the virtual row address can be stored in register X1A' and the virtual column address can be stored in register Y1A'. Further, if certain data needs to be used with each virtual row address and each virtual column address, then that data can also be generated in the program loop by the instructions 251 and 252; and that data can be stored in the output registers X1D' and Y1D'.

Also, for certain types of memory testing, two separate sequences of the virtual addresses and their corresponding data may need to be generated concurrently. For example, the first sequence of the virtual addresses could move from cell to cell in the order that was described above; while the second sequence of virtual addresses could move from cell to cell in the opposite order. Thus, the second sequence would start with the cell that is in the virtual row and virtual column with the highest number and end with the cell that is in the virtual row and the virtual column with the smallest number.

These two separate sequences of the virtual addresses can be generated concurrently by first and second program loops that use the instructions 251, 252, and 253. Each time the first program loop generates a virtual address and its corresponding data, they are stored in the first set of output registers X1A', Y1A', Z1A', X1D', and Y1D'; and each time the second program loop generates a virtual address with its corresponding data, they are stored in the second set of output registers X2A', Y2A', Z2A', X2D', and Y2D'.

Throughout the above description, the terms "virtual" row and "virtual" column were used because in an actual physical memory chip that is tested, the rows and columns of the memory cells may not be consecutively numbered. For example, in an actual memory chip, the row which has address 10 may lie adjacent to the row which has address 20. Likewise, in an actual memory chip, the column which has address 100 may lie adjacent to the column which has address 110.

Accordingly, to accommodate such differences, the ALU stage 210 preferably generates virtual addresses and data for a virtual memory (i.e., a hypothetical memory) in which adjacent rows and columns have consecutive addresses; and, the scrambler stage 220 is provided to convert the virtual addresses and data to physical addresses and data for an actual physical memory chip that is to be tested. To initiate the various operations that are performed by the scrambler stage 220, another APG instruction 254 which is shown in FIG. 15G is executed. This instruction 254 consists of two words W0 and W1; and it is identified by an operation code OP24 in word W0.

Each execution of instruction 254 indicates that the virtual addresses and corresponding data in the output registers of the first stage 210 are ready to be operated on by the second stage 220. Thus, when those virtual addresses and corresponding data are generated in a program loop as described above, the APG instruction 254 is executed each time one cycle of the program loop is completed. Word W1 of instruction 254 also contains two additional fields which are called COUNT and PAGE as shown in FIG. 15G, but those fields are only used by the third stage of the APG. So the COUNT and PAGE fields are described later in conjunction with the third stage.

Figure 16A:
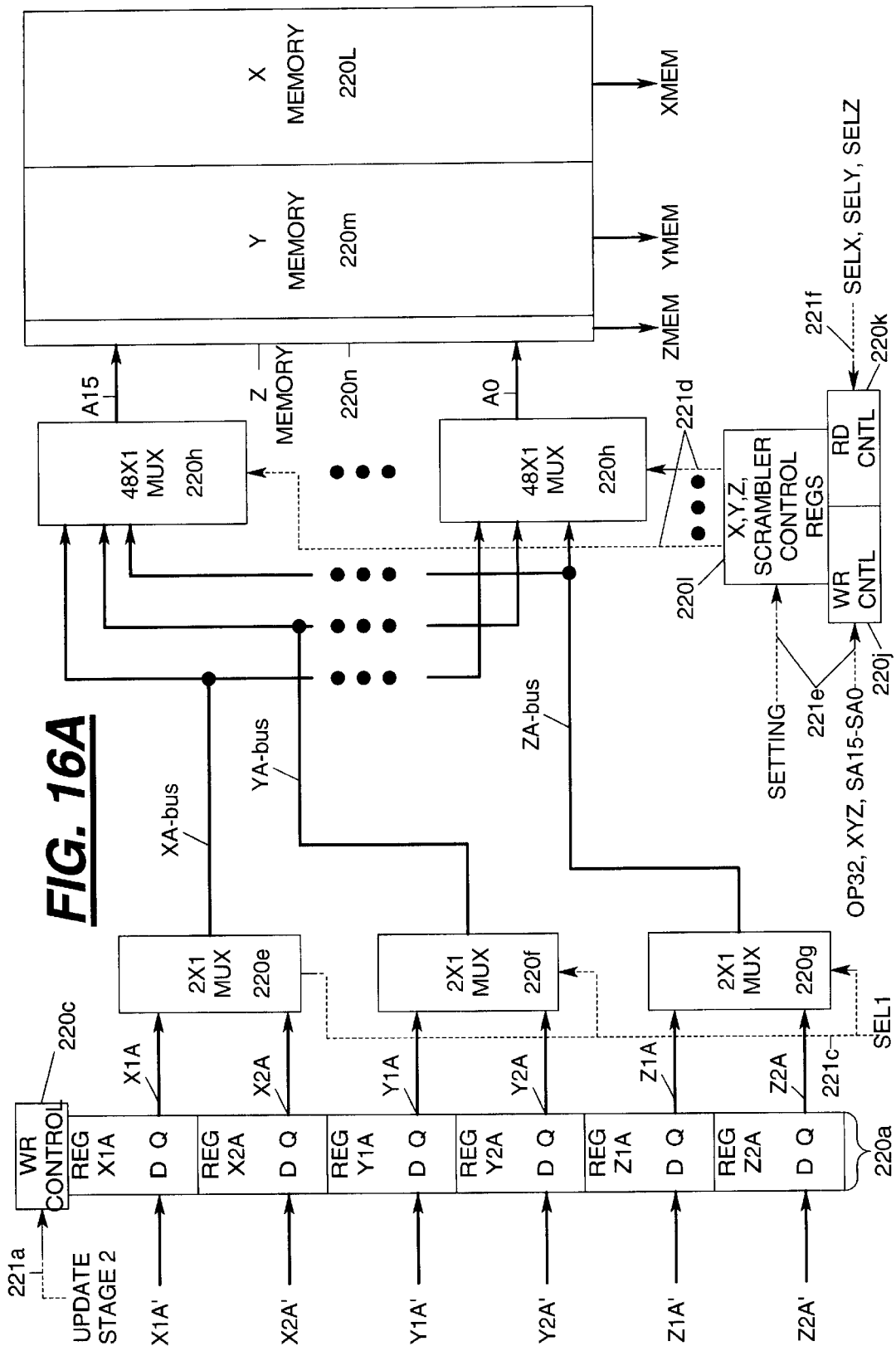
FIG. 16A is a detailed logic diagram of a portion of the second stage in the APG of FIG. 14A.
Figure 16B:
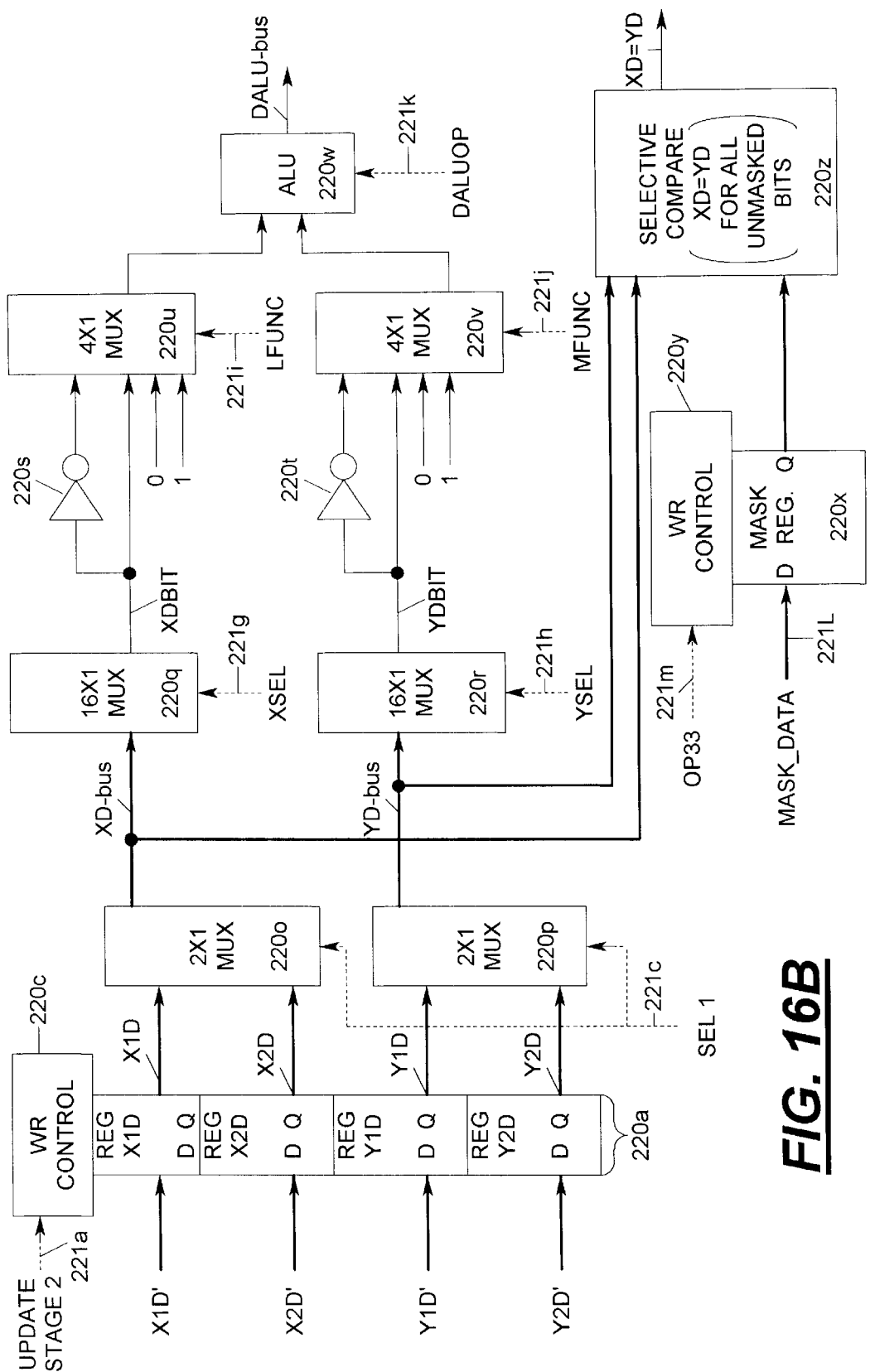
FIG. 16B is a detailed logic diagram of another portion of the second stage in the APG of FIG. 14A.
Figure 16C:
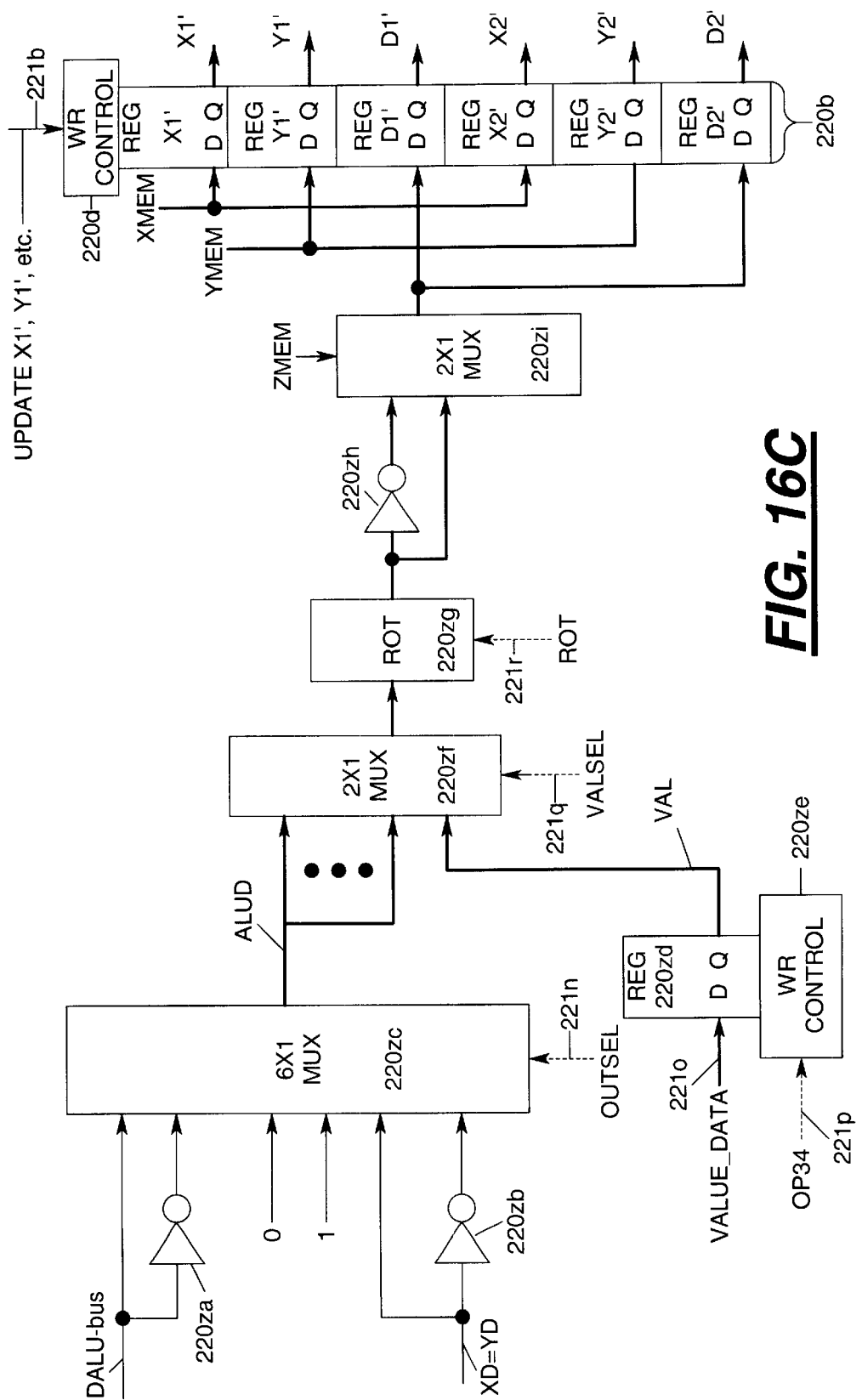
FIG. 16C is a detailed logic diagram of still another portion of the second stage in the APG of FIG. 14A.

One preferred embodiment of the second stage 220 is shown in detail in FIGS. 16A–16C. This particular embodiment is comprised of all the components that are identified in the FIGS. 16A–16C by reference numerals 220a thru 220zj; and each of those components is described below in Table 4.

TABLE 4

| Component | Description |
|---|---|
| 220a | Component 220a is shown partly in FIG. 16A and partly in FIG. 16B, and it consists of all of the input registers for the scrambler stage 220. These input registers are partitioned into the first set which consists of registers X1A, Y1A, Z1A, X1D, and Y1D; and the second set which consists of registers X2A, Y2A, Z2A, X2D, and Y2D. These input registers are |

TABLE 4-continued

| Component | Description |
|---|---|
| | the same input registers that are shown in FIG. 14A. Each registers has a data input D and an output Q. |
| 220b | Component 220b, in FIG. 16C, consists of all of the output registers of the scrambler stage 220. Those output registers are partitioned into the first set X1', Y1', and D1'; and the second set X2', Y2', and D2'. These output registers are the same output registers that are show in FIG. 14A. Each register has a data input D and an output Q. |
| 220c | Component 220c, in FIGS. 16A and 16B, is a write control circuit for all of the input registers 220a. This write control circuit loads all of the input registers 220a concurrently, with the content of corresponding output registers 210b from the first stage 210. This operation occurs in response to a control signal UPDATE_STAGE_2, which is on a conductor 221a that is in the set 221. |
| 220d | Component 220d, in FIG. 16C, is a write control circuit for all of the output registers 220b. By this write control circuit, each output register is selectively loaded with the signals that are on its data input D. Register X1' gets loaded in response to control signals UPDATEX1'; register X2' gets loaded in response to control signals UPDATEX2'; etc. These signals occur on a group of conductors 221b that are in the set 221. |
| 220e | Component 220e in FIG. 16A, is a two-by-one multiplexer. One of the inputs to the multiplexer 220e is the address in register X1A, and the other input is the address in register X2A. The X1A input is passed to the XA-bus when a control signal SEL1 is true; otherwise, the X2A input is passed to the X2A-bus. Control signal SEL1 occurs on conductor 221c which is in the set 221. |
| 220f | Component 220f, in FIG. 16A, is a two-by-one multiplexer. One of the inputs to the multiplexer 220f is the address in register Y1A, and the other input is the address in register Y2A. The Y1A input is passed to the YA-bus when the control signal SEL1 is true; otherwise, the Y2A input is passed to the YA-bus. |
| 220g | Component 220g, in FIG. 16A, is a two-by-one multiplexer. One of the inputs to the multiplexer 220g is the address in register Z1A, and the other input is the address in register Z2A. The Z1A input is passed to the ZA-bus when the control signal SEL1 is true; otherwise, the Z2A input is passed to the ZA-bus. |
| 220h | Component 220h, in FIG. 16A, is a forty-eight-by-one multiplexer that is repeated sixteen times. Each instance of this multiplexer generates a respective one of the memory address bits A0 thru A15. For simplicity, FIG. 16A shows only the first and last instance of these multiplexers; and the remaining multiplexers are represented by a set of three dots Each multiplexer 220h receives, in parallel, all of the input address bits that are on the XA-bus, YA-bus, and ZA-bus; and each multiplexer selectively passes a respective one of the input address bits to thereby generate a single memory address bit. |
| 220i | Component 220i, in FIG. 16A, is three sets of control registers that are called the X SCRAMBLER CONTROL REGS, the Y SCRAMBLER CONTROL REGS, and the Z SCRAMBLER CONTROL REGS. Each set |

TABLE 4-continued

| Component | Description |
|---|---|
| | includes sixteen registers, one for each of the sixteen multiplexers 220h. The content of one set of registers is selected and sent to the multiplexers 220h on conductors 221d; and those signals direct each multiplexer to pass a respective input to its output. |
| 220j | Component 220j, in FIG. 16A, is a write control circuit for the XYZ SCRAMBLER CONTROL REGISTERS 220i. By this circuit, a single control register in one of the three sets is selected. This occurs in response to the control signals OP33, XYZ, SA0–SA15. Then the selected register is written with a data field that is called the SETTING. All of these signals occur on a group of conductors 221e that are in the set 221. |
| 220k | Component 220k, in FIG. 16A, is a read control circuit for the XYZ SCRAMBLER CONTROL REGISTERS 220i. The particular set of registers that is read onto the conductors 221d is selected by three control signals SELX, SELY, AND SELZ that occur on a group of conductors 221f that are in the set 221. |
| 220L | Component 220L, in FIG. 16A, is a Random Access Memory that stores 64K words, and each word has a separate address. One 16-bit word is read in response to the address A15–A0, and that word occurs on an output that is called XMEM. This output XMEM goes to the output registers X1' and X2' in FIG. 16C. |
| 220m | Component 220m, in FIG. 16A, is a Random Access Memory that stores 64K words, and each word has a separate address. One 16-bit word is read in response to the address A15–A0, and that word occurs on an output that is called YMEM. This output YMEM goes to the output registers Y1' and Y2' in FIG. 16C. |
| 220n | Component 220n, in FIG. 16A, is a Random Access Memory that stores 64K bits, and each bit has a separate address. One bit word is read in response to the address A15–A0, and that bit occurs on an output that is called ZMEM. This output ZMEM goes to a multiplexer 220zi in FIG. 16C. |
| 220o | Component 220o, in FIG. 16B, is a two-by-one multiplexer. One input to this multiplexer is the content of register X1D, and the other input is the content of register X2D. The multiplexer 220 passes the X1D input to the XD-bus when the control signal SEL1 is true; and otherwise, it passes the X2D input to the XD-bus. |
| 220p | Component 220p, in FIG. 16B, is a two-by-one multiplexer. One input to this multiplexer is the content of register Y1D, and the other input is the content of register Y2D. The multiplexer 220 passes the Y1D input to the YD-bus when the control signal SEL1 is true; and otherwise, it passes the Y2D input to the YD-bus. |
| 220q | Component 220q, in FIG. 163, is a sixteen-by-one multiplexer. This multiplexer receives the XD-bus as an input, and it passes one bit of that bus to its output. The particular bit that is passed is selected by the control signals XSEL which occur on conductors 221g that are in the set 221. |
| 220r | Component 220r, in FIG. 16B, is a sixteen-by-one multiplexer. This multiplexer receives the YD-bus as an input, and it passes one bit of that bus to its output. The particular bit that is passed is selected by the control signals YSEL which |

TABLE 4-continued

| Component | Description |
|---|---|
| | occur on conductors 221h that are in the set 221. |
| 220s | Component 220s, in FIG. 16B, is an inverter. It receives the output of the multiplexer 220q, and it inverts that signal as an output. |
| 220t | Component 220t, in FIG. 16B, is an inverter. It receives the output of the multiplexer 220r, and it inverts that signal as an output. |
| 220u | Component 220u, in FIG. 16B, is four-by-one multiplexer. This multiplexer selectively passes one of its four inputs, to its output, in response to control signals LFUNC. Those control signals occur on conductors 221i which are in the set 221. |
| 220v | Component 220v, in FIG. 16B, is four-by-one multiplexer. This multiplexer selectively passes one of its four inputs, to its output, in response to control signals MFUNC. Those control signals occur on conductors 221j which are in the set 221. |
| 220w | Component 220w, in FIG. 16B, is an arithmetic circuit which performs selectable operations on a pair of inputs which come from the multiplexers 220u and 220v. The particular operation which is performed by component 220w is selected by control signals DALUOP which occur on the conductors 221k that are in the set 221. The result of that operation occurs on a DALU-bus. |
| 220x | Component 220x, in FIG. 16B, is a MASK register which has a data input D and an output Q. The data that is selectively written into this register is called MASK-DATA, and it occurs on the conductors 220L which are in the set 221. |
| 220y | Component 220y, in FIG. 16B, is a write control circuit for the MASK register 220x. This circuit 220y writes the MASK_DATA into the register 220x in response to control signals OP32 on conductors 221m that are in the set 221. |
| 220z | Component 220z, in FIG. 16B, is a selective compare circuit. As an input, circuit 220z receives the signals that are on the XD-bus, the YD-bus, and the signals that are stored in the MASK register 220x. Then, for each bit in the MASK register which is a "0", circuit 220z compares the corresponding bits which are on the XD-bus and the YD-bus. If all such comparisons are equal, circuit 220z generates an output signal XD=YD. |
| 220za | Component 220za, in FIG. 16C, is an inverter. It receives the signals on the DALU bus, and it inverts those signals as an output. |
| 220zb | Component 220zb, in FIG. 16C, is an inverter. It receives the signal XD=YD, and it inverts that signal as an output. |
| 220zc | Component 220zc, in FIG. 16C, is a six-by-one multiplexer. This multiplexer selectively passes one of its six inputs, to its output, in response to control signals OUTSEL. Those control signals occur on conductors 221n which are in the set 221. |
| 220zd | Component 220zd, in FIG. 16C, is a register which has a data input D and output Q. Signals called VALUE-DATA are selectively written into this register, and they occur on conductors 221o which are in the set 221. |
| 220ze | Component 220ze, in FIG. 16C, is write control circuit for the register 220zd. This circuit writes the VALUE-DATA signals into register 220zd in response to a control signal OP34 that occurs on conductor 221p in the set 221. |
| 220zf | Component 220zf, in FIG. 16C, is a two-by-one multiplexer. One input to this multiplexer is the output from the six-by-one multiplexer 220zc, and the other input is the content of register 220zd. Which particular input get passed to the output of the multiplexer 220zf is determined by a control signal VALSEL that occurs on conductor 221q in the set 221. |
| 220zg | Component 220zg, in FIG. 16C, is a rotator circuit which selectively rotates the output from the multiplexer 220zf. The type of rotation that is performed by the rotator circuit 220zg is selected by control signals ROT which occur on a group of conductors 221r in the set 221. |
| 220zh | Component 220zh, in FIG. 16C, is an inverter. It receives the output signals from the rotator circuit 220zg, and it generates the inverse of those signals. |
| 220zi | Component 220zi, in FIG. 16C, is a two-by-one multiplexer. One input to this multiplexer is the output of the rotator circuit 220zg, and the other input is the inverted output of the rotator circuit which comes from the inverter 220zh. This multiplexer passes the inverted input when a control signal ZMEM is true; and otherwise, it passes the non-inverted input. |

In FIGS. 16A, 16B and 16C, many different control signals are shown as occurring on respective groups of conductors 221a–221m. All of those conductors are in the set 221 which come from the control unit 240. How those control signals are generated will now be described in conjunction with FIGS. 16D–16G.

Considering first FIG. 16D, it shows one particular APG instruction 261 that is executed by the circuitry of FIGS. 16A–16C. This instruction 261 is received in the APG control unit 240 of FIG. 14A via the conductors 201a; and in response, the APG control unit 240 sends various control signals on the conductors 221 to stage 220 of FIGS. 16A–16C.

Instruction 261 consists of two words W0 and W1. Word W0 includes an operation code of OP31 which identifies the instruction. Word W1 contains several fields, and they specify all of the following control signals: XSEL, YSEL, LFUNC, MFUNC, DALUOP, OUTSEL, VALSEL, and ROT. Each of these control signals can have any one of several different values which are digitally encoded, and each value specifies a particular function as is shown in FIG. 16D.

For example, when the field XSEL has a value of "0"1, the multiplexer 220q passes the signal on bit-0 of the XD-bus to its output; when the field XSEL has a value of "1", the multiplexer 220q passes the signal on bit-1 of the XD-bus to its output; etc. As another example, when the field LFUNC has a value of "1", the multiplexer 220u passes the signal from the inverter 220s to its output. As another example, when the field DALUOP has a value of "5", the circuit 220w performs an EXCLUSIVE-NOR operation on its inputs and generates the result on the DALU-bus. As still another example, when the field OUTSEL has a value of "3", then the multiplexer 220zc passes the inverse of the signal XD=YD to its output.

Figure 16E:
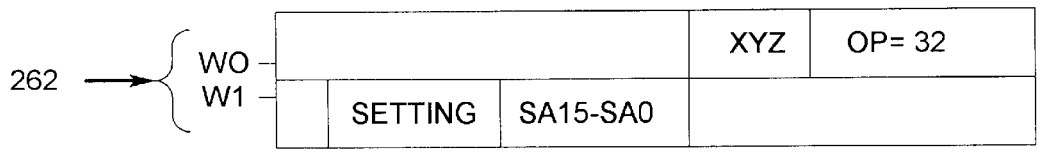
FIG. 16E shows another instruction that is executed by the second stage logic circuits of FIGS. 16C–16E.

Referring now to FIG. 16E, it shows another APG instruction 262 which is executed by the circuitry of FIG. 16A. This particular instruction consists of two words W0 and W1, and it is identified by an operation code of OP32 which occurs in Word W0. That word also includes an XYZ field which selects either the X set of SCRAMBLER CONTROL REGISTERS or the Y set of SCRAMBLER CONTROL REGISTERS of the Z set of SCRAMBLER CONTROL REGISTERS that are in component 221 of FIG. 16A.

Word W1 of instruction 262 contains two fields which are called SETTING and SA15–SA0. The field SA15–SA0 selects one of the sixteen registers in the set which is selected by the XYZ field. That one selected register is written by the write control circuit 220j of FIG. 16A with the SETTING field. Thus, by utilizing instruction 262, each one of the XYZ SCRAMBLER CONTROL REGISTERS can be written with any desired setting.

Figure 16F:
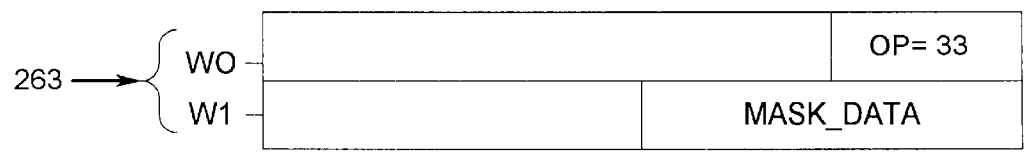
FIG. 16F shows still another instruction that is executed by the second stage logic circuits of FIGS. 16A–16C.

Turning now to FIG. 16F, it shows still another APG instruction 263 which is executed by a circuitry of FIG. 16B. This particular instruction consists of two words W0 and W1; and it is identified by an operation code OP33 which occurs in word W0. Word W1 of instruction 263 contains a field which is called MASK_DATA. When instruction 263 is executed, the MASK_DATA field is written into register 220x of FIG. 16B. That writing is performed by the write control circuit 220y which operates in response to the control signals OP33 on the conductors 221j.

Figure 16G:
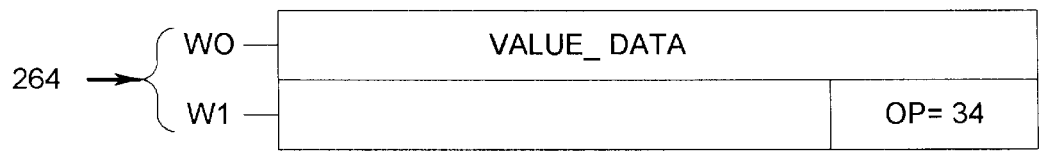
FIG. 16G shows yet another instruction that is executed by the second stage logic circuits of FIG. 16A–16C.

Referring next to FIG. 16G, it shows another APG instruction 264 which is executed by the circuitry of FIG. 16C. This APG instruction consists of two words W0 and W1; and it is identified by an operation code OP34 which occurs in word W0. Word W1 contains a field called VALUE_DATA. When instruction 264 is executed, the field VALUE_DATA is stored in register 220zd of FIG. 16C. That writing is performed by the write control circuit 220ze in response to the control signals OP34 which occur on the conductors 221m.

Now, consider an example which illustrates how the circuitry and instructions of FIGS. 16A–16G can be used, as the second stage of the three-stage pipeline, to generate the TDI, ETDO and MASK signals that test an integrated circuit chip. In this example, suppose that the chip to be tested is the same memory chip that was previously described in conjunction with the first stage 210. That chip included four rectangular arrays of memory cells, and the cells of each array were arranged in 1,024 rows and 64 columns.

In the above example, the first stage 210 generated one or two separate sequences of virtual addresses and corresponding data; and those addresses and data were sequentially stored in the output registers 210b. Now at certain times, the contents of the output registers 210b of the first stage are transferred to the input registers 220a of the second stage. Then, the virtual addresses and data that are in the second stage input registers 220a get processed by the circuitry of FIGS. 16A–16C.

The above processing in the second stage occurs in six consecutive time intervals $\Delta t1$–$\Delta t6$. First, during time interval $\Delta t1$, the contents of three input registers X1A, Y1A, and Z1A are operated on by the circuitry of FIG. 16A; and that generates an output which is stored in register X1'. Next, during time interval $\Delta t2$, the contents of three input registers X2A, Y2A, and Z2A are operated on by the circuitry in FIG. 16A; and that generates an output which is stored in register X2'. Then during time interval $\Delta t3$, the contents of three registers X1A, Y1A, and Z1A are operated on by the circuitry in FIG. 16A; and that generates an output which is stored in register Y1'. Then, during time interval $\Delta t4$, the content of three input registers X2A, Y2A, and Z2A are operated on by the circuitry of FIG. 16A; and that generates an output which is stored in register Y2'.

Next, during time interval $\Delta t5$, the content of five input registers X1A, Y1A, Z1A, X1D, and Y1D are operated on by all of the circuitry in FIGS. 16A–16C; and that generates an output which is stored in register D1'. Lastly, during time interval $\Delta t6$, the content of five input registers X2A, Y2A, Z2A, X2D, and Y2D are operated on by all of circuitry in FIGS. 16A–16C; and that generates an output which is stored in register D2'.

Throughout three of the time intervals $\Delta t1$, $\Delta t3$, and $\Delta t5$, the two-by-one multiplexers 220e, 220f, 220g, 220o, and 220p respectively pass their inputs X1A, Y1A, Z1A, X1D, and Y1D. Conversely, throughout the other three time intervals $\Delta t2$, $\Delta t4$, and $\Delta t6$, those multiplexers respectively pass their inputs X2A, Y2A, Z2A, X2D, and Y2D.

Also, throughout two of the time intervals $\Delta t1$ and $\Delta t2$, the read control circuit 220k sends the content of the X SCRAMBLER CONTROL REGISTERS on the conductors 221d to the multiplexers 220h. During the time intervals $\Delta t3$ and $\Delta t4$, the read control circuit 220k sends the content of the Y SCRAMBLER CONTROL REGISTER on the conductors 220d to the multiplexers 220h. And, during the time intervals $\Delta t5$ and $\Delta t6$, the read control circuit 220k sends the content of the Z SCRAMBLER CONTROL REGISTERS on the conductors 221d to the multiplexers 220h.

Due to the above processing within the second stage 220, all of the virtual addresses that are in the input registers X1A, X2A, Y1A, and Y2A get converted to corresponding physical addresses. For example, to convert the virtual address in register X1A, the sixteen multiplexers 220h each select a particular bit on the XA-bus or YA-bus or and ZA-bus; those selected bits form an address which reads a word in the X memory 220L; and that word gets stored in register X1' as the physical address. Similarly, to convert the virtual address in register Y1A, the sixteen multiplexers 220h each select a bit from the XA-bus or YA-bus or ZA-bus; those selected bits form an address which reads a word in the Y memory 220M; and that word gets stored in register Y1' as the physical address.

Also due to the above processing within the second stage 220, the data from the input registers X1D and Y1D gets converted to different data which is then stored in the output register D1. Likewise, the data from the input registers X2D and Y2D gets converted to different data which is then stored in the output register D2'. During this data conversion process, the circuits in FIGS. 16B and 16C perform various operations that are specified by the control signals XSEL, YSEL, LFUNC, MFUNC, DALUOP, OUTSEL, VALSEL, and ROT. Those control signals are set by the instruction 261 of FIG. 16D that was last executed, and they are held in registers (not shown) which are inside the control unit 240 of FIG. 14A.

After all of the processing in the six consecutive time intervals $\Delta t1$–$\Delta t6$ is completed by the second stage 220, then the second stage output registers 220b are ready to be transferred to the input registers 230a of the third stage 230 (i.e., the formatter stage). When that transfer occurs, the formatter stage will perform additional processing on the content of its input registers which thereby generates the signals ATDI, AETDO, and AMASK that test the integrated circuit chip.

Figure 17A:
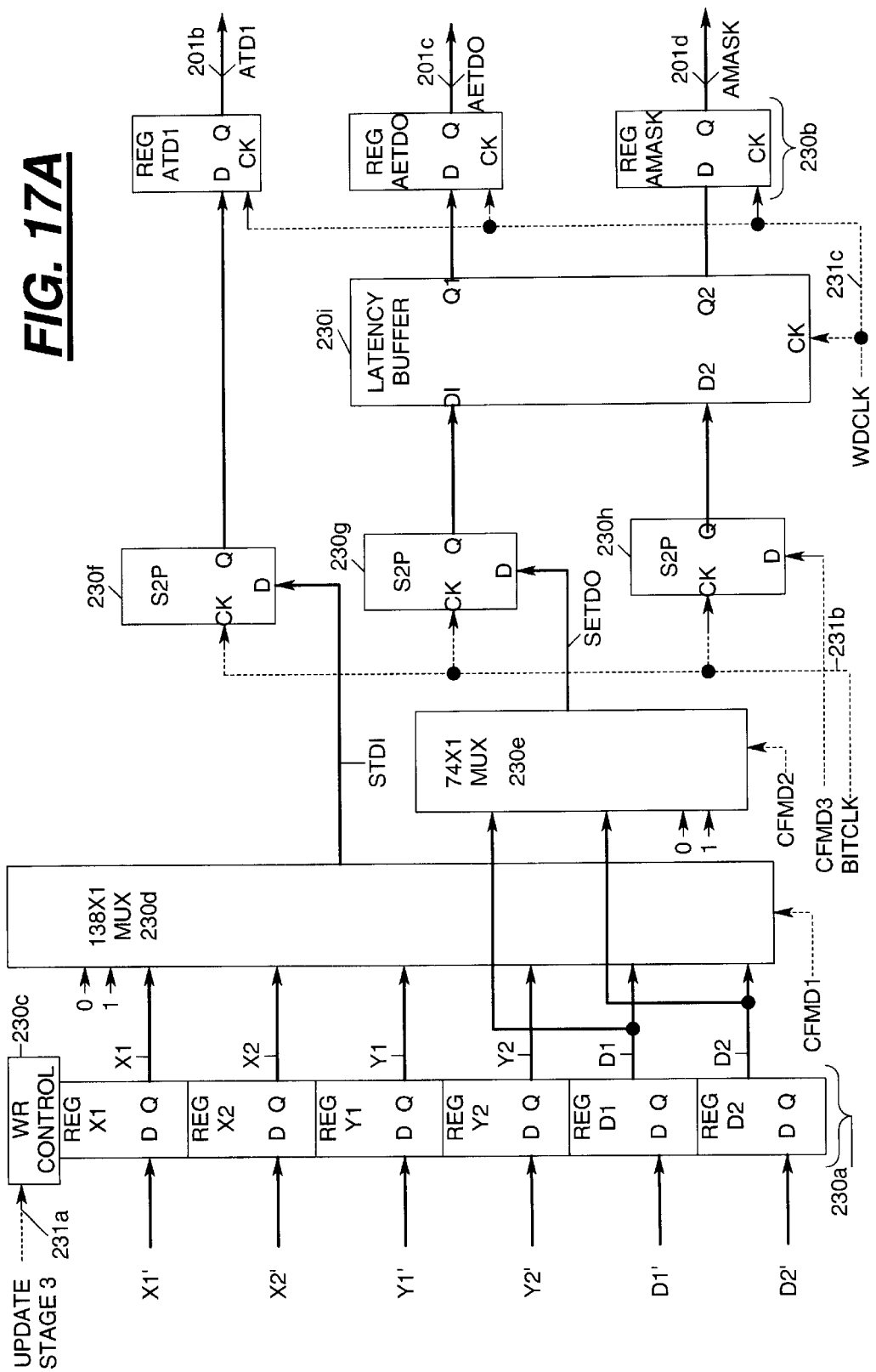
FIG. 17A is a detailed logic diagram of a portion of the third stage in the APG.
Figure 17B:
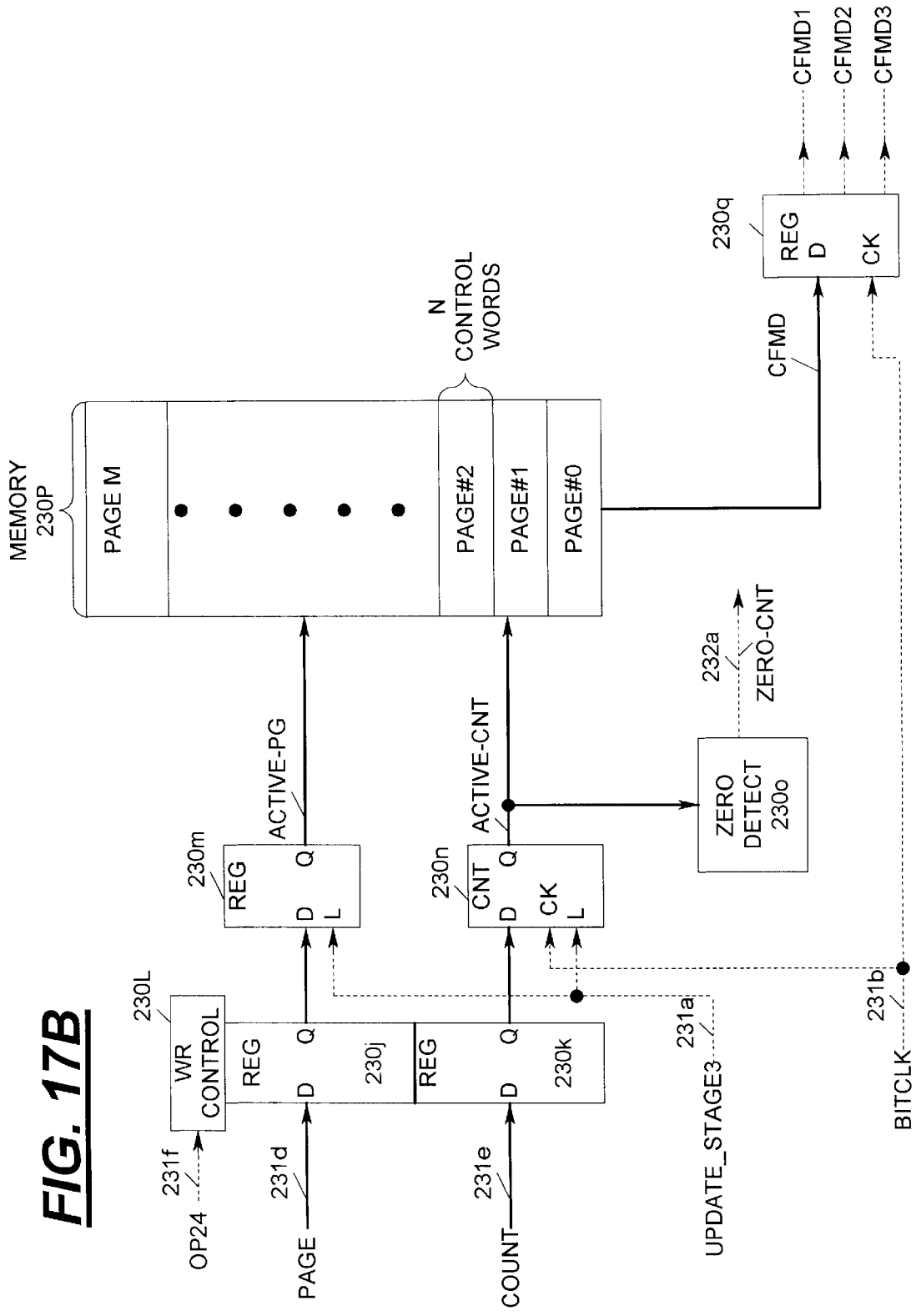

One preferred embodiment of the formatter stage 230 is shown in detail in FIGS. 17A and 17B. This particular embodiment is comprised of all of the components that are identified in FIGS. 17A and 17B by reference numerals 230a thru 230q; and each of those components is described below in Table 5.

TABLE 5

| Component | Description |
|---|---|
| 230a | Component 230a, in FIG. 17A, consists of all of the input registers to the formatter stage 230. These input registers are partitioned into the first set which consists of registers X1, Y1, and D1; and the second set which consists of registers X2, Y2, and D2. These input registers are the same input registers that are shown in FIG. 14A. Each register has a data input D and an output Q. |
| 230b | Component 230b, in FIG. 17A, consists of all of the output registers in the formatter stage 230. These output registers are the ATDI register, the AETDO register, and the AMASK register; and they are the same output registers that are shown in FIG. 14A. Each output register has a data input D, a clock input CK, and an output Q. These output registers respectively send the output signals ATDI, AETDO, and AMASK on the conductors 201b, 201c and 201d; and those conductors are the same conductors that are shown in FIGS. 14A and 14B. |
| 230c | Component 230c, in FIG. 17A, is a write control circuit for all of the input registers 230a. This write control circuit loads all of the input registers 230a, concurrently, with the content of the corresponding output registers 220b from the second stage 220. This operation occurs in response to a control signal UPDATE-STAGE-3, which is on a conductor 231a that is in the set 231. |
| 230d | Component 230d, in FIG. 17A, is a multiplexer that has one-hundred-thirty-eight inputs and a single output. Each input register X1, X2, Y1, and Y2 sends a sixteen bit address to the multiplexer 230d; each input register D1 and D2 sends thirty-six bit data word to the multiplexer 230d; and the remaining inputs are a "0" and a "1". Which particular input gets passed through multiplexer 230d is selected by control signals CFDM1 which are internally generated by the formatter stage, as shown in FIG. 17B. |
| 230e | Component 230e, in FIG. 17A, is a multiplexer which has seventy-four inputs and a single output. Each input register D1 and D2 sends a thirty-six bit data word to the multiplexer 230e; and the remaining inputs are a "0" and a "1". Which particular input gets passed through multiplexer 230e is selected by control signals CFMD2 that are internally generated by the formatter stage, as shown in FIG. 17B. |
| 230f | Component 230f, in FIG. 17A, is a serial-to-parallel shift register which has a serial input D and a parallel output Q. The serial data on the input D comes from the output of multiplexer 230d. One bit of that serial data is clocked into register 230f by each positive edge of a clock signal called BITCLK. The BITCLK signal occurs on a conductor 231b that is in the set 231. |
| 230g | Component 230g, in FIG. 17A, is a serial-to-parallel shift register which has a serial input D and a parallel output Q. The serial data on the input D comes from the output of multiplexer 230e. One bit of that serial data is clocked into register 230g by each positive edge of the clock signal BITCLK. |

TABLE 5-continued

| Component | Description |
|---|---|
| 230h | Component 230h, in FIG. 17A, is a serial-to-parallel register which has a serial input D and a parallel output Q. The serial data input D receives a signal CFMD3 from a register 220q in FIG. 17B. One bit of that serial data is clocked into register 230h by each positive edge of the clock signal BITCLK. |
| 230i | Component 230i, in FIG. 17A, is a latency buffer which has a pair of inputs D1 and D2, and a corresponding pair of outputs Q1 and Q2. Input D1 receives the parallel output signals from register 230g, and input D2 receives the parallel output signals from register 230h. The signals on the D1 and D2 inputs are stored in the latency buffer 230i in response to each positive edge of a clock signal, called WDCLK that occurs on a conductor 231b which is in the set 231. Those stored signals are subsequently regenerated on the outputs Q1 and Q2 after a predetermined number of cycles of the clock signal WDCLK. |
| 230j | Component 230j, in FIG. 17B, is a register which has a data input D and an output Q. The data input D receives the PAGE field that is in word W1 of instruction 254, as shown in FIG. 15G. The PAGE field is sent on conductors 231d, which are in the set 231. |
| 230k | Component 230k, in FIG. 17B, is a register which has a data input D and an output Q. The data input D receives the COUNT field that is in word W1 of instruction 254, as shown in FIG. 15G. The COUNT field is sent on conductors 231e, which are in the set 231. |
| 230L | Component 230L, in FIG. 17B, is a write control circuit for the registers 230j and 230k. This circuit writes the PAGE field into register 230j and writes the COUNT field into register 230k in response to control signals OP24 which indicate that instruction 254, of FIG. 15G, is being executed. The signals OP24 occur on the conductors 231f in the set 231. |
| 230m | Component 230m, in FIG. 17B, is a register which has a data input D, an output Q, and a load control input L. This register holds the number of a page that is actively being used within the formatter stage; and that page number is given by the ACTIVE-PG signals from the Q output. The active page number is received from register 230j in response to the UPDATE-STATE-3 signal on conductor 231a. |
| 230n | Component 230n, in FIG. 17B, is a counter which has a data input D, an output Q, a clock input CK, and a load input L. This counter holds a count that is actively being used within the formatter stage; and that count is given by the ACTIVE-CNT signals on the Q output. An initial count is received from register 230k in response to the UPDATE-STAGE-3 control signal on conductor 231a. Counter 230n decrements the count which it holds, by one, each time it receives a positive edge of the clock signal BITCLK. |
| 230o | Component 230o, in FIG. 17B, is a circuit which detects when the active count in the counter 230n has been decremented to zero. when that occurs, component 230o generates a control signal, called ZERO-CNT, on a conductor 232a, which is in the set 231 that goes to the control module 240. |
| 230p | Component 230p is a memory which stores a plurality of control words that are called |

TABLE 5-continued

| Component | Description |
|---|---|
| | CFMD. These control words are partitioned into "M" pages within the memory, and each page holds "N" control words. In one embodiment, M is 1024 and N is 256. One particular page within the memory 230p is addressed by the ACTIVE-PG signals from register 230m; and one particular control word within the addressed page is selected by the ACTIVE-CNT signals from the counter 230n. |
| 230q | Component 230q is a register which has a data input D1 an output Q, and a clock input CK. The data input D sequentially receives each particular control word CPFMD from the control memory by the ACTIVE-PG and ACTIVE-CNT signals. One control word is stored in register 220q each time it receives a positive edge of the clock signal BITCLK. |

Now, the manner in which all of the components in FIGS. 17A and 17B interact to generate the ATDI, AETDO, and AMASK test signals will be described. Initially, instruction 254 of FIG. 15G will be executed to indicate that the output registers of the first stage hold virtual addresses and data words that are ready to be processed by the second stage. When that instruction 254 is executed, the PAGE field and COUNT field will be written into the registers 230j and 230k of FIG. 17B.

Thereafter, the content of the output registers of the first stage will be transferred to the input registers of the second stage. Then, the content of the input registers in the second stage will be processed during six consecutive time periods ΔT1–ΔT6 as was previously described. After that occurs, the content of the output registers from the second stage are ready to be transferred to the input registers of the third stage.

The actual transfer to the third stage input registers occurs in response to a control signal UPDATE-STAGE-3 from the APG control unit 240 on a conductor 231a in the set 231. Also, in response to the UPDATE-STAGE-3 control signal, the PAGE in register 230j is transferred to the active page register 230m, and the COUNT in register 230k is transferred to the counter 230n.

After the counter 230n is loaded, the count which it contains is decremented by one in response to each positive edge of the clock signal BITCLK. Also, for each count that is generated by the counter 230n, one control word is read from the memory 230p and stored in the register 230q.

Each control word that is stored in register 230q is partitioned into the control signals CFMD1, CFMD2, and CFMD3 that are respectively sent to the multiplexer 230d, the multiplexer 230e, and the serial-to-parallel shift register 230h. The CFMD1 signals cause the multiplexer to 220d select one bit for the shift register 230f; the CFMD2 signals cause the multiplexer 230e to select one bit for the shift register 230g; and the CFMD3 signal is sent directly to the shift register 230h.

When each positive edge of the bit clock signal occurs, the shift registers 230f, 230g, and 230h store the bit that is sent to their D input. Then, after a total of sixteen bits have been stored in each of the shift registers 230f, 230g, and 230h, their parallel outputs are used. Specifically, the parallel output of shift register 230f is loaded into the ATDI output register; and the parallel output of the shift registers 230g and 230h are respectively loaded into the D1 and D2 inputs of the latency buffer 230i. Those signals which are loaded into the latency buffer 230i are subsequently sent to the output registers AETDO and AMASK, after a predetermined number of cycles of the clock signal WDCK occurs.

From the output registers 230b, the conductors 201b, 201c, and 201d respectively carry the signals ATDI, AETDO, and AMASK to the previously described circuits of FIG. 14B; and those circuits send the signals to the integrated circuit chips that are to be tested. During the testing process, signal ATDI is serially written into the chip, and that produces a serial response which is serially compared with the signals AETDO and AMASK. This response from the chip occurs after a certain delay relative to the time that the signals ATDI are written into the chip; and that delay is compensated for by the latency buffer 230i of FIG. 17A.

The above-described process of serially loading the shift registers 230f, 230g, and 230h and sending their output in sixteen-bit words to the output registers 230b proceeds in a repetitive fashion until the counter 230n decrements its count to zero. When that occurs, the zero detect circuit 230o sends the ZERO-CNT signal on conductor 232a to the APG control circuit 240 of FIG. 14A.

Within the APG control unit 240, the state of the second stage 220 is tested to determine if the output registers 220b contain new data that is ready to be transferred to the input registers of the third stage 230. If such a state is present, then the APG control unit 240 generates the control signal UPDATE-STAGE-3 on conductor 231a. In response, the content of the output registers of the second stage 220 are transferred to the input registers of the third stage 230; another PAGE in register in 230j is transferred to the active page register 230m; and another COUNT in register 230k is transferred to the counter 230n. Then, the entire process, as described above, continues.

Turning now to FIG. 18, it shows a timing diagram that illustrates the sequence in which the three stages operate. In FIG. 18, the first stage 210 generates a first set of virtual addresses and corresponding data during a time interval T1S2. Thereafter, during a time interval T1S2, the second stage 220 transforms the first set of virtual addresses and corresponding data to a first set of physical addresses and corresponding data. Subsequently, during a time interval T1S3, the third 230 stage uses the first set of physical addresses and corresponding data to generate the serial bit streams ATDI, AETDO, and AMASK that test the integrated circuit chips.

For each set of virtual addresses that is generated by the first stage in a time interval TiS1, the second stage and third stage perform their corresponding tasks in time intervals TiS2 and TiS3 respectively. Here "i" is any positive integer. Thus, for example, the third set of virtual addresses and the third set of physical addresses and a third set of output signals are respectively generated during the time intervals T3S1, T3S2, and T3S3. This process continues, as indicated in FIG. 18 by the sets of three dots, until the first-stage stops generating a new set of virtual addresses and corresponding data.

Inspection of FIG. 18 shows that at certain times, all three of the stages 210, 220 and 230 operate concurrently on different sets of address and data. For example, portions of the three time intervals T3S1, T2S2 and T1S3 overlap. During time interval T3S1, the first stage 210 is generating the third set of virtual addresses and corresponding data; during time interval T2S2, the second stage 220 is transforming the second set of virtual addresses and corresponding data to a second set of physical addresses and corresponding data; and during time interval T1S3, the third stage 230 is generating the first set of output signals ATDI, AETDO and AMASK.

Inspection of FIG. 18 further shows that no gaps occur between the third stage time intervals T1S3, T2S3, T3S3, etc. Consequently, the third stage output signals ATDI, AETDO, and AMASK occur in serial bit streams that are continuous from one time interval to the next. To achieve this continuous output, each of the first stage time intervals T1S1, T2S2, etc., and each of the second stage time intervals S2T1, S2T2, etc., must be shorter than each of the first stage time intervals.

Due to the above constraint, gaps do occur between the first stage time intervals, and gaps do occur between the second stage time intervals. During the gaps between the first stage time intervals, the first stage 210 is in a wait state where it stays until certain events occur before continuing to generate another set of virtual addresses and corresponding data. Similarly, during the gaps between each of the second stage time intervals, the second stage 220 is in a wait state where it stays until certain events occur before proceeding with the process of transforming virtual addresses to physical addresses.

How the above wait states are entered and exited by the first stage 210 and the second stage 220 will now be described in conjunction with FIG. 19. In that figure, separate state diagrams are shown for each of the three stages. All of the states, and transitions from one state to another, that are illustrated in FIG. 19 are implemented by the control module 240 of FIG. 14A.

At various points in the state diagrams of FIG. 19, reference is made to two state control flip-flops that are shown in FIG. 20; and those two flip-flops 241 and 242 are included within the control unit 240 of FIG. 14A. Each flip-flop has a set input S and a reset input R, and an output Q. Flip-flop 241 is set when the content of the first stage output registers 210b are ready to be processed by the second stage 220; and flip-flop 242 is set when the content of the second stage output registers 220b are ready to be processed by the third stage 230. This is indicated by the output signals from the two flip-flops 241 and 242 which respectively are "STAGE-1 OR'S READY," and "STAGE-2 OR'S READY."

Considering now the state diagram in FIG. 19 for the first stage, it shows a state 301 in which the first stage 210 waits for an instruction to execute. Those instructions are the instructions that were previously described in conjunction with FIGS. 15C, 15D, 15E, and 15G. When one of those instructions is received by the control unit 240, that control unit makes a test, as indicated by reference numeral 302, to determine if instruction 254 of FIG. 15G was received. If instruction 254 was not received, then the control unit 240 sends control signals to the first stage 210 on the conductors 211a, 211b, etc., as was previously described in conjunction with FIGS. 15A–15F; and in response, the first stage 210 executes the received instruction. This is indicated by reference numeral 303. Then, the first stage 210 re-enters state 301.

By comparison, if control unit 240 determines by the test 302 that instruction 254 of FIG. 15G was received, then control unit 240 sets flip-flop 241 which indicates that the content of the first stage output registers 210b are ready to be processed by the second stage 220. Then the first stage goes to a state 305 where it waits for flip-flop 241 to become reset. When that reset occurs, the first stage re-enters state 301 and waits for another instruction to execute.

Next, considering the state diagram in FIG. 19 for the second stage 220, it shows a state 310 in which the second stage stays until the content of the output registers of the first stage are ready to be processed by the second stage. The occurrence of that event is indicated by flip-flop 241 being set. Thus, when flip-flop 241 becomes set, the second stage 220 enters another state 311.

The second stage 220 stays in state 311 if it has any physical address and corresponding data in its own output registers 220b that need to be transferred to the third stage 230. The presence of physical address and data is in the second stage output register 220b is indicated by flip-flop 242 being set. Thus, state 311 is exited when the flip-flop 242 becomes reset.

When state 311 is exited, the control unit 240 sends the control signal UPDATE_STAGE2 to the second stage on the conductors 221a, and it resets flip-flop 241. This is indicated by reference numeral 312. Then, in response to the UPDATE_STAGE2 control signal, the second stage 220 sequentially generates a set of physical addresses and corresponding data, and it stores them in its output registers 220b. This is indicated by reference numeral 313. Then, the control unit 240 sets flip-flop 242, as indicated by reference numeral 314, and that signifies that the second stage output registers 220b are ready to be processed by the third stage 230. Then, the second stage 220 re-enters state 310.

Next, considering the state diagram of FIG. 19 for the third stage 230, it shows a state 320 in which the third stage stays until the content of the second stage output registers 220b are ready to be processed by the third stage. The occurrence of that event is indicated by flip-flop 242 being set. Thus, state 320 is exited when flip-flop 242 is set. Then, as is indicated by reference numeral 321, the control unit 240 sends the control signal UPDATE_STAGE3 to the third stage on conductor 231a, and it resets flip-flop 242.

In response to the UPDATE_STAGE3 control signal, the content of the second stage output registers 220b are transferred to the input registers 230a of the third state. Also, a new page is transferred from register 230j in the third stage to the active page register 23m, and a new count is transferred from register 230k in the third stage to the active counter 230n. Thereafter, the third state 230 uses the active page and active count to sequentially generate the output bit streams ATDI, AETDO, and AMASK as was previously described, and this is indicated by reference numerals 322 and 323. That process continues until the active count reaches a count of zero, at which time the third stage re-enters state 320.

If flip-flop 242 is set when state 320 is re-entered, then state 320 will be exited immediately. Then, all of the events that are indicated by reference numerals 321, 322, and 323 will be repeated; and consequently, no gaps will occur in the bit streams ATDI, AETDO, and AMASK that are generated by third stage. To ensure that flip-flop 242 is in fact set when state 320 is re-entered, the first stage time intervals and second stage time intervals of FIG. 18 need to be shorter than the third stage time intervals.

Turning now to FIG. 21, it shows a program which is used to generate the output bit streams ATDI, AETDO, and AMASK that test the integrated circuit chips. This program is stored in the memory 13' of FIG. 13; and it is executed by all of the circuitry that was described in conjunction with FIG. 13 and the following figures.

In FIG. 21, the illustrated program is performed as a sequence of steps which are identified as steps S101 through S115. By the first five steps S101 through S105, various initial values are established. Thereafter, in the following steps S106 through S115, two program loops are performed during which the output signals ATDI, AETDO, and AMASK are generated.

All of the output signals that are generated by the FIG. 21 program are for a physical array of memory cells; and each memory cell has a physical row address and a physical column address. But in the program of FIG. 21, the physical row and column addresses are generated from virtual row and column addresses.

By step S101, a starting virtual row address is sent to input register XA of the first stage 210, and a starting virtual column address is sent to input register YA of the first stage. Then, in step S102, the virtual address limits are sent to the boundary check circuit 210k of the first stage. By this step, the registers XMIN and XMAX of FIG. 15F are respectively loaded with the minimum and maximum virtual row addresses; and similarly, the registers YMIN and YMAX are respectively loaded with the minimum and maximum virtual column addresses.

Next, in step S103, all of the second stage scrambler control registers are initialized. Those registers are identified by reference numeral 220i in FIG. 16A. The settings which are established by this step determine the control signals that are sent on the conductors 221b to the multiplexers 220h.

Next, in step S104, several control signals are established in the data processing portion of the second stage that is shown in FIGS. 16B and 16C. Specifically, this step S104 establishes all of the control signals XSEL, YSEL, LFUNC, MFUNC, DALUOP, OUTSEL, VALSEL, and ROT that were previously described in conjunction with FIG. 16D.

Next, in step S105, respective initial values are sent to the row counter 252 and a column counter 253 of FIG. 14B. Here, the initial value that is sent to the row counter is the number of rows in the virtual memory array, and the initial value that is sent to the column counter is the number of columns that is in the virtual memory array.

Next, in step S106, the virtual row address that is in the input register XA of the first stage is sent to the output registers X1A' and X1D' of the first stage. Then, in step S107, the virtual column address that is in the input register YA of the first stage is sent to the output registers Y1A' and Y1D'. Also by step 107, the virtual column address that is in register YA is incremented by one. These operations are achieved by performing instruction 251 of FIG. 15C.

Next, in step S108, instruction 254 of FIG. 15G is executed; and as a result, flip-flop 241 is set. This indicates that the content of the output registers of the first stage 210 are ready to be processed by the second stage 220. Consequently, the second stage 220 will proceed to store and process the content of the first stage output registers as was previously described in conjunction with the stage two state diagram of FIG. 19. Thereafter, the content of the output registers of the second stage 220 will become ready for processing by the third stage 230. When that occurs, the third stage 230 will store and process the content of the second stage output registers as was previously described in conjunction with the third stage state diagram of FIG. 19.

Next, step S109 is performed whereby the count in the column counter 253 is decremented, by one, by the state machine 40 of FIG. 14B. This step S109, as well as the remaining steps S110 through S115, are performed in parallel with the various tasks for the second stage 220 and the third stage 230, which were initiated by step S108.

Next, in step S110, the state machine 40' of FIG. 14B tests the column counter 242 to see if it has reached a count of zero. If the count is not zero, then step S111 is performed. There, the state machine 40' of FIG. 14B makes a test to determine if the content of the first stage output registers, as established by steps S106 and S107, has been transferred to the input registers of the first stage. This test is made by examining the output signal of flip-flop 241 in FIG. 20. If flip-flop 241 is set, then step S111 is repeated until flip-flop 241 becomes reset. when that occurs, a branch is taken back to step S106.

By comparison, if the count in the column counter 253 is zero in step S110, then a branch is taken to step S112. There, the row address that is in input register XA of the first stage is incremented by one. Then, in step S113, the count in the row counter 252 is decremented by one.

Next, in step S114, the state machine 40' of FIG. 14B tests the count in the row counter 252. If that count does not equal zero, then step S115 is performed in which the column counter 253 is re-initialized with the number of columns that is in the virtual memory array. Then a branch is taken to step S111. Otherwise, if the count in the row counter does equal zero in step S114, then test signals have been generated for every cell in the array; and thus, the generation of the test signals is complete.

Each step in the program of FIG. 21 is specified by one or more instructions in the memory 13 of FIG. 13. For example, the initial values that are loaded in step S101 are specified by two of the instructions 252 of FIG. 15D. Similarly, the minimum and maximum address limits of step S102 are specified by two of the instructions 253 of FIG. 15E. Likewise, the multiplexer control signals of step S103 are specified for the X registers by sixteen of the instructions 262 of FIG. 16E; and the multiplexer control signals for the Y registers are specified sixteen more of those instructions. Further, the control signals that are established in step S104 are defined by a single instruction 261 of FIG. 16B.

To perform the testing and branching that occurs in steps S110, S111, and S114, the conditional jump instruction 32 of FIG. 11 is executed. And, to perform the loading and decrementing of the row counter 252 and column counter 253, another instruction 265 of FIG. 22 is executed. This instruction 265 is identified by an operation code of OP=35.

Instruction 265 has three fields which are called COUNT, DECLD, and ROWCOL. The ROWCOL field has a value of "0" which selects the row counter 252 and a value of "1" which selects the column counter 253. The DECLD field has a value of "0" which specifies a decrement operation and a value of "1" which specifies a load operation. If a load operation is specified, then the COUNT field is loaded into the counter that is identified by the ROWCOL field. If a decrement operation is specified, then the counter that is identified by the ROWCOL field is decremented by one.

One particular feature of the above-described program in FIG. 21 is that the same program can be used for any number of memory arrays that each have a different physical layout for the rows and columns. This feature is achieved because the particular physical layout of any one array is accommodated in step S103 where the multiplexer control registers of stage 2 are initialized. By properly initializing those registers, each virtual address is converted, via the multiplexers 220h of FIG. 16A and the memories 220L and 220m, to any desired physical address.

Another feature of the FIG. 21 program is that it can generate the test signals ATDI, AETDO, and AMASK for many different data patterns, simply by changing the instructions that implement step S104. For example, if step S104 is implemented with one instruction 261 of FIG. 16D which sends bit-zero in register X1D to the DALU bus, then each even numbered row in the memory array will be written with a "0" and each odd numbered row in the array will be written with a "1". By comparison, if step S104 is implemented by one instruction 261 of FIG. 16D which sends the inverse of bit-zero in register Y1D to the DALU bus, then each odd numbered column of the array will be written with a "o" and each even numbered column of the array will be written with a "1".

Also, it should be emphasized that the generation of the test signals ATDI, AETDO, and AMASK via the algorithmic pattern generator occur during only one mode of operation in the system of FIG. 13. In another mode of operation, the test signals TDI, ETDO, and MASK are read from the memory 13' and sent to the chips that are to be tested. In these two modes of operation, all of the circuitry that is shown in FIGS. 5, 6, 8, 9 an 10 are time-shared. Thus, in either mode of operation, the TMS signal is generated by the state machine 40' and sent to register 47; the words of the bit streams in registers 44–48 are broadcast on the conductors 12a to all of the chip driver circuits 11; and the chip driver circuits compare the expected response from the chips that are tested to the actual response from those chips.

One preferred embodiment of the present invention has now been described in detail. In addition, however, various changes and modifications can be made to the details of the illustrated preferred embodiment without departing from the nature and spirit of the invention.

For example, with the algorithmic pattern generator that is described in FIGS. 13–22, all three of the bit streams ATDI, AETDO, and AMASK are generated; however, as a modification, only one or two of those bit streams can be generated. with this modification, the circuitry which produces the unused bit streams can be eliminated. Thus, for example, only the ATDI bit stream could be generated and the circuitry which is used to generate the ATDO and AMASK bit streams could be eliminated.

Likewise, in FIG. 14A, the preferred embodiment of the algorithmic pattern generator is shown to include three stages; however, as a modification, the number of those stages could be either decreased or increased. For example, an additional stage to perform some new operation could be inserted between the second stage and the third stage. Alternatively, the functions that are performed by the second stage and third stage could be combined into a single stage.

Also, as a modification, any one of the three stages of the algorithmic pattern generator of FIG. 14A could be replaced with a similar stage that is differently constructed. Thus, each stage of the APG that is disclosed herein is a separate module which can be used within another algorithmic pattern generator.

Also, as another modification, the various instructions that are performed by each stage of the algorithmic pattern generator can be changed. For example, in FIG. 15C, several fields are shown which define various functions that are performed by the first stage; and those fields can be modified to change the particular operations which the first stage performs. Likewise, in FIG. 16D, several fields are shown which define the functions that are performed by the second stage; and those fields can be modified to change the functions which the second stage performs.

Accordingly, it is to be understood that the invention is not limited to all of the details of the illustrated preferred embodiment but is defined by the appended claims.

What is claimed is:

1. A system for testing integrated circuit chips, which is comprised of:
    a memory which stores instructions of a first class that expressly recite a first bit stream, and stores instructions of a second class that specify operations which generate a second bit stream;
    a first pattern generator, coupled to said memory, which sequentially reads said instructions of said first and second classes from said memory;
    said first pattern generator including a time-shared control circuit which sends said first bit stream to a test port on said chips in response to the first class instructions that are read;
    a second pattern generator, coupled to said first pattern generator, which receives the second class instructions that are read, and in response, sequentially generates portions of said second bit stream by performing said operations which said second class instructions specify; and,
    said time-shared control circuit including a means for sending one portion of said second bit stream to said test port on said chips while said second pattern generator generates another portion.

2. A system for testing integrated circuit chips according to claim 1 wherein said time-shared control circuit includes time-shared registers which: a) receive said first bit stream from said memory as a series of words, in response to said first class instructions; b) receive said second bit stream from said second pattern generator as a series of words, in response to said second class instructions; and c) send each received word to said chips, as a series of bits.

3. A system for testing integrated circuit chips according to claim 1 wherein said time-shared control circuit includes a time-shared bit stream generator which internally generates a control bit stream that is sent to said test port on said chips concurrently with said first bit stream, and is sent to said test port on said chips concurrently with said second bit stream.

4. A system according to claim 1 wherein said first class of instructions also recite a first expected output bit stream which is an expected response to said first bit stream; and said second class of instructions also specify operations that generate a second expected output bit stream which is an expected response to said second bit stream.

5. A system according to claim 4 wherein said time-shared control circuit includes a time-shared compare circuit which compares said first expected output bit stream to an actual output response, from said chips, produced by said first bit stream; and compares said second expected output bit stream to an actual output response, from said chip, produced by said second class bit stream.

6. A system according to claim 1 wherein said memory further stores a third class of instructions which define a program loop for both said first class instructions and said second class instructions.

7. A system according to claim 6 wherein said time-shared circuit includes time-shared counter which sets the number of times that said first class instructions and said second class instructions are read and executed in said program loop.

8. For use in a system that tests integrated circuit chips selectively with stored bit streams or internally generated bit streams, a subassembly which is comprised of:
    a program storage device, which stores instructions of a first class and stores instructions of a second class, and which has a read port for selectively reading said instructions;
    said instructions of a first class including a first bit stream for testing said chips; and,
    said instructions of a second class including fields that specify operations, for a pattern generator, that generate a second bit stream for testing said chips.

9. A system according to claim 8 wherein said first class of instructions also recite a first expected output bit stream which is an expected response to said first bit stream; and said second class of instructions also specify operations that generate a second expected output bit stream which is an expected response to said second bit stream.

10. A system according to claim 9 wherein said memory further stores a third class of instructions which define a program loop for both said first class instructions and said second class instructions.

\* \* \* \* \*